US006472594B1

(12) United States Patent
Ichinose et al.

(10) Patent No.: US 6,472,594 B1
(45) Date of Patent: Oct. 29, 2002

(54) PHOTOVOLTAIC ELEMENT AND METHOD FOR PRODUCING THE SAME

(75) Inventors: Hirofumi Ichinose, Tsuzuki-gun; Akio Hasebe, Soraku-gun; Tsutomu Murakami, Nara; Satoshi Shinkura, Tsuzuki-gun; Yukie Ueno, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/893,623

(22) Filed: Jul. 11, 1997

Related U.S. Application Data

(62) Division of application No. 08/544,981, filed on Oct. 30, 1995, now Pat. No. 5,681,402.

(30) Foreign Application Priority Data

Nov. 4, 1994 (JP) ............................................ 6-295887
Dec. 27, 1994 (JP) ............................................ 6-324880
Oct. 9, 1995 (JP) ............................................ 7-261152

(51) Int. Cl.[7] ............................................ H01L 31/0216
(52) U.S. Cl. ...................................................... 136/256
(58) Field of Search ................................ 257/459, 457; 136/256, 258, 251

(56) References Cited

U.S. PATENT DOCUMENTS 4,260,429 A * 4/1981 Moyer ........................ 136/256
4,283,591 A 8/1981 Boer .......................... 136/256
5,084,107 A 1/1992 Deguchi et al. ............ 136/256
5,151,373 A * 9/1992 Deguchi et al. ............... 437/2
5,181,968 A * 1/1993 Nath et al. .................. 136/256
5,344,498 A * 9/1994 Inoue ......................... 136/251
5,389,159 A * 2/1995 Kataoka et al. ............. 136/251
5,428,249 A 6/1995 Sawayama et al. ......... 257/746
5,457,057 A 10/1995 Nath et al. ...................... 437/2
5,474,621 A 12/1995 Barnard ...................... 136/256
5,482,571 A * 1/1996 Yamada et al. ............. 136/259
5,578,141 A * 11/1996 Mori et al. ................. 136/251
5,681,402 A * 10/1997 Ichinose et al. ............ 136/256
5,684,325 A * 11/1997 Kataoka et al. ............. 257/433

FOREIGN PATENT DOCUMENTS

EP 0024615 3/1981
EP 0536738 4/1993
FR 2647960 12/1990
WO WO93/00711 1/1993

* cited by examiner

*Primary Examiner*—Ellis Robinson
*Assistant Examiner*—Michael C. Miggins
(74) *Attorney, Agent, or Firm*—Fitzpatrick, Cella, Harper & Scinto

(57) ABSTRACT

A photovoltaic element comprising an electrode comprising an electrically conductive core member which is coated with a conductive adhesive fixed on the light incident surface of a photoactive semiconductor layer, via the conductive adhesive, is disclosed.

The conductive adhesive is composed of at least two layers. The softening point of the conductive adhesive layer nearer to the core member is higher than the highest temperature encountered in the manufacture of the photovoltaic element.

56 Claims, 9 Drawing Sheets

300

PHOTOVOLTAIC ELEMENT AND METHOD FOR PRODUCING THE SAME

This application is a division of application Ser. No. 08/544,981 filed Oct. 30, 1995 now U.S. Pat. No. 5,681,402.

BACKGROUND OF THE INVENTION

1. Field of the Invention

The present invention relates to a photovoltaic element for a solar cell, a photo sensor, etc, and a method for producing the same.

2. Related Background Art

Solar cells employing photovoltaic elements are expected to be used as an alternative energy source in place of existing power generation using fossil fuels and hydroelectric power generation, thereby solving the problems of these conventional power generation methods. In particular, various studies have been made on amorphous silicon solar cells, because these cells can be made at relatively low cost and can be produced as elements that have a larger area than solar cells using crystalline silicon. Improvement of the photoelectric conversion efficiency of amorphous silicon solar cells is one of the most important problems to be solved for commercializing the amorphous silicon solar cells. Extensive studies have thus been made for solving the problems described below.

A structure of amorphous silicon solar cell elements is known in which a back electrode, an amorphous silicon semiconductor layer, and incident surface electrode are laminated in this order on a conductive substrate such as a stainless steel plate. The incident surface electrode is made, for example, from transparent conductive oxides.

Furthermore, a collector electrode comprising fine metallic wires is placed on the incident surface electrode mentioned above for collecting the generated electricity. The collector electrode mentioned above is provided on the incident surface; consequently it reduces the effective generating area of the solar cell. The area loss is called the shadow loss. For this reason, the collector electrode is usually made in a fine comb shape. Thus, the collector electrode normally tends to be fine and of a long shape, and appropriate selection of the material and the design of the cross sectional shape thereof are required so as to minimize the electric resistance.

An electrode called a bus bar electrode is formed on the surface of the collector electrode, for collecting the electric current collected by the collector electrode. The bus bar electrode is made from a metal wire that is thicker than the wire of the collector electrode.

Now, the present situation of the research being conducted for minimizing shadow loss and loss by electric resistance and for improving the conversion efficiency of solar cells that are constructed as described above will be explained.

Materials that have small resistivity such as silver ($1.62\times10^{-6}$ Ωcm) or copper ($1.72\times10^{-6}$ Ωcm) are used for the collector electrode to reduce the shadow loss and electric resistance loss.

Vacuum evaporation, plating, and screen printing methods are used to form the collector electrode.

The vacuum evaporation method has problems such as a slow deposition rate and low throughput, caused by the use of vacuum process, and the necessity of masking to form the linear pattern, which masking results in the loss of metal and deposition on the masked portions. The problem with the screen printing method is the difficulty in forming low resistance electrodes.

For example, the resistivity of the lowest resistance conductive paste is about $4.0\times10^{-5}$ Ωcm, which is one order higher than that of pure bulk silver. The following methods are used to reduce the resistance without areal reduction of the collector electrode using such a material.

(a) Increasing the thickness of the electrode. In this case, the practically usable upper limit of the thickness is 10 μm to 20 μm. When this thickness of electrode is used to form a long, for example, more than 10 cm long collector electrode, it is necessary to make the width of the electrode more than 200 μm in order to keep the electric resistance loss small, and the aspect ratio (ratio of thickness to width) becomes a small value, such as 1:10, and the shadow loss becomes larger. (b) a collector electrode that is made by coating a metal wire with a conductive particle containing polymer is proposed in U.S. Pat. Nos. 4,260,429 and 4,283,591. The cross section of the collector electrode proposed in U.S. Pat. No. 4,260,429 is shown in FIG. 1A. In this figure, reference numeral 101 is a metal wire, and reference numeral 102 is a coating layer made of conductive polymer. This invention has merit in that even a long electrode that is made using the copper wire has a small electric resistance loss, and the shadow loss is also small because the aspect ratio can be a made a small value such as 1:1. The collector electrode proposed in U.S. Pat. No. 4,260,429 can be fixed to the cell by a simple method using conductive adhesive. A method to prevent physical contact between the metallic electrode and a $Cu_2S$ layer of the cell is proposed in U.S. Pat. No. 4,283,591; this method provides prevention of the metallic copper deposition.

However, these proposals have the following problems.

(1) In the case of U.S. Pat. No. 4,260,429:

A) The following problems were found as a result of a long term exposure test or by temperature-humidity tests: a short circuit between the upper electrode and the lower electrode is formed at a defective part such as a pin-hole; lower conversion efficiency results from the small shunt resistance, and the yield tends to get worse. Experiments by the present inventors showed that the problem arises from electro-chemical reaction in which the ions from the above mentioned metal wire diffuse through the conductive polymer and reach the above mentioned semiconductor element.

B) The electrode disclosed by U.S. Pat. No. 4,260,429 proposes to obtain good electro-conductivity between the metal wire and the semiconductor element, but a solution of the problem of occurrence of the electrochemical reaction between the metal wire and the semiconductor element is not included.

C) The electrode disclosed by U.S. Pat. No. 4,260,429 has a problem that some portion of the electrode may have not enough bonding force to the semiconductor element. On some occasions, tab portion(s) of the metal material did not have enough bonding force when adhesive connection between the solar cell substrate and metal tab of the collector electrode was required.

D) Not only initial bonding force but long term bonding force between the electrode and the solar cell is required for the solar cell used in an open atmosphere under severe conditions. The solar cells that used electrodes as described above had a problem that a series resistance increase and a conversion efficiency decrease caused by deterioration of the bonding force occurred during the accelerated temperature-humidity test and heat resistance test.

E) Some problems of electrode peeling were observed with solar cells caused by poor initial bonding force between the solar cell substrate and metal tab, and also by degradation of the bonding force between the cell element, metal wire, and the coating layer, affected by the humidity and temperature.

F) The solar cell was readily affected by the humidity because a tight covering layer was not formed as a covering film.

G) It is desirable that the covered wire electrode can be separately manufactured and be storable. However, in the case where a thermosetting resin was used the above mentioned electrode had a problem that it was difficult to obtain sufficient bonding force when it was formed on the solar cell because the cure rate of the polymer after the drying step was difficult to control. Furthermore, there was no means for the selection of the curing agent for the thermosetting resin and a relatively long curing time was required.

H) When only thermoplastic resin was used, deformation of the electrode occurred due to thermo-hysteresis during the lamination process after the formation of the electrode, and the following problems were observed: line width change, partial peeling, and position shift of the electrode.

I) For solar cells that are used while open to the atmosphere, it is required that there be no change in the bonding force between the electrode and the solar cell element even if it is used for a long term under severe conditions. The solar cells that used the above mentioned electrode had a problem that a series resistance increase and a conversion efficiency decrease was caused by the deterioration of the bonding force during long term open air exposure test or temperature-humidity tests as accelerated tests.

(2) In the case of U.S. Pat. No. 4,283,591.

A) Although the idea of preventing physical contact between the metallic electrode and the semiconductor layer was disclosed, a solution of the problem, in which the metal ion diffuses slowly through the conductive polymer and induces trouble, was not proposed.

B) The electrode proposed by this invention has a possibility that the metal wire may contact the solar cell substrate as a result of breakage of the above mentioned covering layer during the thermal crimping process. A specific counter measure for this problem is not proposed.

C) The proposal has some limit to the electrode formation process because the procedure does not contain a drying step and the coated wire cannot be stored.

(3) In the cases of U.S. Pat. Nos. 4,260,429 and 4,283,591:

A) Either proposal has the problem that it is difficult to obtain a coating layer of uniform thickness and stable good electric conductivity.

B) Short circuits between the upper electrode and the lower electrode are formed when the coating layer has pin holes that induce a large enough leakage current. As a result the shunt resistance decreased, lower conversion efficiency results, and the yield decreases.

C) The electrode proposed by the invention has a possibility that the metal wire may contact the solar cell substrate, and when it is used outdoors the effect of migration and shunt closure was not studied.

(4) In the case of U.S. Pat. No. 5,084,104.

A) Short circuits between the upper electrode and the lower electrode are formed when an amorphous silicon solar cell that has defective parts such as pin holes was used, and lower conversion efficiency results from the small shunt resistance, and the yield tends to get worse.

B) Series resistance of the electrode that is covered by the conductive adhesive increases due to thermo-hysteresis because of the dissolution or softening of the electrode caused by the penetration of the paint solvent.

C) The series resistance of the photovoltaic element increases and the conversion efficiency decreases when it is subjected to accelerated open air exposure testing or temperature-humidity testing.

SUMMARY OF THE INVENTION

An object of the present invention is to provide a collector electrode that has excellent storability, adhesion, and resistance to leakage due to humidity.

Another object of the present invention is to provide a photovoltaic element that has high initial characteristics and long term reliability, using the above mentioned collector electrode, avoids short circuits between the upper electrode and the lower electrode, avoids penetration of the paint solvent to the electrode covered by the conductive adhesive, and prevents increase of series resistance.

Still another object of this invention is to provide a manufacturing process that can make the photovoltaic element in a high yield and in stable operation.

According to a first aspect of the present invention, a photovoltaic element is provided of a structure in which an electrode coated with a conductive adhesive is placed on a photoactive semiconductor layer via a conductive adhesive, wherein the conductive adhesive is composed of at least two layers; and the softening point of the conductive adhesive composing the layer nearer to the electrode is higher than the highest temperature encountered in the manufacture of the photovoltaic element.

According to a second aspect of the present invention, a collector electrode is provided in which the metal wire does not contact the photovoltaic element directly because a coating layer comprising a conductive resin is provided on the metal wire, wherein the ions of the metal do not diffuse into the semiconductor layer of the photovoltaic element.

According to a third aspect of the present invention, a collector electrode in which a metal wire comprising a coating layer consisting of a conductive adhesive is adhered to photovoltaic elements via said coating layer, wherein metal ions of said metal wire do not diffuse into the semiconductor layer of said photovoltaic elements.

According to a fourth aspect of the present invention, a photovoltaic element which comprises a semiconductor layer consisting of at least one pin junction or pn junction and a collector electrode is provided on the light incident side of the semiconductor layer, wherein the collector electrode comprises the collector electrode of the second or third aspects.

According to the fifth aspect of the present invention, a method is provided for manufacturing a photovoltaic element of a structure having a collector electrode on the light incident side, wherein the collector electrode of the second, third or fourth aspects is adhered to the light incident face of the photovoltaic element by means of heat or pressure, or both.

DETAILED DESCRIPTION OF THE PREFERRED EMBODIMENTS

Figure 1A:
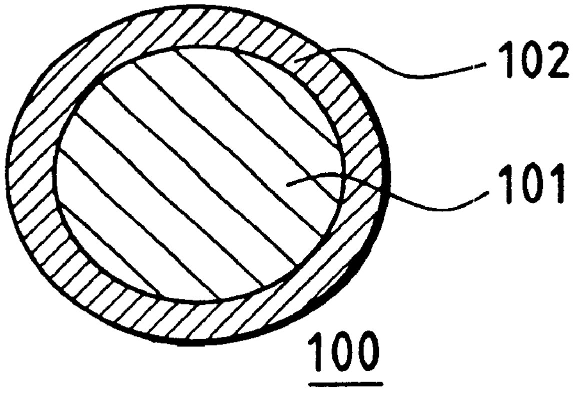
FIGS. 1A and 1B are schematic cross-sectional views illustrating the structure of a collector electrode wherein a coating layer is provided on a metal wire, according to the present invention.

According to experiments conducted by the inventors, the problem arising in the formation of the prior art collecting electrode, following the coating and drying of the wire, in environments where light and moisture are present, was found to be caused by electromotive force being applied to the collecting electrode, thereby causing diffusion of ions from the metal wire to the conductive resin layer. Also, the problem of shunting occurring with the prior art collecting electrode formation process was found to be caused by the metal wire contacting the semiconductor layer or the transparent conductive film, because the conductive resin coating consisted of only one layer. In other words, it is not possible, with the prior art collecting electrode, to prevent the metal wire from directly contacting the semiconductor layer (i.e. without the intermediate conductive resin) during the thermocompression bonding process and therefore, it was found that contact of the semiconductor layer and the wire was the cause of the initial decrease in yield. In addition, we have discovered that, even if such contact was prevented, metal ion diffusion occurred during actual usage, because of minute pores in the conductive resin, as well as the moisture and ion permeability of the resin itself. We have also discovered that the problem of long-term loss of dependability was attributed to the deterioration of conductivity of the conductive resin, caused by oxidation of the metal wire surface (consisting of copper, etc.), which is caused by moisture penetration during outdoor use, because the polymer used in laminated solar batteries is not perfectly water tight.

We have also found out that the cross-linking density of the conductive resin layer could not be controlled with respect to the shelf life and adhesive strength of the collecting electrode. In other words, the problem was that, when curing the polymers that form the conductive resins of the prior art collecting electrode, the resin would harden after drying, for example during storage, while the use of thermoplastic resin was also a problem because the fluidity would become too large due to the heat applied in later processes, because the resin will not cross-link.

Furthermore, low resistance copper and aluminum wires used in electric appliances are inexpensive and good conductors. Enamel wires, etc. are made by coating these metal wires with insulating varnish, but generally, it is not easy to coat metals, which are inorganic, with organic materials. In addition, sufficient adhesive strength may not be obtained when adhering the wire, through the coating layer, to semiconductors and metals. This is because good bonds do not form between the organic material of the coating layer and the semiconductor or metal material. This problem becomes even more pronounced depending on the metal material and its surface conditions, and we have discovered that almost no adhesive strength can be obtained when the surfaces are affected by moisture.

As a result of studies by the inventors of this invention aimed at tackling these problems, we have discovered that good adhesion, offering good storage characteristics with no progressive curing after the heat/drying process, can be achieved without altering the shape of the electrode by using a curing agent, such as blocked isocyanate, etc. to control the cross-linking density of the conductive resin layer before and after the process of forming the electrode on the surface of the solar cell.

We were able to create solar batteries of good characteristics by dividing the coating layer into multiple layers, where each layer was assigned different functions, such as preventing moisture and ion permeation, and the adhesion of the metal wire to the semiconductor layer or the transparent electrode.

Also, by creating a coating layer consisting of polymer containing a coupling agent and conductive filler, the surface of the metal was altered in such a way that it readily adheres to organic material, whereby good adhesion between the metal and the conductive resin layer containing organic material is achieved.

Next, we will describe the characteristics of this embodiment of the invention, as well as the interactive effects based thereon.

(1) With regard to the collecting electrode on which a metal wire, coated with a layer consisting of conductive adhesive, is adhered to the photovoltaic element via the layer of coating, we have prevented the metal ions in the metal wire from diffusing into the semiconductor layer of the photovoltaic element. As a result, we were able to prevent the short circuiting of the metal wire and the semiconductor layer of the photovoltaic element, which causes deterioration of the photovoltaic element's conversion efficiency.

(2) Because the coating layer possesses the property of preventing the diffusion of the metal ions, it becomes possible to prevent the deterioration of the photovoltaic element's conversion efficiency caused by the short circuiting of the metal wire and the semiconductor layer of the photovoltaic element, even if the metal wire is applied with a voltage that is greater than the photovoltaic element's electromotive force, regardless of the voltage which is applied to the metal wire.

(3) Because the conductive adhesive consists of conductive particles and polymer, the resistivity of the conductive adhesive can be adjusted to between 0.1 Ωcm and 100 Ωcm.

(4) The surface of the metal, for example, a metal wire, is altered in such a way that it is readily bonded to organic material and therefore provides good adhesion to conductive resins containing organic material, because the conductive adhesive contains a coupling agent, conductive particles, and polymer.

(5) Since a silane based, titanate based, or aluminum based coupling agent will be used as the coupling agent, it is possible to control the interface between dissimilar materials. In other words, the coupling agent acts as a medium between the inorganic material (metal) and the organic material (binder resin included in the conductive resin), to form a strong bond between the two.

(6) Because we have determined the volume ratio of the conductive adhesive to be 0.04 ml/g or less, at a radius of 1 μm or less, we are able to avoid short circuits caused by the ionization and migration of silver in the conductive adhesive.

(7) Because the number average molecular weight of the polymer ranges form 500 to 50,000, it is possible to prevent diffusion of the metal ions.

(8) Because the gel rate of the polymer ranges from 20% to 100%, it is possible to control deformation and dislocation of the electrode even when heat is applied after the electrode is formed. As a result, it becomes possible to prevent diffusion of the metal ions.

(9) Because the layer of coating consists of two or more layers and the conductive adhesive which makes up all coating layers, other than the outermost layer, consists of a polymer, it is possible to assign different tasks such as prevention of moisture and metal ion permeation, and the adhesion between the metal wire and the semiconductor layer or the transparent electrode, to different layers.

(10) Because the layer of coating consists of two or more layers and the conductive adhesive which comprises the outermost layer consists of an uncured thermoplastic polymer, the collecting electrode can be stored, providing sufficient adhesive strength when curing is completed during the formation of the electrode on the photovoltaic element. As a result, we were able to prevent deformation of the electrode that causes changes in line width, partial peeling or positional dislocation of the electrode, caused by heating during subsequent processing, such as lamination following the formation of the collecting electrode.

(11) Because the conductive adhesive consists of two or more layers and because the softening point of the conductive adhesive making up the layer closest to the electrode is set higher than the maximum temperature of the heating applied to the photovoltaic element during the manufacturing process, we are able to prevent melting or peeling during the formation of the moisture protection layer, or deformation or peeling during lamination.

(12) Because we have limited the resistivity range of the conductive adhesive to 0.1 Ωcm to 100 Ωcm, it possesses a preventive function against shunting and we were able to reduce the electric resistance loss to negligible levels.

(13) Because at least one of urethane, phenoxy, epoxy, butyral, phenol, and polyimide, is chosen as the polymer, we are able to select the desired hardness of the resin from a wide range. As a result, the metal wire can be coated readily, workability is good, good flexibility is provided, and it can be heat cured. As a result, durability is improved.

(14) Because we have selected blocked isocyanates as the curing agent to be contained in the conductive adhesive, we are able to control the cross-linking density of the conductive adhesive, before and after the formation of the electrode on the photovoltaic element. As a result, the collecting electrode is easy to handle and guarantees stability during storage. Furthermore, the process of applying the conductive adhesive to the collecting electrode can be performed at low cost.

(15) Because the glass transition point of the conductive adhesive is 100° or higher, the permeation of paint solvents into the electrode coated with conductive adhesive, when compression bonding the electrode coated with conductive adhesive to the surface of the photovoltaic element, can be prevented.

(16) Because the average diameter of the primary conductive particles was limited to a range of 0.02 μm to 15 μm, they are smaller than the thickness of the coating and the increase in resistivity caused by the contact between particles can be controlled.

(17) Because we have specified the conductive particles to be at least one of the following: graphite, carbon black, $In_2O_3$, $TiO_2$, $SnO_2$, ITO, ZnO or a substance that is created by adding to these a dopant consisting of tervalent metal elements, it was possible to make particles with diameters of 0.02 μm to 15 μm.

(18) The transparent electrode on the semiconductor layer of the photovoltaic element and the conductive adhesive were formed in contact with each other. As a result, the efficiency of the semiconductors in particular the non-monocrystal semiconductors that have a large resistance in the planar direction; was improved by forming a transparent electrode on the semiconductor layer.

(19) In the case of a photovoltaic element which consists of a semiconductor layer (having at least one pin junction or pn junction) and a collecting electrode formed on the light incident side of the semiconductor layer, we were able to obtain a photovoltaic element of good initial characteristics and long term dependability, because the collecting electrode consists of the above mentioned collecting electrode.

(20) We were able to obtain a photovoltaic element with good conductivity and sufficiently low series resistance, because the semiconductor layer had a transparent electrode on the light incident side and the collecting electrode was formed on the transparent electrode.

(21) We were able to obtain a photovoltaic element of good initial characteristics and long term dependability, because at least one of the following is used for the semiconductor layer: monocrystal silicon, polycrystalline silicon, thin film polycrystalline silicon, amorphous silicon, amorphous silicon-germanium or amorphous silicon-carbon.

(22) Because the semiconductor layer consisted of three layers of cells each consisting of a pin junction or pn junction, a photovoltaic element of better initial characteristics was obtained.

(23) As for the production method of photovoltaic elements with a collecting electrode on the light incident side, we were able to realize a production method that offered good production yield, because the collecting electrode is adhered to the light incident side of the photovoltaic element with heat and/or pressure.

(24) We were able to produce photovoltaic elements of good initial characteristics and long term dependability, because the heat applied to the collecting electrode is higher than the dissociation temperature of the blocked isocyanate, therefore allowing the adhesion and curing of the collecting electrode to be completed in a short period of time.

(25) We were able to produce photovoltaic elements of long term dependability, which were not readily affected by moisture after the adhesive formation of the photovoltaic elements, because the collecting electrode is heated until the gel rate of the uncured polymer which forms the coating layer is between 20% to 100%.

The following sections describe the embodiments of the invention.

Collecting Electrode

Figure 1B:
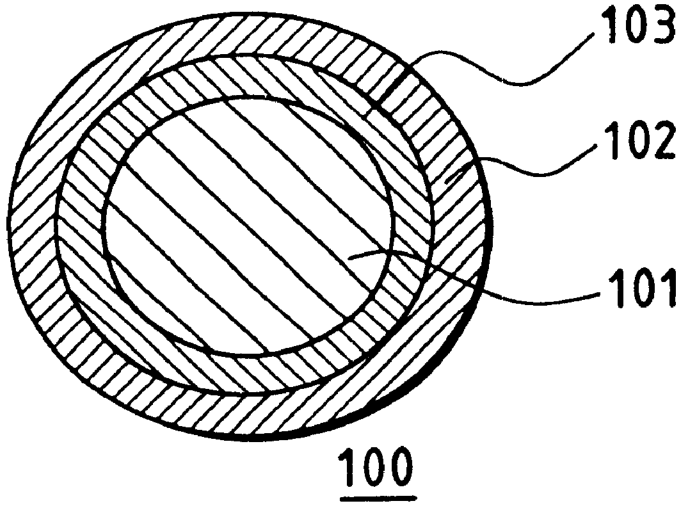
Figure 2A:
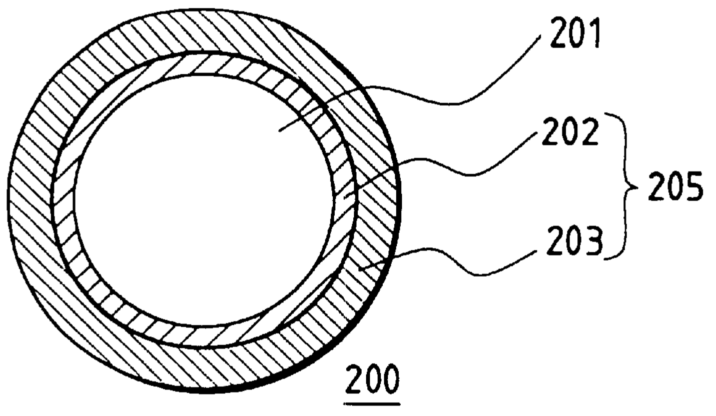
FIGS. 2A, 2B, and 2C are schematic cross-sectional views illustrating the structure of a collector electrode having a plurality of coating layers and the fixation condition of such a collector electrode to a substrate.

Collecting electrodes, according to this invention, are described in FIGS. 1A and 1B, and 2A to 2C. The collecting electrode 100 shown in FIG. 1A is one in which a metal wire 101 is coated with one type of coating layer 102. The collecting electrode 200 shown in FIG. 2A is one in which a metal wire 201 is coated with a composite coating layer 205 formed of two types of coating layers, namely, first coating layer 202 and second coating layer 203.

It is desirable for the metal wires 101 and 202 composing the collecting electrode 100 and 200 to be wire material for which an industrially stable supply is available. It is also desirable that the metal composing the metal wires 101 and 201 possess a resistivity of $10^{-4}$ Ωcm or less.

For example, copper, silver, gold, platinum, aluminum, molybdenum and tungsten are suitable because of their low electric resistance. Of these, copper, silver, and gold are the most desirable due to their low electric resistance. The metal wire can also be an alloy of these metals.

Figure 2B:
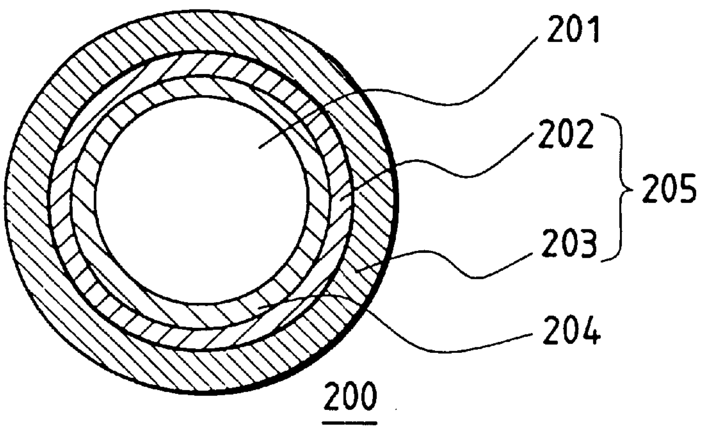

If so desired, it is also proper to form thin metal layers 103 and 204, such as those shown in FIGS. 1B and 2B, on the surface of the metal wire for purposes such as corrosion prevention, oxidation prevention, improvement of adhesion with the conductive resin, and improvement of electric conductivity. Candidates for metal layers to be applied to the metal wire surface are precious metals that offer resistance to corrosion, such as silver, palladium, silver-palladium alloy, and gold, as well as metals with good corrosion resistance, such as nickel and tin. Of these, gold, silver, and tin are not readily affected by moisture, therefore making them suitable for the metal layer. For example, plating and cladding are suitable methods of forming the metal layer on the metal wire surface. It is also possible to create a coating of conductive resin in which the metals are used as fillers and distributed throughout the resin. Though the thickness of the coating will depend on individual preferences, the ideal thickness for metal wires with a circular cross section would be 1% to 10% of its diameter. The ideal resistivity of the metal layer, considering the electric conductivity, corrosion resistance, and the thickness of the metal layer, would be $10^{-6}$ Ωcm to 100 Ωcm.

The cross section of the metal wire can be circular or rectangular and can be chosen as desired. The diameter of the metal wire is chosen so that the sum of the electric resistance loss and shadow loss is minimal. In specific terms, a copper wire for enamel wire with a diameter of 25 μm to 1 mm, as indicated in the JIS-C-3203 is suitable for use. It is even more desirable to use diameters of 25 μm to 200 μm to create photovoltaic elements with good photoelectric conversion efficiency. Wires with diameters smaller than 25 μm are prone to breakage, difficult to produce, and their power loss is larger. Meanwhile, diameters of 200 μm or more cause larger shadow loss or the surface of the photovoltaic element becomes bumpy, making it necessary to make the filler used on the surface coating layer, such as EVA, thicker.

The metal wire is produced by using a well-known wire drawing machine to form it into the desired diameter. The wire which has passed through the wire drawing machine is hard, but is annealed using a well-known method to meet desired characteristics of stretchability and bendability, and it can be also used as a soft wire.

Collecting Electrode Coated With a Conductive Adhesive Consisting of One Layer

An example of a collecting electrode coated with a conductive adhesive consisting of one layer according to this invention is shown in FIG. 1A.

In FIG. 1A, 101 is a metal wire for the electrode and 102 is the coating layer. The metal wire 101 is the core wire of the collecting electrode, and is made of a wire that possesses good conductivity: such as copper wire, silver plated copper wire, or silver-copper clad wire, in order to reduce power loss. The coating layer 102 is formed from heat curing conductive adhesive or thermoplastic conductive adhesive, and its function is to mechanically and electrically connect the main part of the collecting electrode to the photovoltaic element substrate, through a thermocompression bonding process.

Collecting Electrode Coated With a Conductive Adhesive Consisting of Two Layers

An example of a collecting electrode coated with a conductive adhesive consisting of a two layer composite 205 is shown in FIG. 2A.

In FIG. 2A, 201 is a metal wire for the electrode, 202 is the first coating layer, and 203 is the second coating layer. The metal wire 201 is the core wire of the collecting electrode, and is made of a wire that offers good conductivity, such as copper wire, silver plated copper wire or silver-copper clad wire, in order to reduce power loss. The first layer 202 is formed with a heat curing conductive adhesive, protects the electrode metal, and provides mechanical and electrical connection. It also has the function of preventing migration of the electrode metal and controlling the flow of current into defective areas of the photovoltaic element from the collecting electrode. The second layer 203 is also formed of heat curing conductive adhesive, and its function is to mechanically and electrically connect the main part of the collecting electrode to the photovoltaic element substrate, through the thermocompression bonding process. And also because it heat cures, it is not readily damaged by paints used in the moisture prevention layer in later processes.

In other words, the first coating layer 202, which is in direct contact with the metal wire 201, is a barrier layer which prevents moisture from reaching the metal wire to prevent corrosion of the metal wire surface, as well as to prevent metal ion migration from the metal wire. The second layer 203 is an adhesive layer, which has the functions of adhering the collecting electrode to the semiconductor layer or transparent electrode and of current collection.

As for polymers included in the conductive adhesive that make up the first layer 202, resins with relatively little moisture permeability are suitable for use. In other words, urethane, epoxy, phenol, or heat curing resins created by denaturating these resins are ideal. Also, it is desirable to allow thorough curing after these resins are applied. In addition, it is desirable that the thickness of the first layer be 1 μm to 15 μm, in order to prevent excessive shadow loss. Thicknesses of under 1 μm will make it difficult to create a uniform coating and pin-holes will occur, rendering it insufficient as a barrier. On the other hand, thicknesses of over 15 μm are not desirable because they are difficult to peel and shadow loss becomes too great.

As for polymers included in the conductive adhesive that make up the second layer 203, resins with good adhesive properties and good flexibility are particularly suitable. In other words, urethane, epoxy, phenol or heat curing resins made by denaturating these resins or thermoplastic resins, such as phenoxy, polyamide, or polyamideimide are suitable. In particular, urethane resin is suitable for use because its cross-linking density is readily adjusted. It is desirable to leave these resins uncured after coating and cured only after the adhesion process is complete. For this reason, blocked isocyanate is desirable as the polymeric curing agent. The blocked isocyanate has the property of progressively curing the resin when heated above the dissociation temperature. Therefore, by drying it at temperatures lower than the dissociation temperature, any solvent contained in it can be completely removed, therefore depriving it of its stickiness and tackiness, allowing it to be coiled on a reel for storage. In addition, because curing will not progress unless temperatures exceeding the dissociation temperature of the isocyanate are applied, it will uniformly provide sufficient adhesive strength during the formation of the collecting electrode.

The thickness of the second coating layer will depend on the diameter of the wire. For example, if the diameter of the metal wire is 100 μm, the ideal thickness of the second coating layer is 5 μm to 30 μm; which is a thickness that would have no pin-holes, would provide sufficient properties as an adhesive layer and not cause extreme shadow loss.

Figure 11:
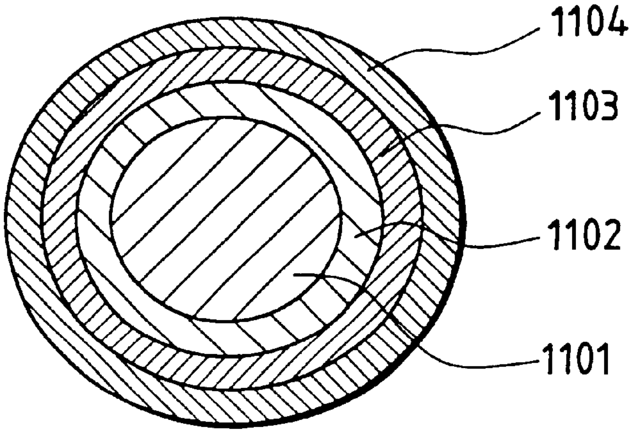
FIG. 11 is a schematic cross-sectional view illustrating the structure of a photovoltaic element using a collector electrode having a three layer coating, according to the present invention.

Collecting Electrode Coated With a Conductive Adhesive Consisting of Three Layers An example of a collecting electrode coated with a conductive adhesive consisting of three layers according to this invention is shown in FIG. 11.

In FIG. 11, 1101 is the metal wire for the electrode, 1102 is the first coating layer, 1103 is the second coating layer, and 1104 is the third coating layer. The metal wire 1101 is the core wire of the collecting electrode 1100, and is made of a wire that offers good conductivity, such as copper wire, silver plated copper wire, or silver-copper clad wire, in order to reduce power loss. The first layer 1102 is formed of heat curing conductive adhesive, and provides electrical connection with the electrode metal. Metallic conductive adhesives are suitable for the first coating layer 1102, to provide an electrical connection with the electrode metal. The second layer 1103 prevents migration caused by the metal fillers in the metallic conductive adhesive used in the electrode metal and the first coating layer. It also controls the flow of current to defective areas in the photovoltaic element from the collecting electrode. The third coating layer 1104 is also formed of heat curing conductive adhesive and its function is to mechanically and electrically connect the main part of the collecting electrode to the photovoltaic element substrate, via a thermocompression bonding process. And also because it heat cures, it is not readily damaged by paints used in the moisture prevention layer in later processes.

Conductive Adhesives and Their Resistivity

In this invention, the conductive adhesive used to coat the metal wire is made by distributing conductive particles and polymer. The resistivity of the conductive adhesive must be negligible in terms of collecting the electric current generated by the photovoltaic element and at the same time, provide adequate resistance to prevent shunting. In specific terms, 0.1 Ωcm to 100 Ωcm is desirable. When the resistance is smaller than 0.1 Ωcm, the shunt prevention function becomes insufficient and when it is greater than 100 Ωcm, loss from electric resistance becomes too great.

Conductive Particles

Conductive particles according to this invention are pigments which add conductivity. Materials suitable for this purpose are, for example, carbon black, graphite, $In_2O_3$, $TiO_2$, $SnO_2$, ITO, ZnO, and oxide semiconductor materials made by adding the. appropriate dopant to the material. The diameter of the conductive particles should be smaller than the coating layer to be formed, but if the particles are too small the resistance at the contact points of the particles to each other becomes great, making it impossible to obtain the desired resistivity. For these reasons, the suitable average diameter for the conductive particles is 0.02 μm to 15 μm. It is also acceptable to adjust the resistivity and the particle distribution in the conductive resin by mixing two or more types of conductive particles. It is also acceptable to add translucency by using materials, such as ITO, $In_2O_3$, $TiO_2$, $SnO_2$, and ZnO. The usage of ITO produces especially good translucency.

The conductive particles and the resin are mixed in suitable ratios to obtain the desired resistivity. Resistivity will decrease as the amount of conductive particles increase, but the coating layer will lose its stability as the proportion of resin decreases. And when the amount of polymer is increased, the contact of the conductive particles to each other becomes faulty and will result in high resistance. Therefore, the optimum ratio should be determined depending on the polymer and conductive resin used, as well as its desired physical properties. In specific terms, good resistivity is obtained at volume percentages of the conductive particles ranging from 5% to 95%.

Polymer

A suitable resin according to this invention is one that facilitates coating of the metal wire, with good workability, flexibility, and weather resistance. Polymers with such characteristics are heat curing resins and thermoplastic resins.

As for heat curing resins, urethane, epoxy, phenol, polyvinylformal alkyd resin, and resins made by denaturing these materials are examples which are suitable for use. In particular, urethane, epoxy, and phenol resins are used as coating materials for enamel lines, and are good in terms of flexibility and productivity. They are also suitable as materials for collecting electrodes of the photovoltaic element, in terms of weather resistance and adhesion.

As for thermoplastic resins, butyral, phenoxy, polyamide, polyamideimide, melamine, butyral, acryl, styrene, polyester, and fluoride are examples of suitable materials. In particular, butyral, phenoxy, polyamide, and polyamideimide resins are good materials in terms of flexibility, weather resistance, and adhesion, making them suitable for use in collecting electrodes of photovoltaic elements.

Coupling Agent

In this invention, a conductive adhesive consisting of a polymer containing a coupling agent and conductive particles is suitable. The reason why good characteristics are obtained when a conductive adhesive containing a coupling agent is used is described below.

Generally, low resistance copper and aluminum wires used for electric appliances are inexpensive and good conductors. Enamel wires, etc. are made by coating these metal wires with insulating varnish, but generally, it is not easy to coat metals, which are inorganic, with material that contains organic material. In addition, sufficient adhesive strength may not be obtained when adhering the wire, through the coating layer, to semiconductors and metals. This is because a strong bond does not exist between the organic material in the coating layer and the semiconductor or metal material. This problem becomes even more pronounced depending on the metal material and its surface conditions, and we have discovered that almost no adhesive strength can be obtained when they are affected by moisture.

When the collecting electrode of this invention is used for solar batteries, its coupling agent acts to strengthen the bond between the organic material in the coating layer, with inorganic material, such as the surface of the solar cell substrate or metal tabs of the output electrode. This makes it possible to prevent areas from losing sufficient adhesive strength. In addition, because the coating layer consists of two or more layers, effectiveness can be improved by determining the type of coupling agents to be used at the innermost side, which is in direct contact with the metal wire, and the outermost layer, which is in direct contact with the solar cell substrate; depending on the material of the metal wire, material of the solar cell substrate, material of the metal tab, and the polymer composing these coating layers. Also, the adhesive strength enhanced by the coupling agents is maintained in high temperatures, high humidity, and high temperature/humidity environments, and therefore maintained even when the solar cell is used outdoors. This makes it possible to prevent deterioration of the conversion efficiency caused by the rise in series resistance from the deterioration of adhesive strength between the electrode and the solar cell substrate or metal tab, as well as from peeling. As the coupling agents used in this invention, silane derivatives, titanate derivatives, and aluminum derivatives are among those cited. Such coupling agents consist of a hydrophilic portion which has an affinity with inorganic material and an organic functional group which has an affinity with organic material. The surface control between foreign materials is the main purpose of its use. Particularly its function is based on a covalent bond and in this respect it is different from conventional surface active agents. That is, the coupling agent acts as a go-between between a combination of inorganic material (metal) and an organic material (polymer in conductive adhesive) and the two materials are firmly combined. A silane derivative coupling agent is covalently bonded to both the inorganic material and the organic one; however, titanate derivative coupling agents and aluminum derivative coupling agents sometimes do not form covalent bonds with organic material. By changing the polarity and surface energy of the surface of inorganic material, the strength of the bond can be increased. So, it is said that a silane coupling agent is the most effective.

As silane coupling agents suitable for this invention, the following products are among those cited: γ-mercaptoxy propyltrimethoxysilane, γ-glycixidpropyltrimethoxysilane, γ-(2-aminoethyl)aminopropyltrimethoxysilane, γ-(2-aminoethyl)aminopropylmethyldimethoxysilane, aminosilane, γ-anilinopropyltrimethoxysilane, vinyltriacetoxysilane, hexamethyldisilane, γ-chloropropyltrimethoxysilane.

As titanate coupling agents suitable for the invention, the following products are cited: isopropyltriisostearoyltitanate, tetra(2,2-diallyloxymethyl-1-butyl)bis(di-tridecyl) phosphitetitanate, tetraisopyruvis (dioctylphosphite)titanate, isopropyltri(N-aminoethyl-aminoethyl)titanate, tetraoctyl bis(ditridecylphosphite)titanate, isopropyltris (dioctylpyrophosphanate)titanate, bis(octylpyrophosphate) oxyacetatetitanate.

As an aluminum derivative coupling agent suitable for the invention, acetoalkoxyaluminumdiisopropylate is cited.

When the preceding coupling agent reacts with the surface of an inorganic material, there is an optimum amount in order to obtain optimum adhesive power. Usually, a coupling agent is mixed with a solvent, adjusted, and used. Such solvents are methanol, ethanol, isopropyl alcohol, toluene, benzene, acetone, methyl cellosolve, tetrahydrofuran and water. A solvent which is compatible with each coupling agent is selected and used. If the solvent is used at high concentration, the activity of the coupling agent would decrease. Therefore, a low concentration is used, 0.01%–10.0% is usually optimum.

Also, the hydrophilic portion of the preceding coupling agent depends on silane, titanate, and aluminum derivatives; the suitability to the reaction of inorganic material must be considered. On the other hand, the organic functional groups of coupling agents are amino, epoxy, carboxy, phosphite radicals, etc. The suitability to reaction of organic material with these organic function groups must. be considered.

Average Molecular Weight of Polymer

In order to prevent diffusion of the metal ions from the metal wire, it is necessary to obtain good adhesion of the conductive particles with the polymer. For this reason, a polymer of more than 500 and less than 50,000 average molecular mean weight is desirable.

In this invention, in order to form a dense coating film, it is necessary to improve the dispersibility between the polymer and the conductive particles, and to decrease the void volume of the formed coating layer. It becomes possible to control the effect of humidity by proper selection and combination of polymers having more than 500 and less than 50,000 average molecular weight and various kinds and diameters of conductive particles. The favorable resins for use are urethane, phenoxy, epoxy, butyral, phenol, polyimide, melamine, alkyd, fluorine polyvinylformal, polyamide, polyamideimide, polyester, acrylic, and styrene resins. Especially, urethane, phenoxy, epoxy, and phenol resins are widely used industrially for insulation material for enamel wire. Good properties with respect to humidity resistance, control of flexibility, and productivity can be obtained. Moreover, butyral resin has good dispersibility and polyimide resin has good heat resistance.

Gel Ratio of the Polymer

One way to measure the degree of cross-linking of the polymer is to measure its gel ratio. In other words, when a specimen of the polymer is soaked in solvents, such as xylene, the gel parts that have crossed-linked by gelation will not elute, but the sol parts which have not cross-linked will. In other words, when cross-linking is complete, there will be no elution of the sol parts. Next, when the specimen is removed and the xylene is evaporated, the undissolved gel part, from which the sol part has been removed, will remain. The gel ratio is obtained by measuring the amount of non-cross-linked and eluted sol. The method of calculation is described below.

$$\text{Gel ratio}=[(\text{weight of undissolved part})/\text{original weight of specimen}]\times 100\ (\%)$$

High gel ratios after the drying process will result in decreased adhesive strength during the formation of the collecting electrode. In addition, low sol ratios of the conductive resin layer of the collecting electrode formed by thermocompression, may result in decreased dependability when subjected to moisture.

Therefore by limiting the gel ratio of the polymer layer of the conductive resin layer to 0% to 20%, after the adhesive layer has been coated and dried onto the metal wire, its initial adhesion will not be affected during storage. In addition, by keeping the gel ratio of the adhesive layer to 20% to 100%, after the thermocompression formation of the collecting electrode, dependability during usage will also be improved.

Mixing of the Conductive Particles and the Polymer

The mixing of the conductive particles and the polymer according to this invention is conducted at a suitable ratio to obtain the desired resistivity. Resistivity will decrease as the amount of conductive particles increase, but the coating layer will lose its stability as the proportion of resin decreases. Also, when the polymers are increased, the contact between the conductive particles becomes faulty and results in high resistance. Therefore, the optimum ratio should be determined depending on the polymer and conductive resin to be used, as well as its desired physical properties. In specific terms, good resistivity is obtained at volume percentages of the conductive particles ranging from 5% to 95%.

The distributing devices used in mixing of the conductive particles and the polymer according to this invention are, for example, regular triple roll mills, ball mills, paint shakers, and bead mills. It is acceptable to add distributing agents and coupling agents as desired to improve distribution. It is also acceptable to dilute it with a suitable solvent to adjust the viscosity of the conductive adhesive, during or after distribution.

Layer Closer to the Electrode

The layer closer to the electrode according to this invention, are those layers which have either one or both of the following functions: to protect the metal wire used in the electrode from the surrounding environment or to establish an electrical connection with the metal wire. The resistivity of the layer closer to the electrode must be such that it does not offer electric resistance when collecting the current generated by the photovoltaic element and a suitable range would be 0.1 Ωcm to 100 Ωcm. By using heat cured conductive adhesive for the layer closer to the electrode, solvent resistance and heat resistance during production, as well as dependability during usage, is improved.

If so desired, it is acceptable to form the contact layer, of which the main ingredient is metal, as the layer closer to the electrode. The contact layer has the function of improving the electrical contact between the metal wire and the conductive adhesive. In particular, when copper is used for the electrode metal wire, its surface is subject to oxidation, resulting in high resistance, in which case the contact resistance will increase, should graphite and substances like metal oxides be used for the conductive particles. The contact layer is used to prevent such occurrences. Candidate materials for the contact layer are precious metals that offer resistance to corrosion, such as silver, palladium, silver-palladium alloy, and gold, as well as metals with good corrosion resistance, such as nickel and tin. When the contact layer consists of a conductive adhesive, it is desirable to produce an adhesive with the metal as its filler. It is also acceptable to form a layer of tin or silver on the metal wire by plating, without using conductive adhesives. Silver clad copper wires are also acceptable.

When metal-based conductive adhesive is used as the layer closer to the electrode, it is acceptable to form a barrier layer on top of it that will prevent metal ion migration.

The thickness of the barrier layer will vary depending on the wire diameter and preference. For example, for a wire with a diameter of 100 μm, a thickness of 1 μm to 15 μm would be desirable to prevent pin-holes, to provide sufficient function as a barrier, and to prevent excessive shadow loss. Thicknesses of under 1 μm make it difficult to create a uniform coating and pin-holes will occur, rendering it insufficient as a barrier. On the other hand, thicknesses of over 15 μm are not desirable because they are difficult to peel and shadow loss becomes too great.

Void Ratio of the Conductive Adhesive

In order to improve its barrier effect against metal ions, the void ratio of the conductive adhesive used in the barrier layer must be 0.04 ml/g or smaller, for a void radius of 1 μm or smaller.

Void radii of over 1 μm or more exist only very rarely for regular adhesives containing pigment. When voids larger than this do exist, the mechanical strength of the conductive adhesive deteriorates after curing. Also, void ratios exceeding 0.04 ml/g will allow water to penetrate, which will degrade the bond between the conductive particles and the polymer in the conductive adhesive, resulting in greater resistance or metal ion migration.

Glass Transition Point of the Conductive Adhesive

According to this invention, it is desirable that the glass transition point of the conductive adhesive after curing is 100° C. or higher. This will give it characteristics to sufficiently withstand the heating during over-coating after the formation of the coating, as well as during the top coat application and lamination processes.

Method of Coating the Conductive Adhesive

Regular coating methods used for enamel wires can be suitably used as the method of coating the conductive adhesive in this invention. In specific terms, the conductive adhesive will be diluted to an appropriate viscosity, after which it will be coated onto the metal wire using a roll coater etc., after which it will be passed through dies or felt to form the desired thickness, and finally dried and cured using infrared heating, etc.

Figure 3:
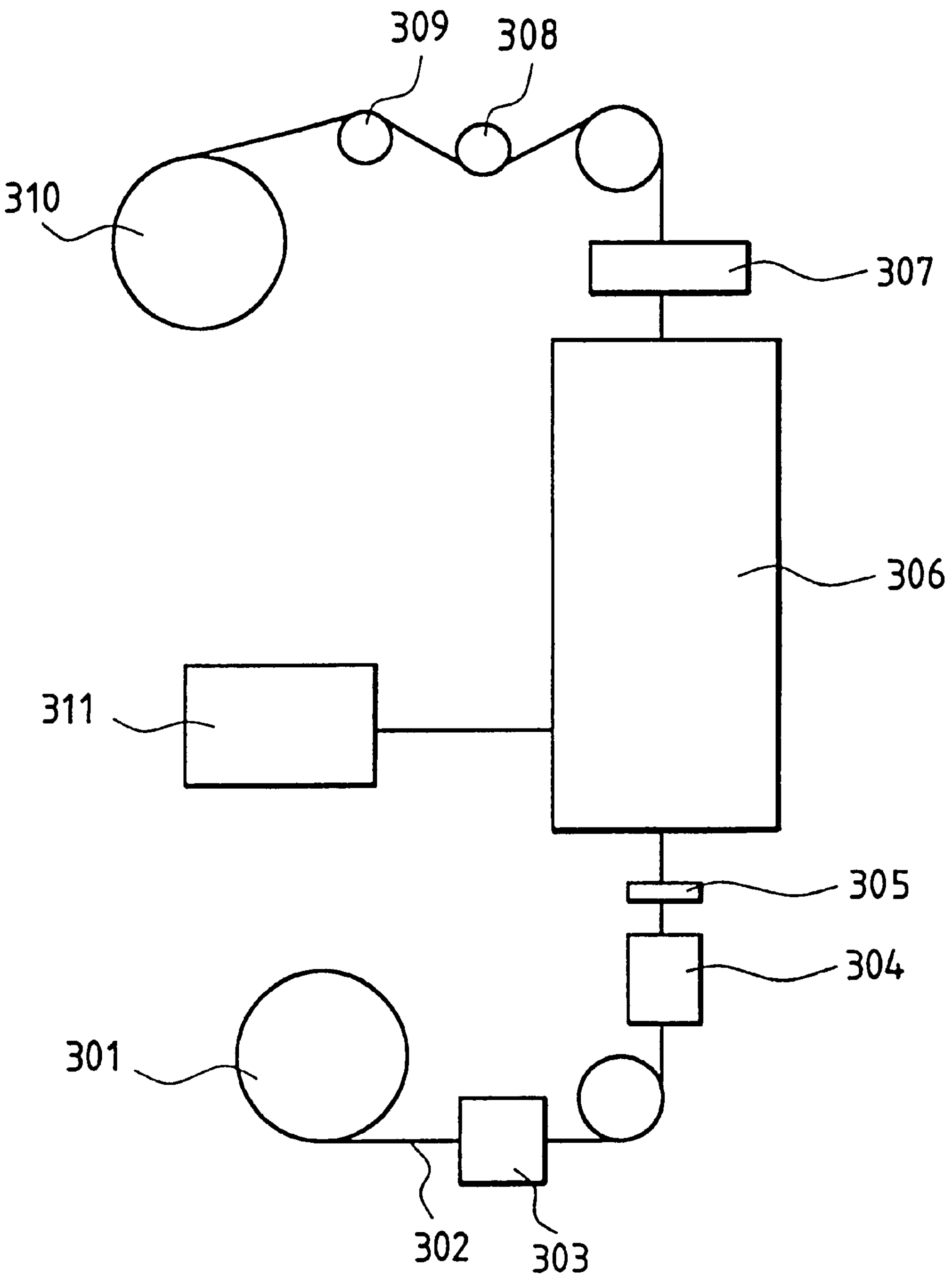
FIG. 3 is a schematic cross-sectional view illustrating a wire coating device used for manufacturing a collector electrode of the present invention.

FIG. 3 is a schematic diagram describing a suitable coating device. In FIG. 3, 301 is a delivery reel, 302 is the metal wire, 303 is a cleaning tank, 304 is a coater, 305 is a die, 306 is a drying oven, 307 is a film thickness gauge, 308 is a tension controller, 309 is an aligned winding motor, 310 is a take-up reel and 311 is a temperature regulator.

The delivery reel 301 is a bobbin around which the metal wire before coat formation is wound. The cleaning tank 303 is used only when required. This tank is filled with solvents, such as acetone, MEK, and IPA, and is used to clean the surface of the metal wire 302 of any dirt. The coater 304 is a device which is used to apply the conductive adhesive to metal wire 302. The coater 304 contains a certain amount of conductive adhesive to be applied and can be equipped with a solvent adding mechanism for adjusting viscosity, a conductive adhesive replenishing mechanism, or a filter mechanism if desired. The die 305 is a device which controls the thickness of the applied conductive adhesive to the desired thickness. As for the die 305, commercially available dies for enamel coatings are suitable for use, but felt may be used if desired. The drying oven 306 is used to remove solvent from the applied conductive adhesive and to dry it. It is also used for curing and if desired, these can be hot air driers or infrared driers. The film thickness gauge 307 is used to measure and manage the thickness of the applied conductive adhesive, and a commercially available outer diameter gauge is suitable for this purpose. It is also acceptable to use the information obtained through the film thickness gauge to conduct feedback controls, such as for delivery speed and viscosity of the conductive adhesive. The tension controller 308 maintains a constant tension, to prevent sag or forces exceeding the yielding point applied to the metal wire 302. The aligned winding motor 309 is a device that controls the spacing of the wire while the wire is being wound around the take-up reel 310. The take-up reel 310 is rotated at the desired speed, by a motor which is not shown in the figure. The temperature regulator is a device which maintains the temperature in the drying oven 306 at the set value. Well-known methods, such as slidack, on/off control, and PID can be used if desired.

FIG. 3 shows a vertically oriented device, but the direction of travel of the metal wire 302 can be either vertical or horizontal and can be determined based on preference.

When applying multiple coats of conductive adhesive, (the wire) may be taken up by the bobbin after each coating, but it may also be taken up by the bobbin after multiple coatings are complete. FIG. 3 shows the coating of one wire, but multiple wires may be coated simultaneously.

The metal wire, onto which conductive adhesive has been coated, is to be stored wound around the bobbin, to be unwound for use when forming the collecting electrode for the photovoltaic element.

Photovoltaic Element

Solar batteries configured as shown in FIGS. 4A to 4C through FIGS. 8A and 8B are examples of photovoltaic elements according to this invention.

Figure 4A:
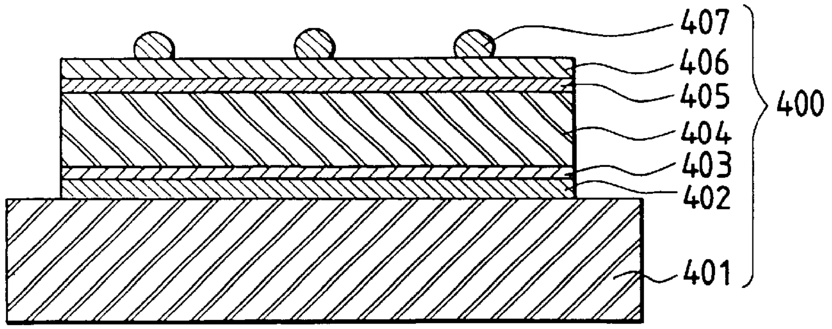
FIGS. 4A, 4B, and 4C are schematic cross-sectional views illustrating the structure of solar cells of amorphous silicon type, according to the present invention.
Figure 4B:
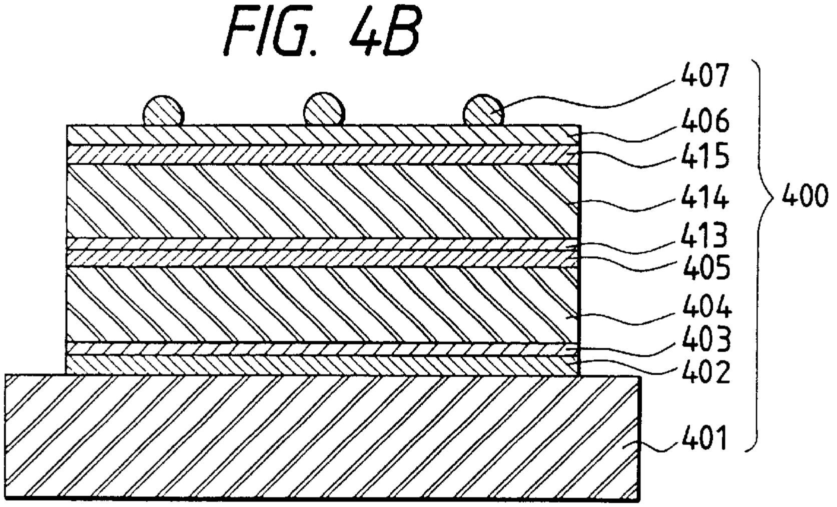
Figure 4C:
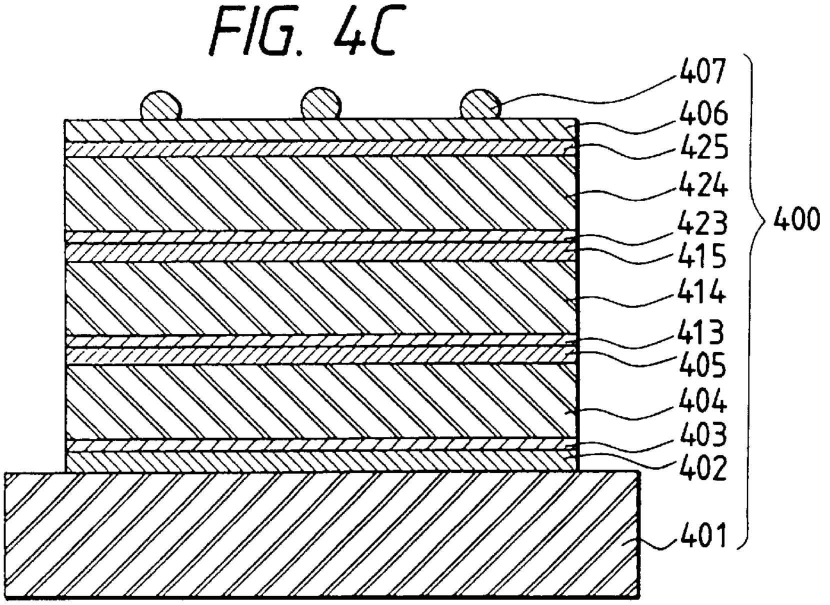

Shown in FIGS. 4A to 4C is a typical cross section of an amorphous silicon based solar cell, which receives light from the surface opposite the substrate. In these figures, 401 is a substrate, 402 is a lower electrode, 403, 413, and 423 are n-type semiconductor layers, 404, 414, and 424 are i-type semiconductor layers, 405, 415, and 425 are p-type semiconductor layers, 406 is an upper electrode consisting of a transparent conductive film, and 407 is a grid electrode where the collector electrode is used.

Figure 5:
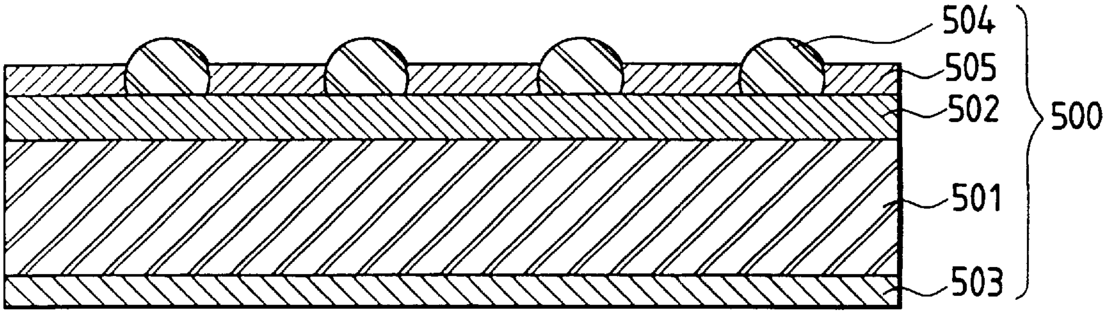
FIG. 5 is a schematic cross-sectional view illustrating the structure of a solar cell of single crystal silicon type, according to the present invention.

FIG. 5 shows a cross section of a monocrystal silicon solar cell. 501 is a semiconductor layer consisting of the silicon wafer substrate, 502 is a semiconductor layer which forms a pin junction with the semiconductor layer 501, 503 is a rear electrode, 504 is a collecting electrode, and 505 is an anti-reflection coating.

Figure 6:
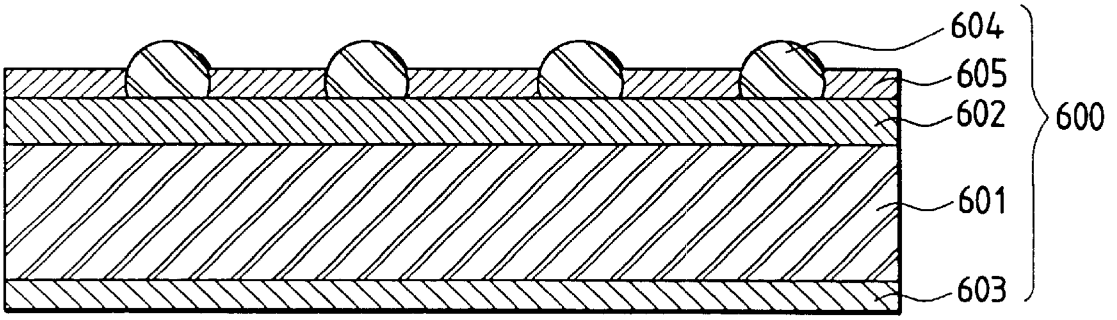
FIG. 6 is a schematic cross-sectional view illustrating the structure of a solar cell of polycrystal silicon type, according to the present invention.

FIG. 6 shows the cross section of a polycrystalline silicon solar cell, wherein 601 is a semiconductor layer consisting of a silicon wafer substrate, 602 is a semiconductor layer which forms a pn junction with semiconductor layer 601, 603 is a rear electrode, 604 is a collecting electrode and 605 is an anti-reflection coating.

Figure 7:
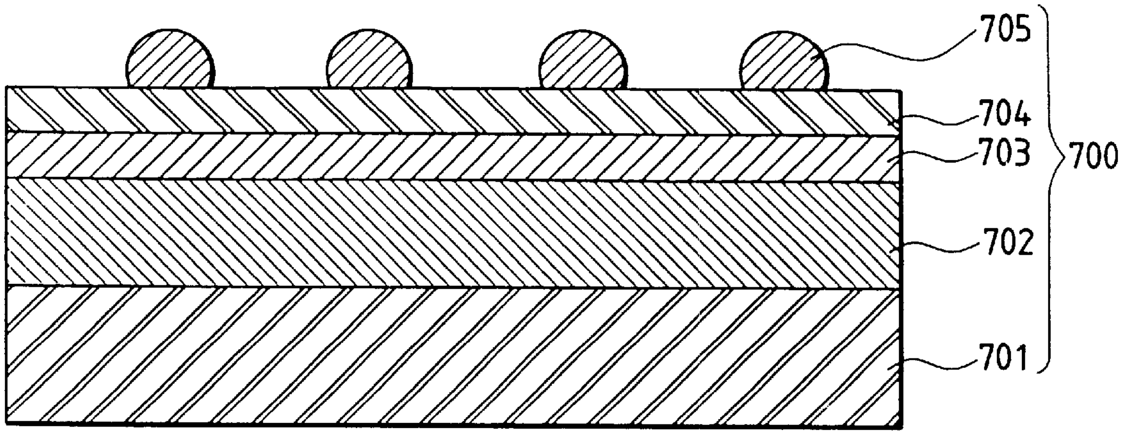
FIG. 7 is a schematic cross-sectional view illustrating the structure of a thin film solar cell of polycrystal silicon type according to the present invention.

FIG. 7 shows the cross section of a thin film polycrystalline silicon solar cell, wherein 701 is a substrate, 702 is a polycrystaline semiconductor layer, 703 is a semiconductor layer which forms a pn junction with semiconductor layer 702, 704 is an anti-reflection coating electrode, and 705 is a collecting electrode.

Figure 8A:
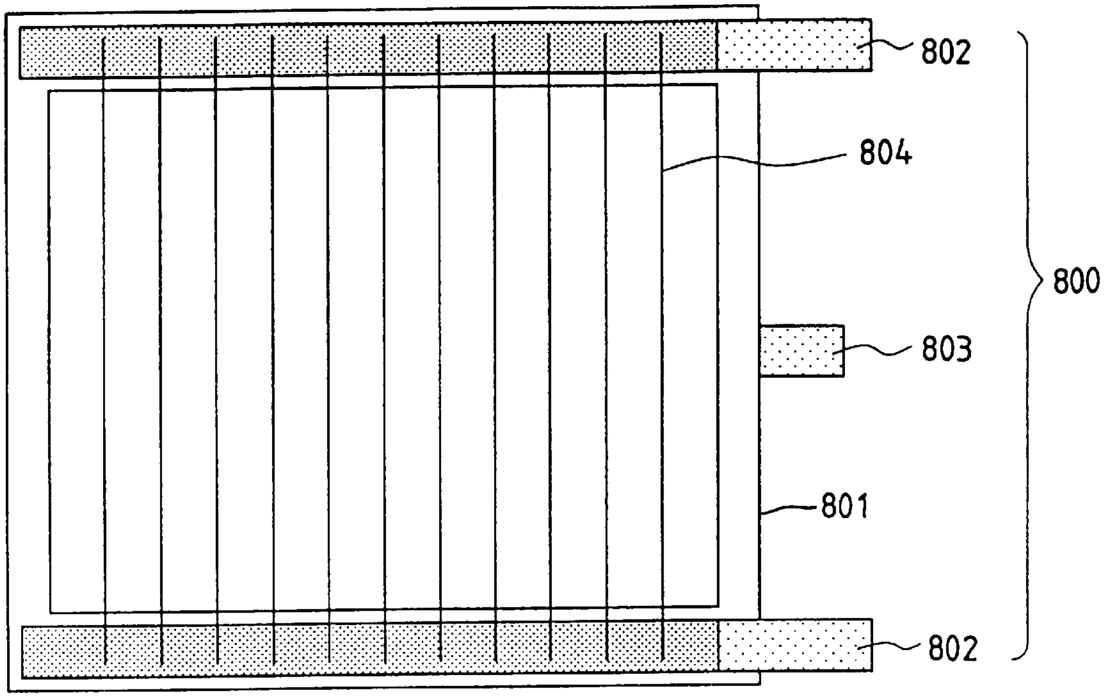
FIGS. 8A and 8B are schematic plan views illustrating the structure of solar cells that are examples of the photovoltaic elements according to the present invention.
Figure 8B:
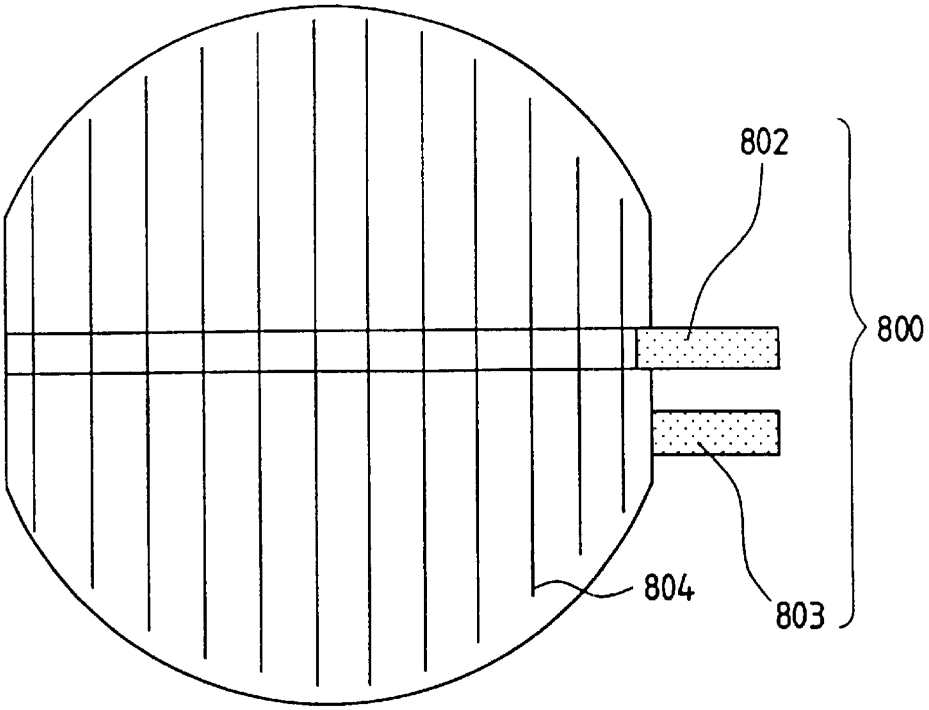

FIGS. 8A and 8B show the solar cells 800 shown in FIGS. 4A to 4C through 7, from the light incident side. 802 is the positive electrode, 803 is the negative electrode and 804 is the collecting electrode.

The photovoltaic element in this invention, consists of, for example, a semiconductor layer which contributes to electricity generation, a transparent conductive layer on the light incident side of the semiconductor layer, a collecting electrode consisting of the metal wire and conductive adhesive on the transparent electrode, and a rear electrode on the side opposite of light incident side of the semiconductor layer.

The semiconductor layer is required to have a structure which includes at least one semiconductor junction, such as pn junction, pin junction or Schottky barrier, etc. Materials suitable for this purpose are, for example, semiconductors of group IV, such as crystalline silicon, polycrystalline silicon and amorphous silicon, compound semiconductors of groups II–VI, such as Cds and CdTe, or compound semiconductors of the group III–V, such as GaAs.

In the photovoltaic element of this invention, the collecting electrode is positioned on the light incident side of the semiconductor layer, positioned in a parallel configuration, with appropriate spacing. The electrode in this invention is particularly suitable for the formation of photovoltaic elements with large areas. For example, when producing a 30 cm×30 cm photovoltaic element, collecting electrodes can be formed by placing electrodes, consisting of metal wires 30 cm in length and coated with conductive adhesive, on the semiconductor layer at specified intervals. Furthermore, for the purpose of sending electric currents from the collecting electrode to one terminal, a bus bar electrode of relatively large capacity is to be formed.

The rear electrode of the photovoltaic element in this invention is formed on the rear surface of the semiconductor layer, the metal of which is formed, for example, by screen printing or deposition. The type of metal used should be one that offers good ohmic contact with the semiconductor.

When the semiconductor layer is made of a thin film consisting of monocrystal semiconductors containing amorphous silicon, microcrystal silicon or polycrystalline silicon based substances, it will need a separate substrate. Both insulative and conductive substrates may be used for the separate substrate. Substrates of metals, such as stainless steel or aluminum are suitable for use and these also function as the rear electrode. When insulative substrates, such as glass, polymer, and ceramics, etc. are used, metal layers such as chrome, aluminum, or silver are required to form the rear electrode. The lower electrode 402 is an electrode on one side of the layer stack to retrieve the power generated in the semiconductor layers 403, 404, 405, 413, 414, 415, 423, 424 and 425, and is required to possess a work function that will create an ohmic contact with semiconductor layer 403. Materials used are, for example, metals or alloys, and transparent conductive oxides (TCO), such as Al, Ag, Pt, Au, Ni, Ti, Mo, W, Fe, V, Cr, Cu, nichrome, $SnO_2$, $In_2O_3$, ZnO, or ITO, etc. It is desirable that the surface of the lower electrode is smooth, but it may be textured if it is to cause irregular reflection of light. Also, if substrate 401 is conductive, there is no need for a lower electrode 402. The lower electrode may be formed with well-known methods, such as plating, depositing, or sputtering.

Not only are single junction structures with n-layer 403, i-layer 404, and p-layer 405 as one junction set suitable for the amorphous silicon semiconductor layer, but so are double or triple structures consisting of two or three sets of pin or pn junctions. Materials such as a-Si, a-SiGe and a-Sic, or the so called group IV and group IV alloy-type amorphous semiconductors, are suitable in particular, for the semiconductor material used for the i-layers 404, 414 and 424. Methods such as depositing, sputtering, high-frequency plasma CVD, microwave plasma CVD, ECR, thermal CVD, and LPCVD methods, for example, can be used for the film formation of the amorphous semiconductor layer if desired. Transparent conductive film 406 is required when the sheet resistance is high, such as is the case with amorphous silicon. And because it is positioned on the light entry side, it is required to be transparent. Materials such as $SnO_2$, $In_2O_3$, ZnO, CdO, $CdSNO_4$, and ITO, for example, are suitable for the transparent conductive film 406.

As for monocrystal silicon solar cell 500 and polycrystalline silicon solar cell 600, a separate substrate is not required and the monocrystal wafer 501 and polycrystalline wafer 601 act as the substrate. The monocrystal wafer 501 is made by cutting, etc. a Si ingot which is pulled with the CZ method. The polycrystalline wafer 601 is formed by cutting a Si ingot obtained by the casting method or by obtaining a polycrystal in sheet form using the ribbon method. For example, the vapor phase diffusion method using $POCl_3$, the coating diffusion method using $TiO_2$, $SiO_2$ or $P_2O_5$, or the ion implantation method which dopes it directly with ions is used to make semiconductor layers 502 and 602. The rear face electrodes 503 and 603 are made by forming metal films by deposition or sputtering, or by screen printing of silver paste. The low reflection coatings 504 and 604 are formed to prevent the loss of efficiency caused by light reflecting off of the solar cell surface. Suitable materials are, for example, $SiO_2$, $Ta_2O_5$, and $Nb_2O_5$.

The thin film polycrystal cell 700 is formed by growing Si polycrystal thin film 702 on substrate 701 made of alumina or graphite, etc. And in some cases, a particle diameter enlargement process is conducted, after which this is used as a substrate once again, onto which the base layer is formed, on top of which the surface layer 703 is formed using an epitaxial growth process. Low cost substrates, such as metal or Si may be used for substrate 701.

The second electrode consisting of the collecting electrodes of this invention is positioned on the light incident side of the semiconductor layer. It is desirable that they be positioned at appropriate intervals, so that the sum of the loss caused by the electric resistance of current collecting and shadow loss is minimum. For example, if sheet resistance is approximately 100 ohms/□, the desired intervals of the collecting electrodes would be about 5 mm. Also, optimization by narrowing the pitch of thin diameter wires and widening the pitch of thicker diameter wires will offer optimum efficiency.

The electrode in this invention is particularly suitable for the formation of solar cells with large areas. For example, when producing a 30 cm×30 cm solar cell, collecting electrodes can be formed by placing electrodes of this invention on the semiconductor layer at specified intervals. Furthermore, for the purposes of feeding electric currents from the collecting electrodes to one terminal, a tab may be positioned as the collector.

A solar cell produced in this manner is encapsulated using a well-known process, for better weather resistance and to maintain its mechanical strength, and is modularized for outdoor use. In specific terms, with regard to the materials used for encapsulation, EVA (ethylene vinyl acetate), etc. is suitable for the adhesive layer. It is also acceptable to impregnate EVA with clay glass, etc. to improve mechanical strength. In addition, a fluoride resin in laminated as a surface protectant to improve moisture and scratch resistance. Suitable materials are for example, a polymer of tetrafluoroethylene (TFE), a copolymer (ETFE) of tetrafluoroethylene and ethylene, polyvinyl fluoride, and polychloro fluorethylene (CTFE), etc. It is also possible to improve their weather resistance by adding ultraviolet ray absorbers to the resin. As for the method of laminating these resins with the solar cell substrate, heating and compression in a vacuum, using a commercially available device, such as vacuum laminator, for example, can be used.

Figure 9:
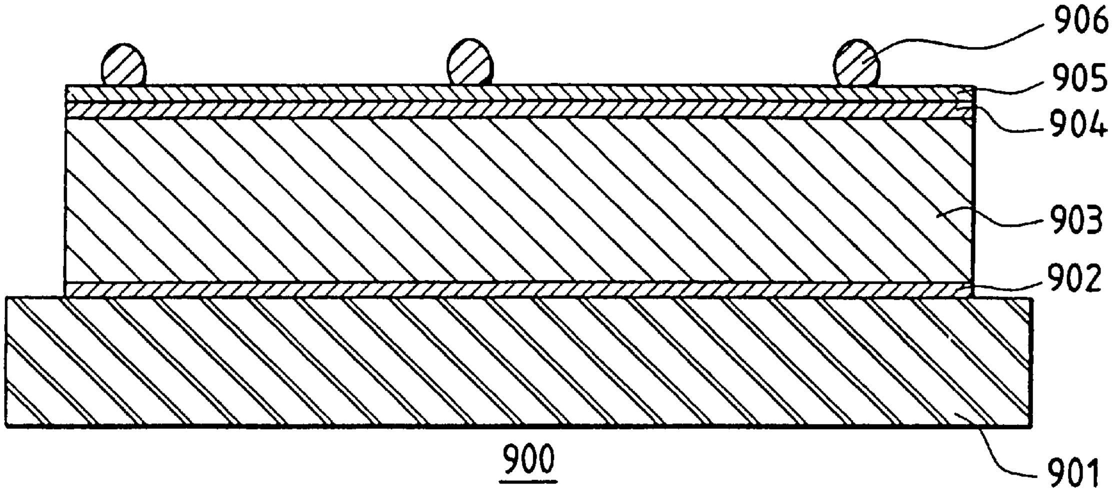
FIG. 9 is a schematic cross-sectional view illustrating the structure of a photovoltaic element using a collector electrode having a two layer coating, according to the present invention.

FIG. 9 is a typical cross section showing an example of the photovoltaic element 900. In FIG. 9, 901 is a substrate, 902 is a p-type semiconductor layer, 903 is an i-type semiconductor layer, 904 is an n-type semiconductor layer, 905 is a light incident electrode and 906 is a collecting electrode.

Figure 10:
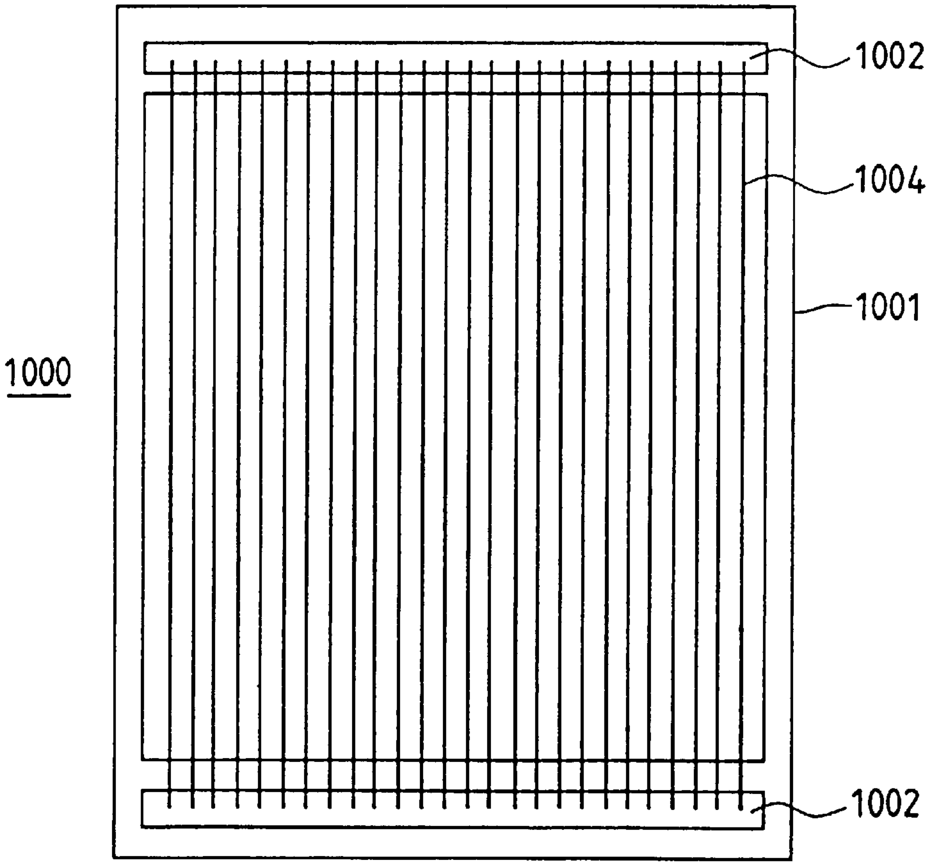
FIG. 10 is a schematic cross-sectional view illustrating the structure of a photovoltaic element using a collector electrode having a two or three layer coating, according to the present invention.

FIG. 10 is a plan view of a photovoltaic element module 1000, using a collecting electrode coated with conductive adhesive consisting of two layers (hereinafter abbreviated as: two-layer coated collecting electrode) of this invention. In FIG. 10, 1004 is the photovoltaic element substrate, 1002 is the positive electrode, and 1001 is the two-layer coated collecting electrode of this invention. Photovoltaic element substrate and 1004 is made by forming films of p, i and n type and transparent conductive layers on a stainless steel substrate, using a CVD or sputtering process. The positive electrode 1002 is an electrode which is used to output the current collected by the collecting electrode 1001 and materials suitable for this are, for example, copper or silver plated copper which offer good conductance. The negative electrode is an electrode which is used to output current from the stainless steel substrate and a material suitable for this is also copper. The two-layer coated collecting electrode 1001 has the function of collecting the current generated by the photovoltaic element substrate. The two-layer coated collecting electrode 1001 is mechanically and electrically connected to the photovoltaic element substrate and the positive electrode by means of a thermocompression process.

In terms of the method by which the metal wire is positioned as the collecting electrode on the photovoltaic element; for example, when more than one wire is to be positioned on the surface of the photovoltaic element surface, optimum efficiency can be obtained with optimization procedures, namely narrowing the pitch for thin wires and widening the pitch for thicker wires.

As for the method of adhesion, the outermost layer of the collecting electrode must not be cured during application on the wire; it should only be dried of the solvent, and heated when adhering to achieve adhesion and curing.

Production Method

One method of production of the photovoltaic element of this invention is, for example the production method described below.

It is desirable to adhere the collecting electrode to the semiconductor or the transparent electrode of the light incident side with heat and/or pressure.

The desired heating temperature is the softening point of the adhesive layer and the conductive resin of the second layer, which will form the adhesive layer. It is desirable that only the adhesive layer and the second layer be softened to make the collecting electrode adhere to the solar cell, without softening the first layer to maintain the initial film thickness. Also, if a blocked isocyanate is used as the curing agent for the conductive resin, it is desirable to apply temperatures exceeding the dissociation temperature of the isocyanate, so that curing will occur during the adhesion process.

The desirable pressure will be such that the adhesive layer and said second layer will undergo moderate deformation, but must also be lower than any pressure that will destroy the solar cell. In specific terms, 0.1 kg to 1.0 kg/cm$^2$ is suitable for solar cells with thin films, such as amorphous silicon.

If the adhesive layer and the second layer, which will form the adhesive layer, are of the hot-melt type, the desired adhesion method is to soften them and adhere them to the solar cell. Suitable pressure may be applied during adhering. If the second layer is thermoplastic, it will soften with heat. For heat curing resins, it is acceptable to dry the solvent, leaving the resins uncured during the application process to the wire for them to be heat cured during adhesion.

Also, the collecting electrode of this invention and the photovoltaic elements using the collecting electrode and their production method are entirely applicable to photovoltaic elements other than solar cells.

Curing Agents to be Included in the Conductive Adhesive

One of the problems of production is that, in order to produce coated wire electrodes off-line and to facilitate storage until the formation of electrodes, it is difficult to control accelerated hardening of the resins, after the resin has been coated and dried on the metal wire. By using a blocked isocyanate as the curing agent, only the solvent contained in the resin is dried during and after the coating drying process, and by heating it at a constant temperature, the blocked agent dissociates, allowing active isocyanate radicals to react with the resin to achieve hardening. In other words, whereas it has been very difficult to control accelerated hardening with other curing agents, such problems are solved by using a blocked isocyanate as the curing agent.

Glass Transition Point of the Conductive Adhesives

Another production related problem is, that it is convenient for handling if the metal wires are wound around a bobbin, etc. after the resin has been coated. However, the tackiness of the coated wires made it difficult to unwind them from the bobbin and in some cases where tackiness was strong, the coating would peel off. This occurs when the glass transition point of the coating layer resin is low. By using resins with glass transition points of over 0° C., the effects of tackiness reduction can be obtained, but better results are obtained when the glass transition temperature is over 100° C. Also, by mixing polymers with different glass transition points, it becomes possible to form coating layers with superior properties in terms of flexibility, adhesion, and reduced tackiness. Preferable combinations are urethane resin and phenoxy resin, etc.

Average Particle Diameter of Primary Particle of Conductive Particles

To stably obtain a coating layer with uniform film thickness and good conductivity, the dispersibility of conductive particles into the resin becomes important as well as the selection of a high polymer. Although the diameter of a conductive particle should be smaller than the thickness of the conductive coating layer, too small a diameter increases resistance at the surface of the particles where they contact each other, making it impossible to obtain the desired resistivity. When the conductive particles are dispersed into the resin, agglomerated particles exist, such as primary particles which are systematically agglomerated crystallites, secondary particles which consist of primary particles agglomerating with particles' surface charge or van der Waals force or with other forces. If the dispersibility is poor, agglomerated particles of a high order exist to cause not only nonuniform film thickness but also unstable conductivity. This invention has solved the problem by making the average diameter of primary conductive particles in the coating layer bigger than 0.02 $\mu$m and smaller than 15 $\mu$m, the sizes which prevent formation of agglomerated particles of a higher order. As the method to measure the particles' agglomerating state in dispersion and the particles' diameter (generally called 'grading'), there are the laser diffraction method, the light-particle correlation method, the light scattering method, etc.

The suitable conductive particles for the coating layer are graphite, $In_2O_3$, $SnO_2$, $TiO_2$, ITO, ZnO, and oxide semiconductor materials made from the materials by adding suitable dopants. The conductive particles and the polymer are mixed at a suitable ratio to obtain the desired resistivity. Although increased conductive particles reduce resistivity, they decrease the ratio of resin, resulting in poor stability as a coating film. Therefore, a suitable ratio should be properly selected considering what kind of high polymer and conductive particles will be used and what physical property value is desired for the film. In detail, around 5 volume percent to 95 volume percent of conductive particles give good resistivity. When the conductive particles and polymer are mixed, ordinary dispersing methods, such as a three-roll-mill or a paint shaker etc., can be used. During or after the dispersion, the conductive paint can be diluted with a suitable solvent to adjust viscosity.

Thickness of Coating Layer Composed of Conductive Adhesive

A problem during and after the formation of electrodes on a photovoltaic element is forming of pinholes which causes leakage current to defective parts, thereby reducing the characteristics of the photovoltaic element. However, this problem is solved by forming coating layers precisely and with sufficient thickness. The thickness of the coating layer varies with the diameter of the metal wire or characteristics desired. For example, when the metal wire is 100 $\mu$m in diameter, to have sufficient function as a barrier layer against leakage current, and at the same time not to cause extreme shadow loss, the suitable thickness is between 1 $\mu$m and 30 $\mu$m. Another problem is that metal wires touch the solar cell substrate to cause shunting during forming of electrodes. The solution to this problem is to form more than two coating layers, and to harden completely the innermost layer of the coating layer while coating. In this way, metal wires are prevented from direct contact with the solar cell substrate during the compression process. The problems, such as migration etc., which occur when a photovoltaic element is used outdoors, can be solved by separating functions into layers; by preparing more than two layers of coating layers to share the functions such as current collecting, shunt prevention, migration prevention, electrode fixing, etc.

Figure 2C:
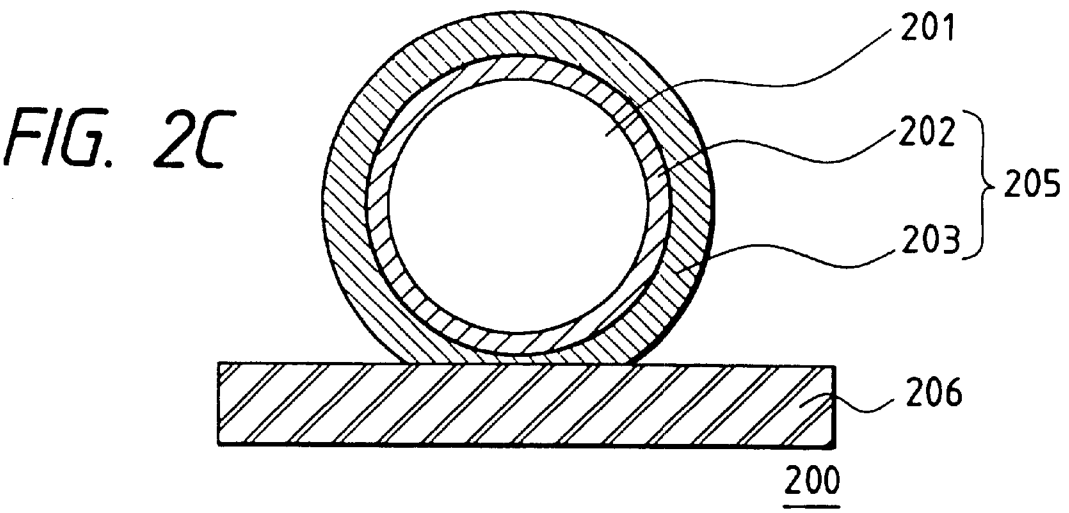

FIG. 2A shows the sectional plan of an electrode with a conductive coating layer. FIG. 2C shows the sectional plan where the electrode is fixed on a photovoltaic element substrate through the coating layer. In FIG. 2A and FIG. 2C, 201 is the metal wire, 202 is the primary coating layer which is directly coated on the metal wire, 203 is the secondary coating layer which forms the outermost layer, 205 is the composite coating layer composed of conductive adhesive, and 206 is the photovoltaic element substrate. Coating of conductive coating layers is desired to be made concentrically. As the method for coating the conductive resin on the metal wire, the ordinary spreading method of insulating coating film, the method used for enameled wire, can be suitably used. Going into detail, the conductive resin is diluted with a solvent to obtain a suitable viscosity, and then the metal wire is coated with a roll coater, etc. The coated wire is passed through a die to form a desired coating thickness, and then enters a furnace for drying of the solvent and heat curing.

Components of Photovoltaic Element

Figure 13:
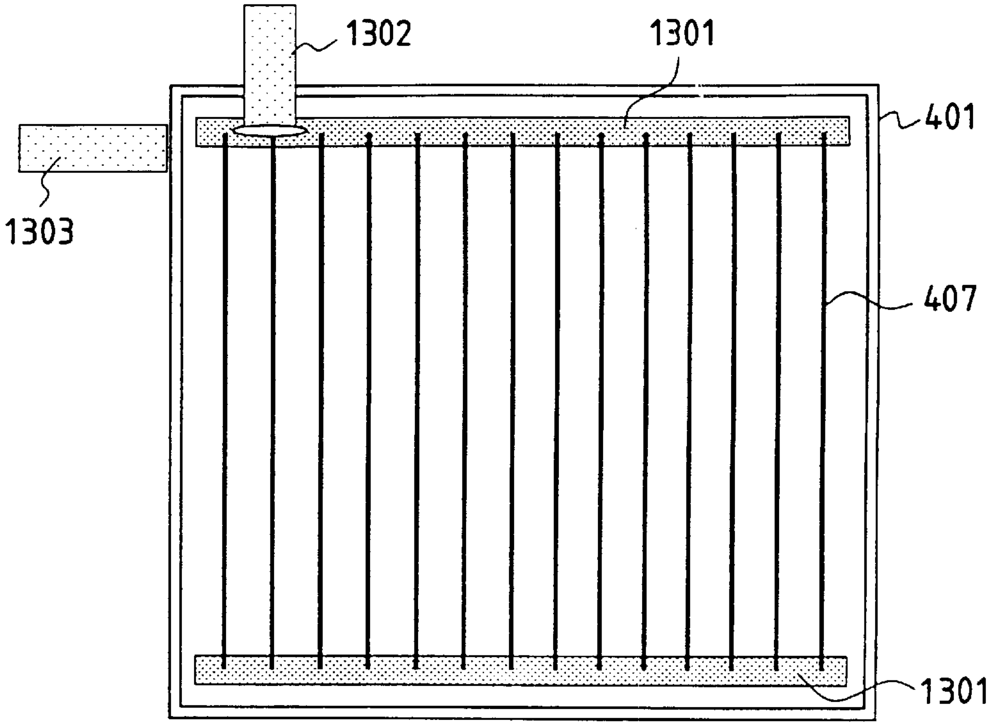
FIG. 13 is a schematic plan view illustrating the structure of another photovoltaic element using a collector electrode having a coating layer according to the present invention.

In the following section, the components of photovoltaic element will be explained, using FIG. 4A, FIG. 4C, and FIG. 13. FIG. 4A shows an amorphous silicon solar cell which has a single cell structure with the light incidence on the side opposite the substrate. FIG. 4C shows an amorphous silicon solar cell which has a triple junction structure. FIG. 13 shows the solar cells when viewed from the incident light side shown in FIGS. 4A and 4C. Grid electrodes of about 30 cm long are seen formed.

Although not illustrated the idea of the invention can be applied to amorphous silicon solar cells which are formed on a transparent insulated substrate, and also to monocrystalline and thin-film polycrystalline solar cells.

In FIG. 4A, 401 represents a separate substrate, 402 shows the lower electrode 403, 404, and 405 respectively show the p, i, and n-type semiconductor layers which form the pin-junction, 406 shows the upper electrode of transparent conductive film, and 407 shows the grid electrode using collecting electrodes.

In FIG. 4C, 403, 404, and 405 represent the semiconductor layers which form the first pin-junction, 413, 414, and 415 represent the semiconductor layers which form the second pin-junction, and 423, 424 and 425 represent the semiconductor layers which form the third pin-junction.

In FIG. 13, 1301 shows the metal buses and 1302 and 1303 are output tabs.

Substrate

The substrate 401 is a sheet which mechanically supports semiconductor layers 403, 404 and 405 which are a thin film solar cell such as non-crystalline silicon. It is also used as an electrode in some cases. The substrate 401 has a required thermal resistance to the temperature for film formation of semiconductor layers 403, 404, and 405. However, substrates having an electroconductive property and an electro insulating property can be used. As electroconductive materials, metals such as Fe, Ni, Cr, Al, Mo, Au, Nb, Ta, V, Ti, Pt, Pb, and Ti are usable. Alloys, for example, brass and stainless steel thin plate carbon sheet, and zinc plated steel plate can also be used. As electro insulating materials, films or sheets of heat resistant resins such as polyester, polyethylene, polycarbonate, cellulose acetate, polypropylene, polyvinylchloride, polyvinylidenechloride, polystyrene, polyamide, polyimide, and epoxy resin can be used. Compounds of resin and glass fiber, carbon fiber, boron fiber, metal fiber can also be used. The surface of the thin metallic plate and resin sheet, may be given a coating treatment with a metal thin film and/or insulating thin film of $SiO_2$, $Si_3N_4$, $Al_2O_3$, AlN, etc., by a sputtering, vapor deposition, or plating method. Glass and ceramics are also usable.

Lower Electrode

According to the invention, the lower electrode 402 is one of the electrodes for outputting the electric power generated by semiconductor layers 403, 404, and 405. It is required to have a work function so as to form an ohmic contact to the semiconductor layer 403. Al, Ag, Pt, Au, Ni, Ti, Mo, W, Fe, V, Cr, Cu, stainless steel, brass, nichrome, $SnO_2$, $In_2O_3$, ZnO, ITO, etc. are usable as simple metallic substances or as their alloys or as transparent conductive oxides (TCO), etc. Although the surface of the lower electrode 402 is desirably smooth, the surface can be textured to cause diffuse reflection of light. When the substrate 401 is conductive, the lower electrode 402 is not necessary.

The methods used to prepare the lower electrode are plating, deposition, sputtering, etc.

Semiconductor Layer

According to the invention, some usable semiconductor layers are amorphous silicon, polycrystalline silicon, monocrystalline silicon, etc. In an amorphous silicon solar cell, the semiconductor materials for composing i-layer 404 are; a-Si:H, a-Si:F, a-Si:H:F, a-SiGe:H, a-SiGe:F, a-SiGe:H:F, a-SiC:H, a-SiC:F, a-SiC:H:F, etc. These materials are Group IV and Group IV alloy-amorphous semiconductors. The semiconductor materials composing p-layer 405 or n-layer 403 are obtained from the semiconductor materials for the i-layer 404 by doping with valence electron control agents. As the materials for valence electron control agents to obtain p-type semiconductors, compounds of elements in group III of the periodic table are used. Elements in group III are B, Al, Ga, and In. As the valence electron control agents to obtain n-type semiconductors, compounds of elements in Group V of the periodic table are used. The elements in Group V are P, N, As, and Sb.

The methods used to form films of amorphous silicon semiconductor layers can be chosen as desired from the well known methods such as the deposition method, the sputtering method, the RF plasma CVD method, the microwave plasma CVD method, the ECR method, the thermal CVD method, the LPCVD method, etc. Industrially, the RF plasma CVD method is favorably used, in which the raw material gas is decomposed with RF plasma and accumulated on the substrate. However, the RF plasma CVD method has problems such as the low yield of the raw material gas decomposition (about 10%) and the slow deposition speed (about 0.1 nm/sec. to 1 nm/sec.). The microwave plasma CVD method is attracting attention as an improved method for avoiding these problems. As the reactor to do the film formation, well known devices, such as a batch reactor or a continuous film formation device, etc., can be used as desired. The solar cell can also be what is called a tandem or triple cell, in which more than two semiconductor layers are laminated in order to obtain better spectral sensitivity and higher voltage.

Upper Electrode

According to the invention, the upper electrode 406 is for outputting electromotive force generated by the semiconductor layers 403, 404, and 405. It forms a pair with respect to the lower electrode 402. The upper electrode 406 is necessary for semiconductors with high sheet resistivity, such as amorphous silicon. Because crystalline solar cells have low sheet resistivity, they do not necessarily need the upper electrode. The upper electrode 406 is positioned on the light incoming side and it must be transparent, thus it is called the transparent electrode. The upper electrode 406 is desired to have more than 85% transmission for effective absorption of light from the sun and daylight fluorescent lamps etc. by the semiconductor layers. Electrically, the upper electrode 406 is desired to have a sheet resistivity value of less than 100 Ω/□ to permit the generated electric current to flow horizontally to the semiconductor layers. Materials with these characteristics are the metal oxides of $SnO_2$, $In_2O_3$, ZnO, CdO, $CdSnO_4$, ITO, etc. As methods for preparing the upper electrode, there are the ohmic-resistance heating deposition method, the electron beam heating deposition method, the sputtering method, the spraying method, etc.

Grid Electrode

The grid electrode 407 consists of the metal wire 201, as shown in FIG. 2A, and the conductive coating layer 205. The conductive coating layer 205 must have a resistivity value which is low enough not to reduce the efficiency of the photovoltaic element and at the same time high enough to prevent shunting. That is, it does not act as a resistance to the electric current generated by solar cells, but functions as a resistance to prevent serious leakage when any defect is nearby. The suitable resistivity value for the conductive coating layer 205 depends on the design of the grid, and on the photovoltaic element's electric current value and the scale of the defect at its operating point. The desirable resistivity value is 0.1–100 Ωcm. When shunting occurs in this range, the resistance becomes sufficient and at the same time, the resistance is almost negligible compared to the electric current generated by the photovoltaic element. The grid electrode 407 is positioned on the light incident surface side of the photovoltaic element 400 (shown in FIG. 4A). As the grid's arrangement, a parallel arrangement with suitable intervals is recommendable. The inventive collecting electrodes are particularly suitable for forming a solar cell with large area. For example, when a solar cell of 30 $cm^2$ is fabricated, all that is needed is to install the inventive collecting electrodes of 30 cm long in parallel on the semiconductor layer with prescribed intervals. Furthermore, because the electrode is designed to reduce the current leakage caused by shunting or leakage, it is suitable for amorphous silicon solar cells. However, such structure is, of course, applicable to other types of solar cells besides amorphous silicon type; e.g. to monocrystalline or polycrystalline solar cells, or to semiconductors other than silicon, or to Shottky barrier types.

Tab

According to the invention, the tab 1302 is the collector which collects the flowing current at the grid electrode 407 at one end. As the material for the collector, metals like Cu, Ag, Pt, and alloys of these metals are usable. The desirable shapes are sheets, tapes, or foils to be adhered with adhesive agents.

Method of Forming the Collecting Electrode on the Photovoltaic Element

According to the invention, as the method of forming the collecting electrode on the photovoltaic element, the following method is illustrated.

The collecting electrodes are desired to be fixed on the light incident side of the semiconductor layer or on the surface of the transparent conductive film, using heat, pressure, or both.

The heating temperature is higher than the softening point of the outermost coating layer, which is to become the adhesive layer, and of the high polymer which forms the coating layer. When the conductive resin's hardening agent is composed of blocked isocyanates, it is desirable to keep the temperature higher than the blocked isocyanate's dissociation temperature, and then let the resin be heat cured during the adhesion process.

The pressure should be high enough to suitably transform the adhesive layer, i.e. the outermost layer of the coating layer, but should be lower than the pressure which damages the solar cell. For example, for a film-type solar cell, such as amorphous silicon, a pressure of 0.1 kg/cm$^2$ to 1.0 kg/cm$^2$ is suitable.

As the adhering method, when the adhesive layer, i.e. the outermost layer of the coating layer, is the hot-melt-type, it is desired to be adhered to the solar cell by softening with heat. While adhering, a suitable pressure can be applied.

Encapsulation

Solar cells made by the above mentioned method are modularized by well-known encapsulation in order to improve weather resistance and mechanical strength. As encapsulation material, EVA (ethylene vinyl acetate) is favorably used from the point of its adhesive property to solar cells, weather resistance, and buffer effect. In order to further improve moisture resistance and anti-scratching property, a fluorine resin is laminated thereon as a surface protecting layer. For example, tetra-fluoro ethylene copolymer (TFE, Du Pont TEFLON), copolymer of tetrafluoroethylene and ethylene (ETFE, Du Pont TEFZEL), polyvinyl fluoride (Du Pont TEDLAR), polychlorofluoroethylene (CTFEC, Daikin Industries Neoflon) are cited. Weather resistance can also be improved by adding a well-known UV absorber.

As the method for encapsulation, for example, it is desirable to use well known devices such as the vacuum laminator, for thermocompression bonding of the solar cell substrate and the resin film in a vacuum.

The following is a detailed and embodied explanation of the invention's collecting electrode and photovoltaic element with the collecting electrodes, and process for same. However, the invention shall not be limited by these embodiments.

Firstly, in Embodiments 1–40 and Comparison Examples 1–2, a detailed discussion is given of the case when the conductive adhesive is composed of conductive particles and a high polymer.

Secondly, in Embodiments 41–46 and Comparison Examples 3–4, a detailed discussion is given of the case when the coating layer is composed of at least 2 layers, and at least the conductive adhesive, which forms the outermost layer of the coating layers, is composed of heat cured but not yet hardened high polymer.

Furthermore, in Embodiments 47–55 and Comparison Examples 5–6, a detailed discussion is given of the case when the conductive adhesive contains a coupling agent.

Concerning Embodiments 1–40 and Comparison Examples 1–2, the following information is collected and shown in Tables 9–16; the formation conditions of the collecting electrode, the solar cell structure, and the evaluation results of the solar cells.

EMBODIMENT 1

In this embodiment, an explanation is given of the case when the collecting electrode is composed of Cu wire, carbon black, and urethane.

As FIG. 1A shows, the collecting electrode 100 was formed as follows: As the metal wire 101, copper wire of 100 μm in diameter was used.

The carbon paste, to form the conductive adhesive for the coating layer 102, was prepared as follows. First, a mixed solvent of 2.5 gm ethyl acetate and 2.5 gm IPA was placed in a shaker bottle for dispersion. Next, 22.0 g of urethane resin, the main ingredient, was added into the shaker bottle, and they were mixed thoroughly with a ball mill. The number average molecular weight of the urethane resin was 3000. Then, 1.1 g of blocked isocyanate, as a hardening agent, and 10 g of glass beads, for dispersion, were added to the mixture. Then, as conductive particles, 2.5 g of carbon black of 0.05 μm in average primary particle diameter was added to the mixture.

The shaker bottle containing the materials was placed in a paint shaker, of Toyo Seiki Co., for 10 hours for dispersion. Then the glass beads for dispersion were removed from the prepared paste. The average particle diameter of the paste was measured to be about 1 μm.

The result from using a beads mill instead of a paint shaker were almost the same.

The paste was hardened at 160° C. for 30 minutes, the standard hardening condition of the hardening agent. Its volume resistivity was measured to be 0.6 Ωcm, i.e. low enough for use.

The pore volume of the paste was measured by a mercury porosimeter to be 0.01 ml/g. Then, carbon black was removed from the paste and only resin was hardened to form a sheet. Its gel ratio was measured to be approximately 100%.

The coating layer 102 was formed as follows, using a vertical wire-coating machine 300 shown in FIG. 3.

First, the supply reel 301 was mounted with a spool which was wound with metal wire 302. Next, the metal wire was stretched toward the take-up reel 310. Then, the paste was poured into the coater 304.

The coating speed was 40 m/min, and the residence time was 2 seconds. The drying furnace 306 was set at 120° C. The coating was done 5 times. The die 305 used for enamel coating, was used in a variety of diameters, from 110 μm to 200 μm. Under this condition, the paste was spread with the solvent evaporated and in the unhardened state. The thickness of the coating layer 102 was 20 μm on average. Variations in the film thickness after coating were within ±0.5 μm per 100 m.

As an embodiment of this invention, an amorphous solar cell 400 was fabricated. It had the layer composition shown in FIG. 4C with triple pin-junction-type structure with grid electrodes 30 cm long.

First, an SUS 430 BA substrate 401 was thoroughly degreased and washed, then placed in a DC sputtering device (not illustrated) to deposit 450 nm of Ag followed by 1000 nm of ZnO. Thus the lower electrode 402 was formed. The substrate was taken out and placed in a microwave plasma CVD film formation device (not illustrated) to form, in order, a silicon layer as the n-layer 403, a silicon-germanium layer as the i-layer 404, and a silicon layer as the p-layer 405. Thus the bottom junction layer was formed. Then, in the same way, the middle junction layer was formed, in order, of a silicon layer as the n-layer 413, a silicon-germanium layer as the i-layer 414, and a silicon layer as the p-layer 415. The top junction layer was formed, in order, of the n-layer 423, the i-layer 424, and the p-layer 425. Thus, the active semiconductor layers were deposited. Then, the laminate was placed in a sputtering device (not illustrated) to form 70 nm of ITO as the transparent conductive film 406, which also has an anti-reflectance function. Then, the solar cell substrate 401 was trimmed to a size of 30×30 cm with an effective area of 900 $cm^2$ by removing unnecessary parts of transparent conductive film, using etching paste, whose main ingredient is ferric chloride.

Then, as seen in FIG. 8A, the anode 802 and the cathode 803, both of hard copper, were prepared. As the collecting electrode 804, the coated wire 100 was stretched between both anodes 802 at 6 mm intervals so as to be within the effective area, and then was fixed with an ultraviolet-ray hardening adhesive.

The fixed coating wire 100 was bonded by thermocompression, using a heating device (not illustrated), to form the collecting electrodes 804 on the cell surface of the solar cell substrate 401 and on the anode 802. Thus, a triple-cell of 30×30 cm, shown in FIG. 8A, was built. The heating condition was: 200° C., for 45 seconds, at a pressure of 1 $kg/cm^2$.

The encapsulation of this sample was done as follows. On the top and bottom of the solar cell, plate glass and EVA were laminated, and fluorine-contained resin film ETFE (Tefzel of Du Pont) was laminated further on the top and bottom of it. Then, the substrate was placed in a vacuum laminator and laminated at 150° C. for 60 minutes.

By the same method, 50 solar cell modules were fabricated.

The initial characteristics of the obtained samples were measured as follows. First, the voltage/current characteristics were measured in the dark state. The shunt resistivity was measured at the slope near the home position to be 200 $k\Omega cm^2$ to 500 $k\Omega cm^2$, favorable results. Next, the solar cell characteristics were measured, using a pseudo solar light source (hereafter called simulator) with a light intensity of 100 $mW/cm^2$ of AM 1.5 global sunlight spectrum. The obtained conversion efficiency was 9.6%+0.02%, showing favorable characteristics with little variation. The series resistivity was 32.0 $\Omega cm^2$ on average, also a favorable value. The yield rate of normal I-V curves was a favorable 94%.

The reliability test given to these samples was in conformity with the Japanese Industrial Standards C 8917; the environmental testing method for crystalline solar cell modules, and the hygrothermal cycle test A-2 provided by the endurance testing method.

The samples were placed in a thermo-hygrostat, which can control temperatures and humidity, and cyclic tests varying between −40° C. and +850° C. (with relative humidity 85%) were repeated 20 times. Then, the samples, which completed the cycle test, were measured for their solar cell characteristics in the same way as the initial characteristics were, using the simulator. The conversion efficiencies were 2% lower on average than the initial value, showing no significant occurrence of deterioration.

The results of this embodiment show that a solar cell, with collecting electrodes of the metal wire coated with the invented conductive adhesive, has favorable characteristics and high reliability.

Comparison Example 1

In this example, as a comparison, an explanation is given of the case when the collecting electrode consists of Cu wire with fluorine-containing resin paste containing carbon.

For comparison, the conventional collecting electrode 100 shown in FIG. 1A was formed in the same way as in Embodiment 1, with the following differences.

The paste used for the coating layer 102 of the collecting electrode 100 in FIG. 1A, was a fluorine-containing resin paste (Electrodag +502 SS of Acheson Colloid), similar to the one mentioned in the U.S. Pat. No. 4,260,429.

The wire was coated in the same way as in Embodiment 1. The thickness of the coating layer 102 was 20 μm on average, and the variation of film thickness in a 100 meter long sample was +1.0 μm after coating.

The paste was hardened at 120° C. for 5 minutes, the standard hardening condition for the hardening agent. The volume resistivity was measured to be 0.1 $\Omega cm^2$, a low enough value. The pore volume of this conductive adhesive was 0.05 ml/g. Then, as in Embodiment 1, 50 solar cell modules were built, using this wire as collection electrodes.

The initial characteristics of the obtained sample were measured by a similar method to Embodiment 1. First, the shunt resistivity was measured to be 4 $k\Omega cm^2$–300 $k\Omega cm^2$, showing a wide variation. Next, the conversion efficiency was obtained to be 9.0%±1.2%, varying widely. The series resistivity of the normal I-V curve was obtained to be 32.1 $\Omega cm^2$ on average, a favorable value. The initial yield rate of normal I-V curves was as low as 64%.

The reliability test was performed on these samples similarly to Embodiment 1. The tested samples were measured for their solar cell characteristics with simulator similarly to the initial characteristics. The result was on average 11% lower than the initial conversion efficiency, showing the occurrence of significant deterioration. The series resistivity was measured to have risen to 62 $\Omega cm^2$ on average. This indicated that the rise of the series resistivity caused the deterioration of the conversion efficiency.

It is supposed that the exterior humidity entered into the device to raise the interfacial resistivity at the contact between the adhesive of the coating layer and transparent conductive film surface.

This result showed that the solar cell using the invented collecting electrodes have a good initial yield rate and favorable reliability.

EMBODIMENT 2

In this example, an explanation is given of the case when the collecting electrode: consists of Cu wire, ITO, and butyral.

In this case, the same process was used to form collecting electrodes as in Embodiment 1, except that, for the inventive collecting electrode 100 shown in FIG. 1A, butyral resin (Slec BL-S of Sekisui Chemical Co., Ltd.) was used as the main ingredient high polymer to form a conductive adhesive, and that ITO powder (HYX of Sumitomo Metal Mining Co., Ltd.) of 0.05 μm average primary particle diameter was used as the conductive particles.

The above-described paste was hardened at a temperature of 160° C. for thirty minutes, which was the standard hardening condition of the above-described hardener and then was measured for its volume resistivity, and it was verified that its volume resistivity was low enough, 1.2 $\Omega cm^2$. Further, transmittance of light was measured using a spectroscope and its transmittance was satisfactory, 90% per 400 nm. The pore volume of this conductive adhesive agent was 0.02 ml/g and the gel ratio was 20%. The average molecular weight of the polymeric resin was fifty thousand.

Cu wire was coated as in the first embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.7%±0.05%, the shunt resistance was 250 to 300 k $\Omega cm^2$, and the series resistance was 32.5 $\Omega cm^2$ on average. The yield rate of samples for which the I-V curve was normal was satisfactory, i.e. 94%.

The reliability test of these samples was performed by the same method as in the first embodiment. Next, the solar battery characteristics of the samples after the test was finished were measured using a simulator as in the measurement of the initial values, and the measured conversion efficiencies were 2% lower on average than the initial conversion efficiency. No significant deterioration occurred.

The result of this embodiment shows that a solar battery using a collecting electrode according to the invention has excellent characteristics and high reliability.

EMBODIMENT 3

In this embodiment, the case where the collecting electrode comprises Ag wire, urethane, and $SnO_2$ will be described.

In this embodiment, a collecting electrode 100 according to the invention shown in FIG. 1A is produced as in the first embodiment except that the metal wire 101 is made of silver, and $SnO_2$ powder manufactured by Mitsui Mining and Smelting Co., Ltd. of which the average primary particle diameter is 0.2 μm is used as conductive particles for forming a coated layer 102.

The above-described paste was hardened at a temperature of 160° C. for thirty minutes, which was the standard hardening condition of the above-described hardener and then, was measured for its volume resistivity. It was verified that its volume resistivity was low enough, i.e. 1.0 $\Omega cm^2$. An Ag wire was coated as in the first embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.1%±0.06%, the shunt resistance was 250 to 400 k $\Omega cm^2$, and the series resistance was 32.9 $\Omega cm^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as in the measurement of the initial values, and the conversion efficiency was lower 2.5% on average than the initial conversion efficiency. However, no significant deterioration occurred.

The result of this embodiment shows that a solar battery using a collecting electrode according to the invention has excellent characteristics and high reliability.

EMBODIMENT 4

In this embodiment, the case where the collecting electrode comprises Au wire, polyamide, and $In_2O_3$ will be described.

In this embodiment, a collecting electrode 100 according to the invention shown in FIG. 1A is produced as in the first embodiment except that metal wire 101 is formed of gold, polyamide resin manufactured by Mitsubishi Chemical Industries Ltd. is used as a polymeric resin which mainly constitutes the paste forming the coated layer 102, and $In_2O_3$ manufactured by Sumitomo Metal Mining Co., Ltd. of which average primary particle diameter is 0.05 μm, is used as the conductive particles.

The above-described paste was hardened at a temperature of 160° C. for thirty minutes which was the standard hardening condition of the above-described hardener and then, was measured for its volume resistivity, and it was verified that its volume resistivity was low enough, 1.5 $\Omega cm^2$. The pore volume of this conductive adhesive was 0.04 l/g and the average molecular weight of polymeric resin was ten thousand.

An Au wire was coated as in the first embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.2%±0.01%, shunt resistance was 400 to 500 k$\Omega cm^2$, its series resistance was 32.3 $\Omega cm^2$ on average. The yield rate of samples for which the I-V curve was normal was satisfactory, i.e., 90%.

The reliability test of these samples was performed by the same method as in the first embodiment. Next, the solar battery characteristics of the samples after the test was finished were measured using a simulator as for the measurement of the initial values, and the conversion efficiencies were 2% lower on average than the initial conversion efficiency. However, no significant deterioration occurred.

The result of this embodiment shows that a solar battery using a collecting electrode according to the invention has excellent characteristics and high reliability.

EMBODIMENT 5

In this embodiment, the case where the collecting electrode comprises silver clad Cu wire, urethane, and carbon black will be described.

In this embodiment, a collecting electrode 100 according to the invention shown in FIG. 1B is produced as in the first embodiment except that a silver-clad copper wire 100 μm in diameter produced by forming a silver layer 103 2 μm thick on a copper wire 101 to enhance adhesion and electrical connection with a conductive adhesive is used.

Paste for forming a conductive adhesive for a coated layer 102 is produced as follows:

First, a mixed solution comprising 2.5 gm ethyl acetate and 2.5 gm IPA as a solvent is put in a shaker bottle for dispersion. Next, 22.0 gm of urethane resin as a main material is added to the above-described shaker and is sufficiently stirred with a ball mill. Next, as a hardener, 1.1 gm of a blocked isocyanate and glass beads for dispersion 10 g are added to the above-described mixture. Next, 2.5 gm carbon black of which the average primary particle diameter is 0.05 $\mu$m is added as conductive particles to the above-described mixture.

The shaker containing the above-described materials was put in a paint shaker manufactured by Toyo Precision Mechanical Equipment for ten hours. Then, the glass beads for dispersion were removed from produced paste. The average particle diameter of the paste was measured and found to be approximately 1 $\mu$m. A similar result was also obtained if a bead mill was used in place of the paint shaker.

The above-described paste was hardened at a temperature of 160° C. for thirty minutes, which was the standard hardening condition of the above-described hardener and then it was measured for its volume resistivity, and it was verified that its volume resistivity was low enough, 0.6 $\Omega cm^2$.

Next, a coated layer 102 is formed using a vertical-type wire coating machine shown in FIG. 3 as described above.

A layer 102 was coated on a silver-clad layer 103 as in the first embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.7%±0.03%, the shunt resistance was 300 to 400 k$\Omega cm^2$, and the series resistance was 31.5 $\Omega cm^2$ on average. The yield rate of samples for which the I-V curve was normal was satisfactory, i.e. 90%.

The reliability test of these samples was performed by the same method as in the first embodiment. Next, the solar battery characteristics of the samples after the test was finished were measured using a simulator as in the measurement of the initial values, and the conversion efficiency was 1.5% lower on average than the initial conversion efficiency. However, no significant deterioration occurred.

The result of this embodiment shows that a solar battery using a collecting electrode according to the invention has excellent characteristics and high reliability.

EMBODIMENT 6

In this embodiment, the case where the collecting electrode comprises silver clad Cu wire, phenoxy, and ZnO will be described.

In this embodiment, a collecting electrode 100 according to the invention shown in FIG. 1B is produced as in the fifth embodiment except that phenoxy resin manufactured by PKHH Tomoe Industries is used as the polymeric resin which mainly constitutes the paste forming the coated layer 102 and ZnO powder manufactured by Mitsui Mining and Smelting Co. Ltd. of which the average primary particle diameter is 0.1 $\mu$m is used as the conductive particles.

The above-described paste was hardened at a temperature of 160° C. for thirty minutes, which was the standard hardening condition of the above-described hardener and then, was measured for its volume resistivity, and it was verified that its volume resistivity was low enough, 1.3 $\Omega cm^2$. The pore volume of this conductive adhesive was 0.01 ml/g and the gel ratio was 100%. The average molecular weight of polymeric resin was twenty-five thousand.

An Ag-clad Cu wire was coated as in the fifth embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.6±0.02%, the shunt resistance was 310 to 390 k$\Omega cm^2$, and the series resistance was 32.4 $\Omega cm^2$ on average. The yield rate of samples for which the I-V curve was normal was satisfactory, 94%.

The reliability test of these samples was performed by the same method as in the first embodiment. Next, the solar battery characteristics of the samples after the test was finished were measured using a simulator as for measurement of the initial values, and the conversion efficiency was 2% lower on average than the initial conversion efficiency. However, no significant deterioration occurred.

The result of this embodiment shows that a solar battery using a collecting electrode according to the invention has excellent characteristics and high reliability.

EMBODIMENT 7

In this embodiment, the case where a collecting electrode comprises silver clad Cu wire, phenoxy, and ZnO+Al will be described.

In this embodiment, a collecting electrode 100 according to the invention shown in FIG. 1B is produced as in the fifth embodiment except that ZnO powder produced by adding aluminum to ZnO as a dopant so as to lower the contact resistance of the conductive particles is used.

The above-described paste was hardened at a temperature of 160° C. for thirty minutes, which was the standard hardening condition of the above-described hardener and then, was measured for its volume resistivity, and it was verified that its volume resistivity was low enough, 0.9 $\Omega cm^2$.

A silver clad Cu wire was coated as in the fifth embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.6%±0.09%, the shunt resistance was 400 to 500 k$\Omega cm^2$, the series resistance was 31.5 $\Omega cm^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as for measurement of initial values, and the conversion efficiency was 2% lower on average than the initial conversion efficiency. However, no significant deterioration occurred.

The result of this embodiment shows that a solar battery using a collecting electrode according to the invention has excellent characteristics and high reliability.

EMBODIMENT 8

In this embodiment, the case where the collecting electrode comprises silver plated Cu wire, urethane, and $TiO_2$ will be described.

In this embodiment, a collecting electrode 100 according to the invention shown in FIG. 1B is produced as in the fifth embodiment except that the metal layer 103 on a copper wire 101 is changed from clad silver according to the fifth embodiment to plated silver and $TiO_2$ manufactured by Ishihara Sangyo Kaisha, of which average primary particle diameter is 0.2 μm, is used as the conductive particles.

The above-described paste was hardened at a temperature of 160° C. for thirty minutes, which was the standard hardening condition of the above-described hardener, and then was measured for its volume resistivity, and it was verified that its volume resistivity was low enough, 1.1 $\Omega cm^2$. A silver plated Cu wire was coated as in the fifth embodiment to form a collecting electrode 100.

Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.5%±0.01%, the shunt resistance was 400 to 500 $k\Omega cm^2$, the series resistance was 31.6 $\Omega cm^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as in the measurement of the initial values, and the conversion efficiency was 2.3% lower on average than the initial conversion efficiency. However, no significant deterioration occurred.

The result of this embodiment shows that a solar battery using a collecting electrode according to the invention has excellent characteristics and high reliability.

EMBODIMENT 9

In this embodiment, the case where the collecting electrode comprises tin-plated Cu wire, polyamide, and graphite will be described.

In this embodiment, a collecting electrode 100 according to the invention shown in FIG. 1B is produced as in the fifth embodiment except that the metal layer 103 on a copper wire 101 is changed from silver clad according to the fifth embodiment to plated tin, and polyamide resin manufactured by Mitsubishi Chemical Industries Ltd. is used as the polymeric resin which mainly constitutes the paste and the conductive particles are changed to graphite manufactured by Tokai Carbon.

The above-described paste was hardened at a temperature of 180° C. for thirty minutes, which was the standard hardening condition of the above-described hardener and then, was measured for its volume resistivity, and it was verified that its volume resistivity was low enough, 2.0 $\Omega cm^2$. The pore volume of this conductive adhesive was 0.01 ml/g and the average molecular weight of the polymeric resin was twenty-five thousand.

A tin-plated Cu wire was coated as in the fifth embodiment to form a collecting electrode 100. Fifty solar battery modules were produced using the collecting electrode 100 by the same method as in the first embodiment.

The initial characteristics of the obtained samples were measured by the same method as in the first embodiment and satisfactory characteristics were obtained because the conversion efficiency was 9.3%±0.09%, the shunt resistance was 400 to 500 $k\Omega cm^2$, the series resistance was 33.6 $\Omega cm^2$ on average. The yield rate of samples for which the I-V curve was normal was satisfactory, i.e. 94%.

The reliability test of these samples was performed by the same method as in the first embodiment. Next, the solar battery characteristics of the samples after the test was finished were measured using a simulator as in the measurement of the initial values, and the conversion efficiency was 2.9% lower on average than the initial conversion efficiency. However, no significant deterioration occurred.

The result of this embodiment shows that a solar battery using a collecting electrode according to the invention has excellent characteristics and high reliability.

EMBODIMENT 10

In this embodiment, the case where the collecting electrode comprises Cu wire, silver paste, urethane, and carbon black will be described.

In this embodiment, a collecting electrode 100 according to the invention shown in FIG. 1B is produced as in the fifth embodiment except that the metallic layer 103 on a copper wire 101 is changed from clad silver according to the fifth embodiment to silver paste (5007, manufactured by Du Pont) in which silver particles are dispersed in epoxy resin.

The above-described paste was hardened at the temperature of 150° C. for thirty minutes, which was the standard hardening condition of the above-described hardener and then, was measured for its volume resistivity, and it was verified that its volume resistivity was low enough, 5×10−5 $\Omega cm^2$.

Next, a metallic layer 102 comprising the above-described silver paste which is coated on a Cu wire sequentially from the innermost layer by the same method as in the first embodiment is formed as follows:

First, a reel on which a Cu wire 302 is wound is placed on supply reel 301 and the above-described Cu wire is stretched to the take-up reel 310. Next, the above-described silver paste 5007 is injected into a coater.

The take-up speed of the Cu wire was 40 m/min., the hardening time 2 sec., the temperature of the drying furnace 306 was 200° C., and the diameter of the die used for enamel coating was 160 μm. The above-described conditions on which paste 5007 applied to the wire is hardened are determined based upon the result of experiments. The thickness of the formed metallic layer 103 was 5 μm on average and fluctuation of the thickness of layer 103 when a wire 100 m long was coated was within ±0.2 μm.

Next, a coated layer 102 comprising carbon paste/urethane resin was formed by the same method as in the fifth embodiment.

The thickness of the coated layer 102 was 20 μm on average and the fluctuation of the coating thickness of layer 102 when a wire 100 m long was coated was within ±1 μm.

Next, fifty solar battery modules using this wire as a collecting electrode which were constituted as in the first embodiment and shown in FIG. 8A were produced.

The initial characteristics of the obtained samples were measured by the same method as in the first embodiment. First, the shunt resistance was checked and a satisfactory value was obtained because the measured values were 150 to 200 $k\Omega cm^2$. Next, the characteristics of the above-described solar batteries were measured, and it was verified that such solar batteries had satisfactory characteristics which varied little because the conversion efficiency was 9.2%±0.05% and the series resistance was 31.8 $\Omega cm^2$ on average. The yield rate of samples for which the I-V curve was normal was satisfactory, i.e. 88%.

The reliability test of these samples was performed by the same method as in the first embodiment. Next, the solar battery characteristics of the samples after the test was finished were measured using a simulator as in the measurement of the initial values, and the conversion efficiency was 2.1% lower on average than the initial conversion efficiency. However, no significant deterioration occurred.

Next, a test in which low light illuminance was irradiated for 100 hours to such solar battery module under an environment where the temperature was ±85° C. and the relative humidity was 85% so as to check for the possibility of migration of silver because silver is used for a collecting electrode.

Next, the shunt resistance of such sample after the above-described test was finished was measured by the same method as in the first embodiment. As a result, the measured value was 130 to 160 k$\Omega$cm$^2$, and no significant deterioration occurred.

The result of this embodiment shows that a solar battery using a metal wire on which a conductive adhesive is coated according to the invention as a collecting electrode has excellent characteristics and high reliability.

EMBODIMENT 11

In this embodiment, an amorphous solar battery 400 is produced according to the following procedure by the same method as in the first embodiment except that it is constituted as a single junction type as shown in FIG. 4A and radio-frequency (RF) plasma CVD is used for forming the semiconductor layer.

First, a SUS430BA substrate 401 sufficiently degreased and cleaned is placed in a DC sputtering device (not shown), Ag is deposited until the film is 400 nm thick, then ZnO is deposited until the film is 400 nm thick so as to form the lower electrode 402. The substrate is taken out of the sputtering device and is placed in an RF plasma CVD film forming system (not shown), and a silicon semiconductor layer is formed in the order of n-layer 403, i-layer 404, and p-layer 405. Then, the substrate is placed in a resistance heating deposition system (not shown) and $In_2O_3$ film is formed as transparent conductive film 406 which also provided an anti-reflection effect. Next, fifty solar battery modules were produced using the above-described collecting electrode 100 by the same method as that in the first embodiment. At this time, the above-described coated wire 100 was used at intervals of 5.5 mm.

The initial characteristics of the obtained samples were measured by the same method as in the first embodiment and satisfactory characteristics were obtained because the conversion efficiency was 5.2%±0.05%, the shunt resistance was 150 to 320 k$\Omega$cm$^2$, and the series resistance was 9.5 $\Omega$cm$^2$ on average. The yield rate of samples for which the I-V curve was normal was satisfactory, i.e. 90%.

The reliability test of these samples was performed by the same method as in the first embodiment. Next, the solar battery characteristics of the samples after the test was finished were measured using a simulator as for measurement of the initial values, and the conversion efficiency was 2.4% lower on average than the initial conversion efficiency. However, no significant deterioration occurred.

The result of this embodiment shows that a solar battery using a collecting electrode according to the invention has excellent characteristics and high reliability.

EMBODIMENT 12

In this embodiment, an amorphous solar battery 400 is produced according to the following procedure by the same method as in the first embodiment except that it is constituted as a double junction type which is constituted by two active Si layers as shown in FIG. 4B and RF plasma CVD is used for forming the semiconductor layers.

First, a SUS430BA substrate 401 sufficiently degreased and cleaned is placed in a DC sputtering device (not shown), Ag is deposited until the film is 400 nm thick, and then ZnO is deposited until the film is 400 nm thick so as to form the lower electrode 402. The substrate is taken out of the sputtering device and is placed in a RF plasma CVD film forming system (not shown), and the bottom junction layer is formed in the order of n-layer 403, i-layer 404, and p-layer 405. Next, similarly, the top layer of a silicon junction layer is sequentially formed in the order of n-layer 413, i-layer 414, and p-layer 415, and as a result, a silicon semiconductor layer is deposited. Then, the substrate is placed in a resistance heating deposition system (not shown) and $In_2O_3$ film is formed as transparent conductive film 406 which also provided an anti-reflection effect.

Next, fifty solar battery modules were produced using the above-described collecting electrode 100 by the same method as in the first embodiment. At this time, the above-described coated wire 100 was used at intervals of 5.5 mm.

The initial characteristics of the obtained samples were measured by the same method as in the first embodiment and satisfactory characteristics were obtained because the conversion efficiency was 7.5%±0.01%, the shunt resistance was 400 to 500 k$\Omega$cm$^2$, the series resistance was 23.1 $\Omega$cm$^2$ on average. The yield rate of samples for which I-V curve was normal was satisfactory, i.e., 94%.

The reliability test of these samples was performed by the same method as in the first embodiment. Next, the solar battery characteristics of the samples after the test was finished were measured using a simulator as in the measurement of the initial values, and the conversion efficiency was 1.9% lower on average than the initial conversion efficiency. However, no significant deterioration occurred.

The result of this embodiment shows that a solar battery using a collecting electrode according to the invention has excellent characteristics and high reliability.

EMBODIMENT 13

In this embodiment, an amorphous solar battery 400 is produced according to the following procedure by the same method as in the first embodiment except that it is formed as a double junction type which is constituted by Si and SiGe layers shown in FIG. 4B plasma CVD is used for forming the semiconductor layers, and a silicon-germanium semiconductor layer is used for the i-layer of the bottom junction layer.

First, a SUS430BA substrate 401 sufficiently degreased and cleaned is placed in a DC sputtering device (not shown), Ag is deposited until the film is 400 nm thick, and then ZnO is deposited until the film is 400 nm thick so as to form the lower electrode 402. The substrate is taken out of the sputtering device and is placed in a microwave plasma CVD film forming system (not shown), and the bottom junction layer is formed in the order of a silicon layer for n-layer 403, a silicon-germanium layer for i-layer 404, and a silicon layer for p-layer 405. Next, the top junction layer is sequentially formed in the order of an n-layer 413, i-layer 414, and p-layer 415, and as a result, a photoactive semiconductor layer is deposited. Then, the substrate is placed in a resistance heating deposition system (not shown) and $In_2O_3$ film is formed as transparent conductive film 406 also provided with an anti-reflection effect.

Next, fifty solar battery modules were produced using the above-described collecting electrode 100 by the same method as in the first embodiment. At this time, the above-described coated wire 100 was used at intervals of 5.5 mm.

The initial characteristics of the obtained samples were measured by the same method as in the first embodiment and satisfactory characteristics were obtained because the conversion efficiency was 7.7%±0.02%, the shunt resistance was 400 to 500 k$\Omega$cm$^2$, the series resistance was 20 $\Omega$cm$^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as in the measurement of initial values, and the conversion efficiency was 2.0% lower on average than the initial conversion efficiency. However, no significant deterioration occurred.

The result of this embodiment shows that a solar battery using a collecting electrode according to the invention has excellent characteristics and high reliability.

EMBODIMENT 14

In this embodiment, an amorphous solar battery 400 is produced according to the following procedure by the same method as in the first embodiment except that it is formed as a triple junction type which is constituted by SiC, Si, and SiGe layers shown in FIG. 4C, RF plasma CVD is used for forming the semiconductor layers, and a silicon germanium semiconductor layer is used for the i-layer of the bottom junction layer.

First, a SUS430BA substrate 401 sufficiently degreased and cleaned is placed in a DC sputtering device (not shown), Ag is deposited until the film is 400 nm thick, and then ZnO is deposited until the film is 400 nm thick so as to form the lower electrode 402. The substrate is taken out of the sputtering device and is put in a microwave plasma CVD film forming system (not shown), and the bottom layer is formed in the order of a silicon layer for n layer 403, a silicon-germanium layer for i-layer 404, and a silicon layer for p-layer 405. Next, the middle junction layer is sequentially formed in the order of n layer 413, i-layer 414, and p-layer 415, and then top junction layer is formed in the order of a silicon layer for n layer 423, a silicon-carbon layer for i-layer 404, and a silicon layer for p-layer 405, and as a result, a photoactive semiconductor layer is deposited. Then, the substrate is placed in a resistance heating deposition system (not shown) and an $In_2O_3$ film is formed as transparent conductive film 406 also provided with an anti-reflection effect.

Next, fifty solar battery modules were produced using the above-described collecting electrode 100 by the same method as in the first embodiment.

The initial characteristics of the obtained sample were measured by the same method as in the first embodiment and satisfactory characteristics were obtained because the conversion efficiency was 9.5%±0.06%, the shunt resistance was 260 to 330 k$\Omega$cm$^2$, and the series resistance was 33.7 $\Omega$cm$^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as in the measurement of initial values, and the conversion efficiency was 2.4% lower on average than the initial conversion efficiency. However, no significant deterioration occurred.

The result of this embodiment shows that a solar battery using a collecting electrode according to the invention has excellent characteristics and high reliability.

EMBODIMENT 15

In this embodiment, a monocrystalline solar battery 500 is produced according to the following procedure by the same method as in the first embodiment except that it is constituted by a monocrystalline semiconductor (monocrystalline Si) shown in FIG. 5.

First, a silicon monocrystal in which the valence electrons are controlled so that it is p type is produced by the Czochralski process, the monocrystal is sliced, and a silicon wafer 501 approximately 300 $\mu$m thick is formed. Further, an $n^+$-type layer 502 is formed by a diffusion process by applying $P_2O_5$ on the above-described wafer. Next, silver paste is printed on the rear side of p-type wafer 501 by a screen printing machine (not shown), heated and baked, and as a result, the lower electrode 503 is formed. Next, the above-described collecting electrode 100 (504) used in the first embodiment is formed on $n^+$-type layer 502 on the light incident face by the above-described method. Then, an $SiO_2$ film 505 is formed as an anti-reflection film by a sputtering process. Next, fifty solar battery modules as shown in FIG. 8B were produced by the same method as in the first embodiment. At this time, the above-described coated wire 100 was used at intervals of 8.5 mm.

The initial characteristics of the obtained samples were measured by the same method as in the first embodiment and satisfactory characteristics were obtained because the conversion efficiency was 15.8%±0.09%, the shunt resistance was 500 to 760 k$\Omega$cm$^2$, and the series resistance was 2.8 $\Omega$cm$^2$ on average. The yield rate of samples for which the I-V curve was normal was satisfactory, i.e. 98%.

The reliability test of these samples was performed by the same method as in the first embodiment. Next, the solar battery characteristics of the samples after the test was finished were measured using a simulator as in the measurement of initial values, and the conversion efficiency was 1.9% lower on average than the initial conversion efficiency. However, no significant deterioration occurred.

The result of this embodiment shows that a solar battery using a collecting electrode according to the invention has excellent characteristics and high reliability.

EMBODIMENT 16

In this embodiment, a polycrystalline solar battery 600 is produced according to the following procedure by the same method as in the first embodiment except that it is constituted by a polycrystalline semiconductor (polycrystalline Si) shown in FIG. 6.

First, a polycrystalline ingot is produced by a casting process, the ingot is sliced, and $n^+$-type wafer 601 is formed from the obtained polycrystalline silicon wafer by a diffusion process by applying $P_2O_5$ on the above-described wafer. Next, silver paste is printed on the rear side of p-type wafer 601 by a screen printing machine (not shown), heated and baked, and as a result, the lower electrode 603 is formed. Next, the above-described collecting electrode 100 (604) used in the first embodiment is formed on $n^+$-type layer 601 on the side of the light incident face by the above-described method. Then, an $SiO_2$ film 605 is formed as an anti-reflection film by a sputtering process. Next, fifty solar battery modules as shown in FIG. 8B were produced by the same method as in the first embodiment. At this time, the above-described coated wire 100 was used at intervals of 8 mm.

The initial characteristics of the obtained sample were measured by the same method as in the first embodiment and satisfactory characteristics were obtained because the conversion efficiency was 13.8%±0.01%, the shunt resistance was 450 to 650 kΩcm$^2$, and the series resistance was 2.6 Ωcm$^2$ on average. The yield rate of samples for which the I-V curve was normal was satisfactory, i.e. 94%.

The reliability test of these samples was performed by the same method as in the first embodiment. Next, the solar battery characteristics of the samples after the test was finished were measured using a simulator as in the measurement of initial values, and the conversion efficiency was 2% lower on average than the initial conversion efficiency. However, no significant deterioration occurred.

The result of this embodiment shows that a solar battery using a collecting electrode according to the invention has excellent characteristics and high reliability.

EMBODIMENT 17

In this embodiment, a thin-film polycrystalline solar battery 700 is produced according to the following procedure by the same method as in the first embodiment except that it is constituted by a thin-film polycrystalline semiconductor (thin-film polycrystalline Si) shown in FIG. 7.

First, a metallic substrate 701 sufficiently degreased and cleaned is placed in a microwave plasma CVD film forming system (not shown) so as to form n layer 702. Next, the coated substrate was placed in a heating furnace (not shown) so as to polycrystallize n layer 702. Then, the substrate was placed in a microwave plasma CVD film forming system (not shown) so as to form p-layer 703. Further, the substrate was placed in a sputtering device (not shown) and an ITO film is formed as a transparent conductive film 704 provided also with an anti-reflection effect. Next, a collecting electrode 705 was formed on the above-described transparent conductive film 704 by the same method as in the first embodiment and fifty solar battery modules shown in FIG. 8B were produced.

The initial characteristics of the obtained samples were measured by the same method as in the first embodiment and satisfactory characteristics were obtained because the conversion efficiency was 12.5%±0.01%, the shunt resistance was 400 to 510 kΩcm$^2$, and the series resistance was 20 Ωcm$^2$ on average. The yield rate of samples for which the I-V curve was normal was satisfactory, i.e. 92%.

The reliability test of these samples was performed by the same method as in the first embodiment. Next, the solar battery characteristics of the samples after the test was finished were measured using a simulator as in the measurement of initial values, and the conversion efficiency was 2.1% lower on average than the initial conversion efficiency. However, no significant deterioration occurred.

The result of this embodiment shows that a solar battery using a collecting electrode according to the invention has excellent characteristics and high reliability.

EMBODIMENT 18

This embodiment is different from the first embodiment in that the resistivity of a conductive adhesive was varied within the range of 0.005 to 200 Ωcm. For varying the resistivity of the conductive adhesive, the mixing ratio (in weight) of polymeric resin and the conductive particles in the conductive coating material was varied to any of 5:95, 10:90, 20:80, 80:20, 90:10, 95:5.

Otherwise, this embodiment is similar to the first embodiment.

Ten triple junction cells shown in FIG. 4C were produced according to the same procedure as in the first embodiment except that the above conductive adhesives were used and similarly evaluated. Table 1 shows the results.

TABLE 1

| Resistivity (Ω cm) | 0.005 | 0.01 | 1 | 100 | 200 |
|---|---|---|---|---|---|
| Initial status | | | | | |
| Conversion efficiency (%) | 8.2 | 9.6 | 9.6 | 9.4 | 8.5 |
| Series resistance (Ω cm2) | 31.4 | 31.4 | 31.8 | 32.3 | 39.8 |
| Shunt resistance (kΩ cm$^2$) | 4.9 | 25.9 | 250 | 320 | 350 |
| Status after reliability | | | | | |
| Conversion efficiency (%) | 7.2 | 9.5 | 9.5 | 9.3 | 7.3 |
| Series resistance (Ω cm$^2$) | 31.3 | 31.6 | 31.9 | 32.6 | 50.3 |
| Shunt resistance (kΩ cm$^2$) | 2.3 | 25.9 | 251 | 325 | 350 |

Table 1 shows that initial shunting can be controlled by setting the resistivity of coated layer 102 to 0.01 Ω or more and that more stable conversion efficiency can thereby be obtained. Table 1 also shows that series resistance can be reduced by setting the resistivity to 100 Ωcm or less and that higher conversion efficiency can thereby be obtained. Table 1 further shows that the increase of series resistance and lowering of conversion efficiency after the reliability test can be reduced and a solar battery using a collecting electrode according to the invention has high reliability.

EMBODIMENT 19

This embodiment is different from the first embodiment in that the pressure-bonding temperature of the conductive adhesive is varied in the range of 50 to 300° C. Pressure-bonding of the collecting electrode 100 was performed at four different temperatures of 100, 160, 200, and 250° C. The blocked isocyanate that was used is similar to that in the first embodiment and its dissociation temperature is 150° C.

In all other ways this embodiment is similar to the first embodiment.

Ten triple junction cells shown in FIG. 4C were produced and similarly evaluated according to the same procedure as in the first embodiment except that the pressure-bonding temperature was varied. Table 2 shows the results.

TABLE 2

| Pressure-bonding temperature (° C.) | 100 | 160 | 200 | 250 |
|---|---|---|---|---|
| Initial Status | | | | |
| conversion efficiency (%) | 6.3 | 9.0 | 9.6 | 9.6 |
| Series resistance (Ω cm$^2$) | 51.3 | 31.4 | 31.3 | 31.2 |
| Shunt resistance (kΩ cm$^2$) | 57.3 | 253 | 352 | 390 |
| Status after reliability test | | | | |
| conversion efficiency (%) | 3.1 | 8.7 | 9.6 | 9.6 |
| Series | 121 | 36.5 | 31.3 | 31.2 |

TABLE 2-continued

| Pressure-bonding temperature (° C.) | 100 | 160 | 200 | 250 |
|---|---|---|---|---|
| resistance (Ω cm$^2$) | | | | |
| Shunt resistance (KΩ cm$^2$) | 56.8 | 254 | 356 | 389 |

Table 2 shows that series resistance can be reduced by setting the pressure-bonding temperature at the dissociation temperature or higher of the coated layer resin and that higher conversion efficiency can thereby be obtained. Table 2 also shows that the increase of series resistance after the reliability test and lowering of conversion efficiency can be reduced and a solar battery using a collecting electrode according to the invention has high reliability.

EMBODIMENT 20

This embodiment is different from the first embodiment in that the pressure-bonding time of the conductive adhesive is varied in the range from 10 to 60 seconds. For pressure-bonding of a collecting electrode 100, four different times of 10, 20, 45, and 60 seconds were set. To check the hardening factor of the conductive adhesive under such conditions, the amount eluted into a solvent before and after immersion was measured and as a result, the gel ratio was 5%, 15%, 80% and 100%, respectively. The blocked isocyanate used was similar to that in the first embodiment and its dissociation temperature was 150° C.

In all other ways this embodiment is similar to the first embodiment.

Ten triple junction cells shown in FIG. 4C were produced and similarly evaluated according to the same procedure as in the first embodiment except that for the pressure-bonding temperature, the above described temperature was employed. Table 3 shows the result.

TABLE 3

| Pressure Bonding time (sec.) | 10 | 20 | 45 | 60 |
|---|---|---|---|---|
| Initial Status | | | | |
| conversion efficiency (%) | 6.9 | 8.5 | 9.5 | 9.6 |
| Series resistance (Ω cm$^2$) | 43.5 | 36.2 | 31.4 | 31.2 |
| Shunt resistance (kΩ cm$^2$) | 25.1 | 96.3 | 369 | 312 |
| Status after reliability test | | | | |
| conversion efficiency (%) | 5.2 | 8.0 | 9.5 | 9.6 |
| Series resistance (Ω cm$^2$) | 58.3 | 40.2 | 31.5 | 31.3 |
| Shunt resistance (Ω cm$^2$) | 14.2 | 172 | 264 | 315 |

Table 3 shows that the series resistance can be reduced and higher conversion efficiency can be obtained by adjusting the pressure-bonding, time and setting the gel ratio of the coated resin layer to 20% or more. Table 3 also shows that the increase of series resistance after the reliability test and lowering of conversion efficiency can be reduced and a solar battery using a collecting electrode according to the invention has high reliability.

EMBODIMENT 21

In this embodiment, the amount of hardener incorporated in the conductive adhesive was varied. The ratio (in weight) of urethane resin mainly used for the coating layer of the collecting electrode 100 to the blocked isocyanate used as a hardener was changed to 100:1, 50:1, 20:1, and 10:1. The respective gel ratios of the conductive adhesive were 5%, 15%, 85%, and 100%. The blocked isocyanate was similar to that used in the first embodiment and its dissociation temperature was 150° C.

In all other ways this embodiment is similar to the first embodiment.

Ten triple junction cells shown in FIG. 4C were produced and evaluated according to the same procedure as in the first embodiment. Table 4 shows the results.

TABLE 4

| Ratio of resin/hardener | 100:1 | 50:1 | 20:1 | 10:1 |
|---|---|---|---|---|
| Initial Status | | | | |
| conversion efficiency (%) | 7.8 | 8.7 | 9.7 | 9.6 |
| Series resistance (Ω cm$^2$) | 39.9 | 33.8 | 31.0 | 31.7 |
| Shunt resistance (kΩ cm$^2$) | 15.3 | 165 | 369 | 374 |
| Status after reliability test | | | | |
| conversion efficiency (%) | 6.1 | 8.4 | 9.7 | 9.6 |
| Series resistance (Ω cm$^2$) | 51.2 | 38.9 | 31.1 | 31.9 |
| Shunt resistance (kΩ cm$^2$) | 14.2 | 172 | 368 | 372 |

Table 4 shows that the series resistance can be reduced and higher conversion efficiency obtained by adjusting the amount of hardener and setting the gel ratio of the coated resin layer to 20% or more. Table 4 also shows that the increase of series resistance and lowering of conversion efficiency after the reliability test can be reduced and a solar battery using a collecting electrode according to the invention has high reliability.

EMBODIMENT 22

Referring to this embodiment, the case where the collecting electrode comprises Cu wire, carbon black, and urethane will be described.

In this embodiment, a collecting electrode 200 according to the invention shown in FIG. 2A is produced according to the following procedure.

For metal wire 201, a copper wire 100 μm in diameter is used.

Carbon paste No. 1 for forming a conductive adhesive for the first layer 202 is produced according to the following procedure. First, a mixed solution comprising 2.5 gm BCA and 2.5 gm xylene as a solvent is put in a shaker bottle for dispersion. Next, 22.0 gm of urethane resin as a main material is added to the above-described shaker and sufficiently stirred with a ball mill. Next, as a hardener, 1.1 gm of blocked isocyanate and glass beads for dispersion 10 g are added to the above-described solution.

Next, 2.5 gms of carbon black of which the average primary particle diameter is 0.05 μm was added to the above-described solution as conductive particles.

The shaker in which the above-described materials are contained is placed in a paint shaker manufactured by Toyo Precision Mechanical Equipment for ten hours. Then, the glass beads for dispersion are removed from produced paste.

The average particle diameter of the paste was measured and the measured value was approximately 1 μm. A similar result was also obtained if a bead mill was used in place of the paint shaker.

The above-described paste No. 1 was hardened at a temperature of 160° C. for thirty minutes, which was the standard hardening condition of the above-described hardener and then its volume resistivity was measured. It was verified that its volume resistivity was low enough, i.e. 1.0 $\Omega cm^2$. The pore volume of this conductive adhesive was 0.01 ml/g and the gel ratio was 100%. The average molecular weight of the polymeric resin was one thousand.

Next, carbon paste No. 2 for forming a conductive adhesive as the second layer 203 is produced according to the following procedure. First, for a solvent, cyclohexanone 2.5 g is placed in a shaker bottle for dispersion.

Next, 2.2 gms of urethane resin as a main material and 2.0 gms of phenoxy resin are added to the above-described shaker and are sufficiently stirred with a ball mill. Next, as a hardener, 1.1 gms of blocked isocyanate and 10 gms of glass beads for dispersion are added to the above-described solution. Next, 2.5 gms of carbon black of which the average primary particle diameter is 0.05 μm is added as conductive particles to the above-described solution. This is dispersed by the same method as in the case of paste No. 1.

The above-described paste No. 2 was hardened at a temperature of 160° C. for thirty minutes, which is the standard hardening condition of the above-described hardener, and then the volume resistivity was measured. It was verified that it was low enough, i.e. 0.5 Ωcm.

Next, the first layer 202 and the second layer 203 are sequentially formed in the order described above using a vertical type wire coater 300 shown in FIG. 3 as follows:

First, a reel on which a metal wire 302 was wound is mounted on supply reel 301 and the above-described metal wire was stretched to take-up reel 310. Next, the above-described paste No. 1 was injected into a coater 304.

The take-up speed of the metal wire was 40 m/min., the residence time was 2 sec., the temperature of the drying furnace 306 was 350° C., and the metal wire was coated five times. A die 305 for enamel coating of 110 to 200 μm in diameter was sequentially used. Paste No. 1 was sufficiently hardened under the above-described conditions, and adhesion and solvent resistance of the paste were satisfactory. The thickness of the first layer 202 was 5 μm on average and fluctuation of the thickness of film when a wire 100 m long was coated was within ±1 μm.

Next, the second layer 203 comprising paste No. 2 was formed by the same method as described above except as described below.

A reel 310 on which the wire on which the above-described first layer 202 was coated is wound was placed on a supply reel 301 and the above-described wire was stretched to take-up reel 310. Next, the above-described carbon paste No. 2 was injected into the coater 304.

The take-up speed of the wire was 40 m/min., the drying time was 2 sec., the temperature of the drying furnace 306 was 120° C. and the wire was coated five times. A die 305 for enamel coating of 150 to 200 μm in diameter was used. Paste No. 2 applied to the above-described wire was in an unhardened condition in which its solvent was volatilized. The thickness of the second layer 203 was 20 μm on average and fluctuation of the coating thickness when a wire 100 m long was coated was within ±0.5 μm.

Next, in an embodiment according to the invention, a triple pin-junction amorphous solar battery 400 with a layer constitution shown in FIG. 4C provided with a grid electrode 30 cm in grid length was produced.

First, a SUS430BA substrate 401 sufficiently degreased and cleaned was placed in a DC sputtering device (not shown), Ag was deposited until the film was 400 nm thick, then ZnO was deposited until the film was 400 nm thick so as to form the lower electrode 402. The substrate was removed from the sputtering device and placed in a microwave plasma CVD film forming system (not shown), and the bottom junction layer was formed in the order of a silicon layer for n layer 403, a silicon-germanium layer for i-layer 404, and a silicon layer for p-layer 405. Next, the middle junction layer was sequentially formed in the order of a silicon layer for n layer 413, a silicon-germanium layer for i-layer 414, and a silicon layer for p-layer 415. Further, the top junction layer was formed in the order of n layer 423, i-layer 424, and p-layer, and as a result, a photoactive semiconductor laminate was deposited. Then, the semiconductor laminate was placed in a resistance heating deposition system (not shown) and an ITO film was formed as a transparent conductive film 406 provided also with an anti-reflection effect.

Next, unnecessary transparent conductive film portions were removed using an etching paste which mainly comprised ferric chloride and a printing machine so that the resulting solar battery 400 was 30×30 cm in size and the effective area of the cell was 900 $cm^2$.

Next, hard copper positive electrodes 802 and a negative electrode 803 were provided outside the effective area, and as a collecting electrode 804, the above-described coated wire 100 is stretched between the positive electrodes 802 at intervals of 7 mm so that the wire is contained in the effective area and is fixed using an ultraviolet hardening adhesive.

Next, the above-described collecting electrode 804 is heated and crimped using a heater (not shown) so as to adhere the collecting electrode on front face of the solar battery and as a result, a triple junction cell 30×30 in size shown in FIG. 8A was produced. The collecting electrode was heated at a temperature of 200° C. for 45 seconds under a pressure of 1 $kg/cm^2$.

Next, the cell was encapsulated according to the following procedure. Kroehnkite glass and EVA are laminated on the front and rear surfaces of the solar battery, fluororesin film (ETFE) was laminated on the front and rear surfaces, and the battery was placed in a vacuum laminator and left at a temperature of 150° C. for an hour for lamination.

Fifty solar battery modules were produced by the above method.

The initial characteristics of the obtained samples were measured according to the following procedure. First, the I-V characteristic of the samples was measured in the dark state, the shunt resistance from the slope in the vicinity of the origin was 200 to 500 $k\Omega cm^2$, a satisfactory value. Next, the solar battery characteristics were measured using a pseudo solar light source (hereinafter called a simulator) with a solar spectrum of AM 1.5 global and light intensity of 100 $mW/cm^2$. The conversion efficiency was satisfactory and there was little dispersion, i.e. the measured value was 9.6%±0.02%. The series resistance was 32.0 $\Omega cm^2$ on average and thus satisfactory. The yield rate of samples for which the I-V curve was normal was 98% and thus satisfactory.

The reliability test of these samples was performed by the same method as in the first embodiment. Next, the solar battery characteristics of the samples after the test was finished were measured using a simulator as in the measurement of the initial values, and the conversion efficiency was 2% lower on average than the initial conversion efficiency. However, no significant deterioration occurred.

Further, to check the moisture resistance and leakage factor of these samples, a reliability test was performed as follows: First, a sample was placed in a constant temperature and humidity oven with a window through which light could be transmitted, and was left at a temperature of ±85° C. and relative humidity of 85%. When the temperature and humidity in it were sufficiently balanced, light of 100 mW/cm$^2$ intensity with a solar spectrum of AM 1.5 global was irradiated by a simulator installed outside the window.

Next, the solar battery characteristics of the samples after the reliability test was finished were measured using a simulator as in the measurement of initial values and the conversion efficiencies were 2% lower on average than the initial conversion efficiencies. However, no significant deterioration occurred.

The result of this embodiment shows that a solar battery using a metal wire on which a conductive adhesive according to the invention is coated as a collecting electrode has excellent characteristics and high reliability.

Comparative Embodiment 2

In this comparative embodiment, the case where the collecting electrode comprises Cu wire, Ag, and polyester will be described.

For comparison, paste 5007 including silver particles (manufactured by Du Pont) was coated on a Cu wire to form a collecting electrode 100. The pore volume of this conductive adhesive was 0.1 ml/g. Fifty solar battery modules were produced using the collecting electrode 100 by the same method as in the first embodiment.

The initial characteristics of the obtained samples were measured. The conversion efficiency was 7.5%±1.8%, and the fluctuation of the values was large. The shunt resistance was 1.8 kΩcm$^2$ on average and fluctuation of the values was large. The series resistance was 32.0 Ωcm$^2$ on average. The yield rate of samples for which the I-V curve was normal was low, i.e. 54%.

Samples for which the shunt resistance was normal were selected and a reliability test of moisture resistance and leakage was performed by the same method as in the twenty-second embodiment. Next, the solar battery characteristics of the sample after the test was finished were measured using a simulator as in the measurement of initial values. Its conversion efficiency was 20% lower than its initial conversion efficiency and its shunt resistance was less than one half of its initial shunt resistance value.

EMBODIMENT 23

In this embodiment, a case where the collecting electrode comprises Cu wire, carbon black, and epoxy, and carbon black and butyryl will be described.

This embodiment is similar to the twenty-second embodiment except that epoxy resin (manufactured by Epicoat Petrochemical Shell Epoxy) is used as the polymeric resin which mainly constitutes paste No. 1 for forming a conductive adhesive for a collecting electrode 200 shown in FIG. 2A according to the invention, and butyryl resin (manufactured by Eslec BL-S Sekisui Chemical) is used as the polymeric resin which mainly constitutes paste No. 2.

The pore volume of this paste No. 1 was 0.01 ml/g and the gel ratio was 100%. The average molecular weight of the polymeric resin was one thousand.

The above-described paste No. 1 was hardened at a temperature of 160° C. for thirty minutes, which were the standard hardening conditions of the above-described hardener. Then its volume resistivity was measured, and it was verified that its volume resistivity was low enough, i.e. 2.1 Ωcm.

Wire was coated as in the twenty-second embodiment to form a collecting electrode 200. Fifty solar battery modules were produced using the collecting electrode 200 by the same method as in the twenty-second embodiment.

The initial characteristics of the obtained samples were measured by the same method as in the first embodiment. The conversion efficiency was 9.4%±0.06%, the shunt resistance was 400 to 500 kΩcm$^2$, the series resistance was 32.2 Ωcm$^2$ on average, and satisfactory characteristics were obtained. The yield rate of samples for which the I-V curve was normal was 96% and satisfactory. A reliability test of these samples was performed as in the twenty-second embodiment. Next, the solar battery characteristics of samples after the test was finished were measured using a simulator as in the measurement of the initial values, and the conversion efficiency was 2.6% lower on average than the initial conversion efficiency. However, no significant deterioration occurred.

The result of this embodiment shows that a solar battery using a collecting electrode according to the invention has satisfactory characteristics and high reliability.

EMBODIMENT 24

In this embodiment, the case where the collecting electrode comprises Ag wire, carbon black and urethane, and ITO and urethane will be described.

This embodiment is similar to the twenty-second embodiment except that a silver wire is used as a metal wire 201 for a collecting electrode 200 shown in FIG. 2A according to the invention, and ITO powder (manufactured by HYX Sumitomo Metal Mining) of which the average primary particle diameter is 0.05 $\mu$m is used as the conductive particles of paste No. 2 for forming a conductive adhesive.

The above-described paste No. 2 was hardened at a temperature of 160° C. for thirty minutes, which were the standard hardening conditions of the above-described hardener. Then its volume resistivity was measured, and it was verified that its volume resistivity was low enough, i.e., 1.0 Ωcm.

Wire was coated as in the twenty-second embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.5%±0.07%, the shunt resistance was 300 to 500 kΩcm$^2$, the series resistance was 32.5 Ωcm$^2$ on average, and satisfactory characteristics were obtained. The yield rate of samples for which the I-V curve was normal was 94% and satisfactory.

A reliability test of these samples was performed as in the twenty-second embodiment. Next, the solar battery characteristics of samples after the test was finished were measured using a simulator as in the measurement of initial values, and its conversion efficiency was 2.3% lower on average than the initial conversion efficiency. However, no significant deterioration occurred.

The result of this embodiment shows that a solar battery using a collecting electrode according to the invention has satisfactory characteristics and high reliability.

EMBODIMENT 25

In this embodiment, the case where a collecting electrode comprises Ag wire, graphite and urethane, and $SnO_2$ and urethane will be described.

This embodiment is similar to the twenty-second embodiment except that a gold wire is used as a metal wire 201 for a collecting electrode 200 shown in FIG. 2A according to the invention, graphite powder (manufactured by Tokai Carbon) of which the average primary particle diameter is 0.05 μm is used as the conductive particles of paste No. 1 for forming a conductive adhesive, and $SnO^2$ powder (manufactured by Mitsui Mining and Smelting Co., Ltd.) of which the average primary particle diameter is 0.2 μm is used as the conductive particles of paste No. 2.

The above-described paste No. 1 was hardened at a temperature of 180° C. for thirty minutes, which were the standard hardening conditions of the above-described hardener. Then its volume resistivity was measured, and it was verified that its volume resistivity was low enough, i.e. 1.8 Ωcm.

The above-described paste No. 2 was hardened at a temperature of 160° C. for thirty minutes, which were the standard hardening conditions of the above-described hardener. Then its volume resistivity was measured, and it was verified that its volume resistivity was low enough, i.e. 1.4 Ωcm.

Wire was coated as in the first embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.3%±0.01%, the shunt resistance was 230 to 420 kΩ$cm^2$, its series resistance was 33.0 kΩ$cm^2$ on average, and satisfactory characteristics were obtained. The yield rate of samples for which the I-V curve was normal was 96% and satisfactory.

A reliability test of these samples was performed as in the twenty-second embodiment. Next, the solar battery characteristics of samples after the test was finished were measured using a simulator as in the measurement of initial values, and the conversion efficiency was 2.1% lower on average than the initial conversion efficiency. However, no significant deterioration occurred.

The result of this embodiment shows that a solar battery using a collecting electrode according to the invention has satisfactory characteristics and high reliability.

EMBODIMENT 26

In this embodiment, the case where a collecting electrode comprises Cu wire, silver clad, carbon black, and urethane will be described.

This embodiment is similar to the twenty-second embodiment except that a silver clad copper wire 100 μm in diameter produced by forming a clad silver layer 202 having a thickness of 2 μm on a copper wire 201 is used for a collecting electrode 200 according to the invention shown in FIG. 2A so as to enhance adhesion to a conductive adhesive and conductivity. Wire was coated as in the first embodiment to form a collecting electrode 200. Further, fifty solar battery modules were produced using the collecting electrode 100 by the same method as in the twenty-second embodiment.

The initial characteristics of the obtained samples were measured by the same method as in the twenty-second embodiment. The conversion efficiency was 9.7%±0.02%, the shunt resistance was 400 to 500 kΩ$cm^2$, the series resistance was 31.8 Ω$cm^2$ on average, and satisfactory characteristics were obtained. The yield rate of samples for which the I-V curve was normal was 98% and satisfactory.

A reliability test of these samples was performed as in the twenty-second embodiment. Next, the solar battery characteristics of samples after the test was finished were measured using a simulator as in the measurement of initial values, and the conversion efficiency was 2% lower on average than its initial conversion efficiency. However, no significant deterioration occurred.

The result of this embodiment shows that a solar battery using a collecting electrode according to the invention has satisfactory characteristics and high reliability.

EMBODIMENT 27

In this embodiment, the case where the collecting electrode comprises Cu wire, silver clad, ZnO and urethane, and $In_2O_3$ and urethane will be described.

This embodiment is similar to the twenty-second embodiment except that for a collecting electrode 200 shown in FIG. 2A, a silver clad copper wire is used, ZnO powder (manufactured by Mitsui Mining and Smelting Co., Ltd.) of which the average primary particle diameter is 0.1 μm is used as the conductive particles of paste No. 1 for forming a conductive adhesive, and $In_2O_3$ powder (manufactured by Sumitomo Metal Mining Co., Ltd.) of which the average primary particle diameter is 0.05 μm is used as the conductive particles of paste No. 2.

The above-described paste No. 1 was hardened at a temperature of 160° C. for thirty minutes, which were the standard hardening conditions of the above-described hardener. Then its volume resistivity was measured, and it was verified that its volume resistivity was low enough, 1.4 Ωcm.

The above-described paste No. 2 was hardened at a temperature of 160° C. for thirty minutes, which were the standard hardening conditions of the above-described hardener. Then its volume resistivity was measured, and it was verified that its volume resistivity was low enough, i.e. 0.7 Ωcm.

Wire was coated as in the twenty-second embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.6%±0.03%, the shunt resistance: was 320 to 390 kΩ$cm^2$, the series resistance was 32.1 Ω$cm^2$ on average, and satisfactory characteristics were obtained. The yield rate of samples for which the I-V curve was normal was 96% and satisfactory.

A reliability test of these samples was performed as in the twenty-second embodiment. Next, the solar battery characteristics of samples after the test was finished were measured using a simulator as in the measurement of initial values, and the conversion efficiency was 2% lower on average than the initial conversion efficiency. However, no significant deterioration occurred.

The result of this embodiment shows that solar battery using a collecting electrode according to the invention has satisfactory characteristics and high reliability.

EMBODIMENT 28

Referring to this embodiment, the case where the collecting electrode comprises Cu wire, silver plating, carbon black and phenol, and carbon black and polyamide will be described.

This embodiment is similar to the twenty-second embodiment except that for a collecting electrode 200 shown in FIG. 2B, a silver-plated wire 100 μm in diameter produced by plating copper with silver is used as a metallic layer 204, phenol resin (manufactured by Dainippon Chemicals, Inc.) is used as the main material for the polymeric resin of paste No. 1 for forming a conductive adhesive, and polyamide resin (manufactured by Mitsubishi Kasei Corporation) is used as the main material for the polymeric resin of paste No. 2. The pore volume of this paste No. 1 was 0.01 ml/g and the gel ratio was 100%. The average molecular weight of the polymeric resin was one thousand.

The above-described paste No. 1 was hardened at a temperature of 160° C. for thirty minutes, which were the standard hardening conditions of the above-described hardener. Then its volume resistivity was measured, and it was verified that its volume resistivity was low enough, i.e. 1.5 Ωcm.

The above-described paste No. 2 was hardened at a temperature of 160° C. for thirty minutes, which were the standard hardening conditions of the above-described hardener. Then its volume resistivity was measured, and it was verified that its volume resistivity was low enough, i.e. 0.8 Ωcm.

Wire was coated as in the first embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.3%±0.01%, the shunt resistance was 400 to 500 kΩ$cm^2$, the series resistance was 32.7 Ω$cm^2$, on average, and satisfactory characteristics were obtained. The yield rate of samples for which the I-V curve was normal was 96% and satisfactory.

A reliability test of these samples was performed as in the twenty-second embodiment. Next, the solar battery characteristics of samples after the test was finished were measured using a simulator as in the measurement of initial values, and the conversion efficiency was 2.8% lower on average than the initial conversion efficiency. However, no significant deterioration occurred.

The result of this embodiment shows that a solar battery using a collecting electrode according to the invention has satisfactory characteristics and high reliability.

EMBODIMENT 29

Referring to this embodiment, the case where the collecting electrode comprises Cu wire, tin plating, $ZnO_2$+Al , carbon black and urethane, and $TiO_2$ and urethane will be described.

This embodiment is similar to the twenty-second embodiment except that for a collecting electrode 200 shown in FIG. 2B, a tin-plated copper wire 100 μm in diameter produced by plating with tin is used as a metallic layer 204, $ZnO_2$ powder of which the primary particle diameter is 0.05 μm, produced by adding aluminum to $ZnO_2$ as a dopant so as to reduce contact resistance is used as the conductive particles of paste No. 1 for forming a conductive adhesive, and $TiO_2$ powder of which the average primary particle diameter is 0.05 μm is used as the conductive particles of paste No. 2. The pore volume of this paste No. 1 was 0.01 ml/g and the gel ratio was 100%. The average molecular weight of the polymeric resin was one thousand.

The above-described paste No. 1 was hardened at a temperature of 160° C. for thirty minutes, which were the standard hardening conditions of the above-described hardener. Then its volume resistivity was measured, and it was verified that its volume resistivity was low enough, i.e. 0.9 Ωcm.

The above-described paste No. 2 was hardened at a temperature of 160° C. for thirty minutes, which were the standard hardening conditions of the above-described hardener. Then its volume resistivity was measured, and it was verified that its volume resistivity was low enough, i.e. 1.5 Ωcm.

Wire was coated as in the first embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.4%±0.01%, the shunt resistance was 360 to 430 kΩ$cm^2$, the series resistance was 32.6 Ω$cm^2$ on average, and satisfactory characteristics were obtained. The yield rate of samples for which the I-V curve was normal was 94% and satisfactory.

A reliability test of these samples was performed as in the twenty-second embodiment. Next, the solar battery characteristics of samples after the test was finished were measured using a simulator as in the measurement of initial values, and the conversion efficiency was 2.1% lower on average than the initial conversion efficiency. However, no significant deterioration occurred.

The result of this embodiment shows that a solar battery using a collecting electrode according to the invention has satisfactory characteristics and high reliability.

EMBODIMENT 30

Referring to this embodiment, the case where the collecting electrode comprises Cu wire, gold plating, carbon black and phenoxy, and carbon black and polyamide will be described.

This embodiment is similar to the twenty-second embodiment except that for a collecting electrode 200 shown in FIG. 2B, a gold-plated copper wire 100 μm in diameter produced by plating with gold is used as a metallic layer 204, phenoxy resin (manufactured by Tomoe Industries) is used as the main material for the polymeric resin of paste No. 1 for forming a conductive adhesive, and polyamide imide resin (manufactured by Mitsubishi Kasei Corporation) is used as the main material for the polymeric resin of paste No. 2.

The above-described paste No. 1 was hardened at a temperature of 160° C. for thirty minutes, which were the standard hardening conditions of the above-described hardener. Then its volume resistivity was measured, and it was verified that its volume resistivity was low enough, 1.0 Ωcm.

The above-described paste No. 2 was hardened at a temperature of 180° C. for thirty minutes, which were the standard hardening conditions of the above-described hardener. Then its volume resistivity was measured, and it was verified that its volume resistivity was low enough, i.e. 2.0 Ωcm.

Wire was coated as in the first embodiment to form a collecting electrode 200. Fifty solar battery modules were produced using the collecting electrode 200 by the same method as in the twenty-second embodiment.

The initial characteristics of the obtained samples were measured by the same method as in the twenty-second embodiment. The conversion efficiency was 9.5%±0.05%, the shunt resistance was 240 to 350 kΩcm$^2$, the series resistance was 34.1 Ωcm$^2$ on average, and satisfactory characteristics were obtained. The yield rate of samples for which the I-V curve was normal was 96% and satisfactory.

A reliability test of these samples was performed as in the twenty-second embodiment. Next, the solar battery characteristics of samples after the test was finished were measured using a simulator as in the measurement of initial values, and the conversion efficiency was 3.0% lower on average than the initial conversion efficiency. However, no significant deterioration occurred.

The result of this embodiment shows that a solar battery using a collecting electrode according to the invention has satisfactory characteristics and high reliability.

EMBODIMENT 31

Referring to this embodiment, the case where the collecting electrode comprises Cu wire, silver paste, and urethane and carbon black will be described.

This embodiment is similar to the twenty-sixth embodiment except that in a collecting electrode 200 according to the invention shown in FIG. 2B, the material of the metal layer 204 on the copper wire 201 is changed from clad silver according to the twenty-sixth embodiment to silver paste (5007, manufactured by Du Pont). The paste used for the above-described metallic layer 205 is produced by dispersing silver particles in epoxy resin. Next, the first layer 202 and the second layer 203 are coated in the order described above to form a collecting electrode. Fifty solar battery modules are produced using the collecting electrode 200 by the same method as in the twenty-sixth embodiment.

The initial characteristics of the obtained samples were measured by the same method as in the twenty-second embodiment. The conversion efficiency was 9.5%±0.08%, the shunt resistance was 190 to 300 kΩcm$^2$, the series resistance was 32.0 Ωcm$^2$ on average, and satisfactory characteristics were obtained. The yield rate of samples for which the I-V curve was normal was 94% and satisfactory.

A reliability test of these samples was performed as in the twenty-second embodiment. Next, the solar battery characteristics of samples after the test was finished were measured using a simulator as in the measurement of initial values, and the conversion efficiency was 2.4% lower on average than the initial conversion efficiency. However, no significant deterioration occurred.

The result of this embodiment shows that a solar battery using a collecting electrode according to the invention has satisfactory characteristics and high reliability.

EMBODIMENT 32

In this embodiment, a single junction-type amorphous solar battery 400 constituted only by a single Si junction layer shown in FIG. 4A is produced according to the following procedure by the same method as in the twenty-sixth embodiment except that radio-frequency (RF) plasma CVD is used for forming the semiconductor layer.

First, a SUS430BA substrate 401 sufficiently degreased and cleaned is placed in a DC sputtering device (not shown), Ag is deposited until the film is 400 nm thick, then ZnO is deposited until the film is 400 nm thick so as to form the lower electrode 402. The substrate is taken out of the sputtering device and is placed in a RF plasma CVD film forming system (not shown), and a silicon semiconductor layer is formed in the order of n layer 403, i-layer 404, and p-layer 405.

Then, the layered substrate is placed in a sputtering device (not shown) and an $In_2O_3$ film is formed thereon as a transparent conductive film 406 provided also with an anti-reflection effect. Next, fifty solar battery modules were produced using the above-described collecting electrode 100 by the same method as in the twenty-sixth embodiment. At this time, the above-described coated wire 200 was used at intervals of 5.5 mm. The initial characteristics of the obtained sample were measured by the same method as in the twenty-second embodiment. The conversion efficiency was 5.2%±0.05%, the shunt resistance was 150 to 320 kΩcm$^2$, the series resistance was 9.5 Ωcm$^2$ on average, and satisfactory characteristics were obtained. The yield rate of samples for which the I-V curve was normal was 92% and satisfactory.

A reliability test of these samples was performed by the same method as in the twenty-second embodiment. Next, the solar battery characteristics of the samples after the test was finished were measured using a simulator as in the measurement of initial values, and the conversion efficiency was 2.4% lower on average than the initial conversion efficiency. However, no significant deterioration occurred.

The result of this embodiment shows that a solar battery using a collecting electrode according to the invention has excellent characteristics and high reliability.

EMBODIMENT 33

In this embodiment, a double junction-type amorphous solar battery 400 constituted by two Si photoactive layers shown in FIG. 4B is produced according to the following procedure by the same method as that in the twenty-sixth embodiment except that radio-frequency (RF) plasma CVD is used for forming the semiconductor layer.

First, a SUS430BA substrate 401 which has been sufficiently degreased and cleaned is placed in a DC sputtering device (not shown), Ag is deposited until the film is 400 nm thick, and then ZnO is deposited until the film is 400 nm thick so as to form the lower electrode 402. The substrate is taken out of the sputtering device and is placed in an RF plasma CVD film forming system (not shown), and the first silicon photoactive layer is formed in the order of n layer 403, i-layer 404, and p-layer 405. Next, the second silicon photoactive layer is similarly formed in the order of n layer 413, i-layer 414, and p-layer 415. Then, the substrate is placed in a resistance heating deposition system (not shown) and an $In_2O_3$ film is formed as transparent conductive film 406 provided also with an anti-reflection effect.

Next, fifty solar battery modules were produced using the above-described collecting electrode 100 by the same method as in the first embodiment. The above-described coated wire 200 was provided at intervals of 6 mm.

The initial characteristics of the obtained sample were measured by the same method as in the twenty-second embodiment. The conversion efficiency was 7.5%±0.08%, the shunt resistance was 400 to 500 kΩcm$^2$, the series resistance was 23.1 Ωcm$^2$ on average, and satisfactory characteristics were obtained. The yield rate of samples for which the I-V curve was normal was 96%, i.e. satisfactory.

A reliability test of these samples was performed by the same method as in the twenty-second embodiment. Next, the solar battery characteristics of the samples after the test was finished were measured using a simulator as in the measurement of the initial values, and the conversion efficiency was 1.9% lower on average than the initial conversion efficiency. However, no significant deterioration occurred.

The result of this embodiment shows that a solar battery using a collecting electrode according to the invention has excellent characteristics and high reliability.

EMBODIMENT 34

In this embodiment, a solar battery is produced according to the following procedure by the same method as in the twenty-sixth embodiment, except that it is constituted by a monocrystalline solar battery (monocrystalline Si) shown in FIG. 5.

First, a silicon monocrystal whose valence electrons are controlled by a CZ process so that it is p type is produced, the monocrystal is sliced, and a silicon wafer 501 approximately 300 $\mu$m thick is produced. Further, an $n^+$-type layer 502 is formed in a diffusion process by applying $P_2O_5$ on the above-described wafer.

Next, silver paste is printed on the rear side of the p-type wafer 501 by a screen printing machine (not shown), heated and baked, and as a result, the lower electrode 503 is formed. Next, the above-described collecting electrode 100 (504) used in the first embodiment is formed on $n^+$-type layer 502 on the light incident face by the above-described method. Then, $SiO_2$ film 505 is formed as an anti-reflection film by a sputtering process. Next, fifty solar battery modules were produced by the same method as in the twenty-sixth embodiment. The above-described coated wire 200 was used at intervals of 8.5 mm.

The initial characteristics of the obtained sample were measured by the same method as in the twenty-second embodiment. The conversion efficiency was 15.8%±0.01%, the shunt resistance was 500 to 760 k$\Omega$cm$^2$, the series resistance was 2.8 $\Omega$cm$^2$ on average, and satisfactory characteristics were obtained. The yield rate of samples for which the I-V curve was normal was 98%, i.e. satisfactory.

A reliability test of these samples was performed by the same method as in the twenty-second embodiment. Next, the solar battery characteristics of the samples after the test was finished were measured using a simulator as in the measurement of the initial values, and the conversion efficiency was 1.9% lower on average than the initial conversion efficiency. However, no significant deterioration occurred.

The result of this embodiment shows that a solar battery using a collecting electrode according to the invention has excellent characteristics and high reliability.

EMBODIMENT 35

In this embodiment, a solar battery is produced according to the following procedure by the same method as in the twenty-sixth embodiment except that it is constituted by a polycrystalline solar battery (polycrystalline Si) shown in FIG. 6.

First, a polycrystalline silicon ingot is produced by a casting process, the ingot is sliced, and $n^+$-type layer 602 is formed on the obtained polycrystalline silicon wafer 601 in a diffusion process by applying $P_2O_5$ on the above-described wafer. Next, silver paste is printed on the rear side of p-layer 601 by a screen printing machine (not shown), heated and baked, and as a result, the lower electrode 603 is formed. Next, the above-described collecting electrode 200 (604) used in the twenty-sixth embodiment is formed on $n^+$-type layer 602 on the light incident face by the above-described method. Then, $SiO_2$ film 605 is formed as an anti-reflection film by a sputtering process. Next, fifty solar battery modules were produced by the same method as in the first embodiment. The above-described coated wire 200 was used at intervals of 8.0 mm.

The initial characteristics of the obtained sample were measured by the same method as in the twenty-second embodiment. The conversion efficiency was 13.8%±0.05%, the shunt resistance was 450 to 650 k$\Omega$cm$^2$, the series resistance was 2.6 $\Omega$cm$^2$ on average, and satisfactory characteristics were obtained. The yield rate of samples for which the I-V curve was normal was 96%, i.e. satisfactory.

A reliability test of these samples was performed by the same method as in the twenty-second embodiment. Next, the solar battery characteristics of the samples after the test was finished were measured using a simulator as in the measurement of initial values, and the conversion efficiency was 2% lower on average than the initial conversion efficiency. However, no significant deterioration occurred.

The result of this embodiment shows that a solar battery using a collecting electrode according to the invention has excellent characteristics and high reliability.

EMBODIMENT 36

In this embodiment, a thin film solar battery is produced according to the following procedure by the same method as in twenty-sixth embodiment except that the solar battery is constituted by a thin film polycrystalline solar battery (thin film polycrystalline Si) shown in FIG. 7.

First, a metallic Si substrate 701 which had been sufficiently degreased and cleaned is placed in a microwave plasma CVD film forming system (not shown) to form n layer 702. Next, the substrate is placed in a heating furnace (not shown) to polycrystallize n layer 702. Next, the substrate is put in a microwave plasma CVD film forming system (not shown) to form p-layer 703. Further, it is placed in a sputtering device (not shown) and ITO film is formed as a transparent conductive film 704 provided also with an anti-reflection effect. Next, a grid 705 is formed on the above-described transparent conductive film 704 by the same method as in the twenty-sixth embodiment, and fifty solar battery modules are produced.

The initial characteristics of the obtained sample were measured by the same method as in the twenty-second embodiment, the conversion efficiency was 15.5%±0.01%, the shunt resistance was 400 to 510 k$\Omega$cm$^2$, the series resistance was 4.5 $\Omega$cm$^2$ on average, and satisfactory characteristics were obtained. The yield rate of samples for which the I-V curve was normal was 94%, i.e. satisfactory.

A reliability test of these samples was performed by the same method as in the twenty-second embodiment. Next, the solar battery characteristics of the samples after the test was finished were measured using a simulator as in the measurement of the initial values, and the conversion efficiency was 2.1% lower on average than the initial conversion efficiency. However, no significant deterioration occurred.

The result of this embodiment shows that a solar battery using a collecting electrode according to the invention has excellent characteristics and high reliability.

EMBODIMENT 37

This embodiment is different from the twenty-sixth embodiment in that the resistivity of the conductive adhesive is varied within the range of 0.005 to 200 $\Omega$cm. For varying the resistivity of the conductive adhesive, the mixing ratio (in weight) of polymeric resin and conductive particles in the conductive coating material was varied to any of 5:95, 10:90, 20:80, 80:20, 90:10, 95:5.

This embodiment is otherwise similar to the twenty-sixth embodiment.

Ten triple cells shown in FIG. 4C were produced according to the same procedure as in the twenty-sixth embodiment except that these conductive adhesives were used and similarly evaluated. Table 5 shows the results.

TABLE 5

| Resistivity (Ω cm) | 0.005 | 0.01 | 1 | 100 | |
|---|---|---|---|---|---|
| Initial Status | | | | | |
| conversion efficiency (%) | 8.2 | 9.6 | 9.6 | 9.4 | 8.5 |
| Series resistance (Ω cm$^2$) | 31.4 | 31.4 | 31.8 | 32.3 | 39.8 |
| Shunt resistance (kΩ cm$^2$) | 4.9 | 25.9 | 250 | 320 | 350 |
| Status after confidence test | | | | | |
| conversion efficiency (%) | 7.2 | 9.5 | 9.5 | 9.3 | 7.3 |
| Series resistance (Ω cm$^2$) | 31.3 | 31.6 | 31.9 | 32.6 | 50.3 |
| Shunt resistance (kΩ cm$^2$) | 2.3 | 25.9 | 251 | 325 | 350 |

Table 5 shows that initial shunting can be controlled by setting the resistivity of: coated layer 203 to 0.01 Ωcm or more, whereby more stable conversion efficiency can be obtained. Table 5 also shows that series resistance can be reduced by setting the resistivity to 100 Ωcm or less, whereby higher conversion efficiency can be obtained. Table 5 further shows that increase of series resistance and lowering of conversion efficiency after reliability testing can be reduced and a solar battery using a collecting electrode according to the invention has high reliability.

EMBODIMENT 38

This embodiment is different from the first embodiment in that the pressure-bonding temperature of the conductive adhesive is varied in the range from 50 to 300° C. The heating and pressure-bonding of collecting electrode 200, was performed at four different temperatures of 100, 160, 200 and 250° C. The block isocyanate used was similar to that in the first embodiment and its dissociation temperature is 150° C.

Otherwise this embodiment is similar to the twenty-sixth embodiment.

Ten triple junction cells shown in FIG. 4C were produced and similarly evaluated according to the same procedure as in the twenty-sixth embodiment except that the pressure-bonding temperature was varied. Table 6 shows the results.

TABLE 6

| Pressure-bonding temperature (° C.) | 100 | 150 | 200 | 250 |
|---|---|---|---|---|
| Initial Status | | | | |
| conversion efficiency (%) | 7.3 | 9.0 | 9.6 | 9.6 |
| Series resistance (Ω cm$^2$) | 41.3 | 31.4 | 31.3 | 31.2 |
| Shunt resistance (kΩ cm$^2$) | 57.3 | 253 | 352 | 390 |
| Status after confidence test | | | | |
| conversion efficiency (%) | 6.1 | 8.7 | 9.6 | 9.6 |
| Series 53.3 resistance (Ω cm$^2$) | 36.5 | 31.3 | 31.2 | |
| Shunt resistance (kΩ cm$^2$) | 56.8 | 254 | 356 | 389 |

Table 6 shows that series resistance can be reduced by setting the pressure-bonding temperature to the dissociation temperature or higher of the coated resin layer, whereby higher conversion efficiency can be obtained. Table 6 also shows that increase of series resistance and lowering of conversion efficiency after reliability testing can be reduced and a solar battery using a collecting electrode according to the invention has high reliability.

EMBODIMENT 39

This embodiment is different from the twenty-sixth embodiment in that the pressure-bonding time of the conductive adhesive is varied in the range of 10 to 60 seconds. Four different times of 10, 20, 45, and 60 seconds were tested. To check the hardening factor of a conductive adhesive under such a condition, the amount eluted into a solvent before and after bonding was measured and as a result, the ratio of gelling was 5%, 15%, 80%, and 100% respectively. The block isocyanate used is similar to that in the first embodiment and its dissociation temperature is 150° C.

Otherwise, this embodiment is similar to the twenty-sixth embodiment.

Except that the temperatures for heating pressure-bonding are these temperatures. Ten triple cells shown in FIG. 4C were made according to the same procedure as for Embodiment 26 and the same evaluation is performed. The results are shown in Table 7.

TABLE 7

| Heating contact bonding time (sec.) | 10 | 30 | 45 | 60 |
|---|---|---|---|---|
| Initial status | | | | |
| conversion efficiency (%) | 6.9 | 8.5 | 9.5 | 9.6 |
| Series resistance (Ω cm$^2$) | 43.5 | 36.2 | 31.4 | 31.2 |
| Shunt resistance (kΩ cm$^2$) | 25.1 | 96.3 | 265 | 312 |
| Status after confidence test | | | | |
| conversion efficiency (%) | 5.2 | 8.0 | 9.5 | 9.6 |
| Series resistance (Ω cm$^2$) | 58.3 | 40.2 | 31.5 | 31.3 |
| Shunt resistance (kΩ cm$^2$) | 20.3 | 96.5 | 264 | 315 |

As apparent from Table 7, higher conversion efficiency can be obtained due to reduction of the series resistance caused by use of a pressure-bonding temperature higher than the dissociation temperature of the resin coating layer. In addition, it also clear that higher reliability is secured because of less increase of the series resistance and less decrease of the conversion efficiency after the confidence test.

EMBODIMENT 40

In this embodiment, the amount of a curing agent contained in the conductive bonding material is examined. In other words, a variety of weight ratios of urethane resin used as chief coating agent of the current collector electrode 200 to blocked isocyanate used as a curing agent were used, such as 100:1, 50:1 20:1, and 10:1. The gel separation percentage of the conductive bonding material is 5, 15, 85, and 100% under the above conditions. Dissociation temperature of the blocked isocyanate used is 150° C., as in Embodiment 1.

Other conditions are the same as for Embodiment 26.

Ten triple cells shown in FIG. 4C were made and the same evaluation as for Embodiment 26 was performed. The evaluation results are shown in Table 8.

TABLE 8

| Resin-curing agent ratio | 100:1 | 50:1 | 20:1 | 10:1 |
|---|---|---|---|---|
| Initial status | | | | |
| conversion efficiency (%) | 7.8 | 9.2 | 9.7 | 9.6 |
| Series resistance (Ω cm$^2$) | 39.9 | 33.8 | 31.0 | 31.7 |
| Shunt resistance (kΩ cm$^2$) | 19.3 | 185 | 389 | 394 |
| Status after confidence test | | | | |
| conversion efficiency (%) | 6.1 | 8.4 | 9.7 | 9.6 |
| Series resistance (Ω cm$^2$) | 51.2 | 38.9 | 31.1 | 31.9 |
| Shunt resistance (kΩ cm$^2$) | 14.9 | 177 | 378 | 382 |

As apparent from Table 8, higher conversion efficiency can be obtained since the series resistance is decreased by the pressure-bonding temperature being higher than the dissociation temperature of the blocked isocyanate which is a curing agent contained in the conductive bonding material. In addition, it is also clear that higher reliability is secured because of less increase of the series resistance and less decrease of the conversion efficiency after the confidence test.

TABLE 9

| | Embodiment 1 | Comparison 1 | Embodiment 2 | Embodiment 3 | Embodiment 4 |
|---|---|---|---|---|---|
| Wire material | Copper | Copper | Copper | Silver | Gold |
| Wire surface | None | None | None | None | None |
| First layer filler | None | None | None | None | None |
| First layer resin | None | None | None | None | None |
| First layer crosslinking density | None | None | None | None | None |
| First layer curing agent | None | None | None | None | None |
| First layer solvent | None | None | None | None | None |
| First layer film gauge ($\mu$m) | None | None | None | None | None |
| First layer specific resistance (Ω cm) | None | None | None | None | None |
| Second layer filler | Carbon | Carbon | ITO | $SnO_2$ | $In_2O_3$ |
| Second layer resin | Urethane | Fluorine | Butyral | Urethane | Polyamide |
| Second layer curing agent | B.I | | B.I | B.I | B.I |
| Second layer solvent | Ethyl acetate IPA | Ethyl acetate IPA | Ethyl acetate IPA | Ethyl acetate IPA | Ethyl acetate IPA |
| Second layer film gauge | 20 | 20 | 20 | 20 | 20 |
| Second layer specific resistance | 0.6 | 0.1 | 1.2 | 5.0 | 1.5 |
| Temperature/time during bonding | 200/45 s | 200/20 M | 200/45 s | 200/45 s | 200/45 s |
| Substrate | SUS | SUS | SUS | SUS | SUS |
| Type of solar battery | Si/SiGe/ SiGe | Si/SiGe/ SiGe | Si/SiGe/ SiGe | Si/SiGe/ SiGe | Si/SiGe/ SiGe |
| Type of confidence test | HF | HF | HF | HF | HF |
| Initial yield | 94 | 64 | 94 | 92 | 90 |
| Efficiency before test (%) | 9.6 ± 0.02 | 9.0 ± 1.2 | 9.7 ± 0.05 | 9.1 ± 0.06 | 9.2 ± 0.01 |
| Efficiency after test (%) | −2% | −11% | −2% | −2.5% | −2% |
| Rs before test (Ω cm$^2$) | 32.0 | 32.1 | 32.5 | 32.9 | 32.3 |

TABLE 9-continued

| | Embodiment 1 | Comparison 1 | Embodiment 2 | Embodiment 3 | Embodiment 4 |
|---|---|---|---|---|---|
| Rs after test (kΩ cm$^2$) | No change | 62 | No change | No change | No change |
| RshDk before test | 200–300 | 4–300 | 200–300 | 250–400 | 400–500 |
| RshDk after test | No change | No change | No change | No change | No change |

TABLE 10

| | Embodiment 5 | Comparison 6 | Embodiment 7 | Embodiment 8 | Embodiment 9 | Embodiment 10 |
|---|---|---|---|---|---|---|
| Wire material | Copper | Copper | Copper | Copper | Copper | Copper |
| Wire surface | Silver cladding | Silver cladding | Silver cladding | Silver plating | Tin plating | Silver pasting |
| First layer filler | None | None | None | None | None | None |
| First layer resin | None | None | None | None | None | None |
| First layer crosslinking density | None | None | None | None | None | None |
| First layer curing agent | None | None | None | None | None | None |
| First layer solvent | None | None | None | None | None | None |
| First layer film gauge (μm) | None | None | None | None | None | None |
| First layer specific resistance (Ω cm) | None | None | None | None | None | None |
| Second layer filler | Carbon | $ZnO_2$ | $ZnO_2$ + Al | $TiO_2$ | Graphite | Carbon |
| Second layer resin | Urethane | Butyral | Phenoxy | Urethane | Polyamide-imide | Urethane |
| Second layer curing agent | B.I | B.I | B.I | B.I | B.I | B.I |
| Second layer solvent | Ethyl acetate IPA | Ethyl acetate IPA | Ethyl acetate IPA | Ethyl acetate IPA | Ethyl acetate IPA | Ethyl acetate IPA |
| Second layer film gauge | 20 | 20 | 20 | 20 | 20 | 20 |
| Second layer specific resistance | 0.6 | 1.3 | 0.9 | 1.1 | 2.0 | 0.6 |
| Temperature/time during bonding | 200/45 s | 200/45 s | 200/45 s | 200/45 s | 200/45 s | 200/45 s |
| Substrate | SUS | SUS | SUS | SUS | SUS | SUS |
| Type of solar battery | Si/SiGe/ SiGe | Si/SiGe/ SiGe | Si/SiGe/ SiGe | Si/SiGe/ SiGe | Si/SiGe/ SiGe | Si/SiGe/ SiGe |
| Type of confidence test | HF | HF | HF | HF | HF | HF |
| Initial yield | 96 | 94 | 92 | 92 | 94 | 88 |
| Efficiency before test (%) | 9.7 ± 0.03 | 9.6 ± 0.02 | 9.6 ± 0.08 | 9.5 ± 0.01 | 9.3 ± 0.09 | 9.2 ± 0.08 |
| Efficiency after test (%) | −1.5% | −2% | −2% | −2.3% | −2.9% | −2.1% |
| Rs before test (Ω cm$^2$) | 31.4 | 31.7 | 31.5 | 31.6 | 33.6 | 31.8 |
| Rs after test (kΩ cm$^2$) | No change | No change | No change | No change | No change | No change |
| RshDk before test | 300–400 | 310–390 | 400–500 | 320–380 | 400–500 | 150–200 |
| RshDk after test | No change | No change | No change | No change | No change | No change |

TABLE 11

| | Embodiment 1 | Comparison 11 | Embodiment 12 | Embodiment 13 | Embodiment 14 | Embodiment 15 |
|---|---|---|---|---|---|---|
| Wire material | Copper | Copper | Copper | Copper | Copper | Copper |
| Wire surface | None | None | None | None | None | None |
| First layer filler | None | None | None | None | None | None |
| First layer resin | None | None | None | None | None | None |
| First layer crosslinking density | None | None | None | None | None | None |
| First layer curing agent | None | None | None | None | None | None |
| First layer solvent | None | None | None | None | None | None |
| First layer film gauge (μm) | None | None | None | None | None | None |
| First layer specific resistance (Ω cm) | None | None | None | None | None | None |
| Second layer filler | Carbon | Carbon | Carbon | Carbon | Carbon | Carbon |
| Second layer resin | Urethane | Urethane | Urethane | Urethane | Urethane | Urethane |
| Second layer curing agent | B.I | B.I | B.I | B.I | B.I | B.I |
| Second layer solvent | Ethyl acetate IPA | Ethyl acetate IPA | Ethyl acetate IPA | Ethyl acetate IPA | Ethyl acetate IPA | Ethyl acetate IPA |

TABLE 11-continued

| | Embodiment 1 | Comparison 11 | Embodiment 12 | Embodiment 13 | Embodiment 14 | Embodiment 15 |
|---|---|---|---|---|---|---|
| Second layer film gauge | 20 | 20 | 20 | 20 | 20 | 20 |
| Second layer specific resistance | 0.6 | 0.6 | 0.6 | 0.6 | 0.6 | 0.6 |
| Temperature/time during bonding | 200/45 s | 200/45 s | 200/45 s | 200/45 s | 200/45 s | 200/45 s |
| Substrate | SUS | SUS | SUS | SUS | SUS | SUS |
| Type of solar battery | Si/SiGe/SiGe | Si Single | Si/Si | Si/SiGe | SiC/Si/SiGe | Single crystal Si |
| Type of confidence test | HF | HF | HF | HF | HF | HF |
| Initial yield | 94 | 90 | 94 | 92 | 92 | 98 |
| Efficiency before test (%) | 9.6 | 5.2 ± 0.05 | 7.5 ± 0.01 | 7.7 ± 0.02 | 9.5 ± 0.06 | 15.8 |
| Efficiency after test (%) | −2% | −2.4% | −1.9% | −2.3% | −2.4% | −1.9% |
| Rs before test (Ω $cm^2$) | 32.0 | 9.5 | 23.1 | 21.1 | 33.7 | 2.8 |
| Rs after test (kΩ $cm^2$) | No change | No change | No change | No change | No change | No change |
| RshDk before test | 200–300 | 150–320 | 400–500 | 250–310 | 260–330 | 500–760 |
| RshDk after test | No change | No change | No change | No change | No change | No change |

TABLE 12

| | Embodiment 16 | Comparison 17 | Embodiment 18 | Embodiment 19 | Embodiment 20 | Embodiment 21 |
|---|---|---|---|---|---|---|
| Wire material | Copper | Copper | Copper | Copper | Copper | Copper |
| Wire surface | None | None | None | None | None | None |
| First layer filler | None | None | None | None | None | None |
| First layer resin | None | None | None | None | None | None |
| First layer crosslinking density | None | None | None | None | None | None |
| First layer curing agent | None | None | None | None | None | None |
| First layer solvent | None | None | None | None | None | None |
| First layer film gauge (μm) | None | None | None | None | None | None |
| First layer specific resistance (Ω cm) | None | None | None | None | None | None |
| Second layer filler | Carbon | Carbon | Carbon | Carbon | Carbon | Carbon |
| Second layer resin | Urethane | Urethane | Urethane | Urethane | Urethane | Urethane |
| Second layer curing agent | B.I | B.I | B.I | B.I | B.I | B.I |
| Second layer solvent | Ethyl acetate PIA | Ethyl acetate PIA | Ethyl acetate PIA | Ethyl acetate PIA | Ethyl acetate PIA | Ethyl acetate PIA |
| Second layer film gauge | 20 | 20 | 20 | 20 | 20 | 20 |
| Second layer specific resistance | 0.6 | 0.6 | 0.005–200 | 0.6 | 0.6 | 0.6 |
| Temperature/time during bonding | 200/45 s | 200/45 s | 200/45 s | Temperature range | Time range | 200/45 s |
| Substrate | Wafer | Metal Si | SUS | SUS | SUS | SUS |
| Type of solar battery | Poly-crystalline Si | Thin-film poly-crystal | Si/SiGe/SiGe | Si/SiGe/SiGe | Si/SiGe/SiGe | Si/SiGe/SiGe |
| Type of confidence test | HF | HF | HF | HF | HF | HF |
| Initial yield | 96 | 92 | — | — | — | — |
| Efficiency before test (%) | 13.8% | 12.5% | — | — | — | — |
| Efficiency after test (%) | −2% | −2.1% | — | — | — | — |
| Rs before test (Ω $cm^2$) | 2.6 | 4.5 | — | — | — | — |
| Rs after test (kΩ $cm^2$) | No change | No change | — | — | — | — |
| RshDk before test | 450–650 | 400–510 | — | — | — | — |
| RshDk after test | No change | No change | | | | |

TABLE 13

| | Embodiment 22 | Comparison 2 | Embodiment 23 | Embodiment 24 | Embodiment 25 |
|---|---|---|---|---|---|
| Wire material | Copper | Copper | Copper | Silver | Gold |
| Wire surface | None | None | None | None | None |
| First layer filler | Carbon | None | Carbon | Carbon | Graphite |
| First layer resin | Urethane | None | Epoxy | Urethane | Urethane |
| First layer curing agent | B.I | None | B.I | B.I | B.I |
| First layer solvent | BCA.xylene | None | BCA.xylene | BCA.xylene | BCA.xylene |
| First layer film gauge ($\mu$m) | 5 | None | 5 | 5 | 5 |
| First layer specific resistance (Ω cm) | 1.0 | None | 2.1 | 1.0 | 1.8 |
| Second layer filler | Carbon | Silver | Carbon | ITO | $SnO_2$ |
| Second layer resin | Urethane | Polyester | Urethane | Urethane | Urethane |
| Second layer curing agent | B.I | | B.I | B.I | B.I |
| Second layer solvent | Cyclo-hexanone | Carbitol | Cyclo-hexanone | Cyclo-hexanone | Cyclo-hexanone |
| Second layer film gauge | 20 | 20 | 20 | 20 | 20 |
| Second layer specific resistance | 0.5 | 0.5 | 0.5 | 1.0 | 1.4 |
| Temperature/time during bonding | 200/45 s | 150/30 m | 200/45 s | 200/45 s | 200/45 s |
| Substrate | SUS | SUS | SUS | SUS | SUS |
| Type of solar battery | Si/SiGe/SiGe | Si/SiGe/SiGe | Si/SiGe/SiGe | Si/SiGe/SiGe | Si/SiGe/SiGe |
| Type of confidence test | HF/HHL | HHL | HF/HHL | HF/HHL | HF/HHL |
| Initial yield | 98 | 54 | 96 | 94 | 96 |
| Efficiency before test (%) | 9.6 ± 0.02 | 7.5 ± 1.8 | 9.4 ± 0.06 | 9.5 ± 0.07 | 9.3 ± 0.01 |
| Efficiency after test (%) | −2% | −20% | −2.6% | −2.3% | −2.1% |
| Rs before test (Ω $cm^2$) | 32.0 | 32.0 | 32.2 | 32.5 | 33.0 |
| Rs after test (kΩ $cm^2$) | No change | No change | No change | No change | No change |
| RshDk before test | 200–500 | 1.8 | 400–500 | 300–500 | 230–420 |
| RshDk after test | No change | 0.8 | No change | No change | No change |

TABLE 14

| | Embodiment 26 | Embodiment 27 | Embodiment 28 | Embodiment 29 | Embodiment 30 | Embodiment 31 |
|---|---|---|---|---|---|---|
| Wire material | Copper | Copper | Copper | Copper | Copper | Copper |
| Wire surface | Silver cladding | Silver cladding | Silver plating | Tin plating | Gold plating | Silver pasting |
| First layer filler | Carbon | ZnO | Carbon | $ZnO_2$ + Al | Carbon | Carbon |
| First layer resin | Urethane | Urethane | Phenol | Urethane | Phenoxy | Urethane |
| First layer curing agent | B.I | B.I | B.I | B.I | B.I | B.I |
| First layer solvent | BCA.xylene | BCA.xylene | BCA.xylene | BCA.xylene | BCA.xylene | BCA.xylene |
| First layer film gauge ($\mu$m) | 5 | 5 | 5 | 5 | 5 | 5 |
| First layer specific resistance (Ω cm) | 1.0 | 1.4 | 1.5 | 0.9 | 1.0 | 1.0 |
| Second layer filler | Carbon | $In_2O_3$ | Carbon | $TiO_2$ | Carbon | Carbon |
| Second layer resin | Urethane | Urethane | Polyamide | Urethane | Polyamide-imide | Urethane |
| Second layer curing agent | B.I | B.I | B.I | B.I | B.I | B.I |
| Second layer solvent | Cyclo-hexanone | Cyclo-hexanone | Cyclo-hexanone | Cyclo-hexanone | Cyclo-hexanone | Cyclo-hexanone |
| Second layer film gauge | 20 | 20 | 20 | 20 | 20 | 20 |
| Second layer specific resistance | 0.5 | 0.7 | 0.8 | 1.5 | 2.0 | 0.5 |
| Temperature/time during bonding | 200/45 s | 200/45 s | 200/45 s | 200/45 s | 200/45 s | 200/45 s |
| Substrate | SUS | SUS | SUS | SUS | SUS | SUS |
| Type of solar battery | Si/SiGe/SiGe | Si/SiGe/SiGe | Si/SiGe/SiGe | Si/SiGe/SiGe | Si/SiGe/SiGe | Si/SiGe/SiGe |
| Type of | HF/HHL | HF/HHL | HF/HHL | HF/HHL | HF/HHL | HF/HHL |

TABLE 14-continued

| | Embodiment 26 | Embodiment 27 | Embodiment 28 | Embodiment 29 | Embodiment 30 | Embodiment 31 |
|---|---|---|---|---|---|---|
| confidence test | | | | | | |
| Initial yield | 98 | 96 | 96 | 94 | 96 | 94 |
| Efficiency before test (%) | 9.7 ± 0.02 | 9.6 ± 0.01 | 9.3 ± 0.01 | 9.4 ± 0.01 | 9.5 ± 0.05 | 9.4 ± 0.08 |
| Efficiency after test (%) | −2% | −2.2% | −2.8% | −2.1% | −3.0% | −2.4% |
| Rs before test (Ω $cm^2$) | 31.8 | 32.1 | 32.7 | 32.6 | 34.1 | 32.0 |
| Rs after test (kΩ $cm^2$) | No change | No change | No change | No change | No change | No change |
| RshDk before test | 400–500 | 320–390 | 400–500 | 360–430 | 240–350 | 190–300 |
| RshDk after test | No change | No change | No change | No change | No change | No change |

TABLE 15

| | Embodiment 26 | Embodiment 32 | Embodiment 33 | Embodiment 34 | Embodiment 35 |
|---|---|---|---|---|---|
| Wire material | Copper | Copper | Copper | Copper | Copper |
| Wire surface | Silver clading | Silver clading | Silver clading | Silver clading | Silver clading |
| First layer filler | Carbon | Carbon | Carbon | Carbon | Carbon |
| First layer resin | Urethane | Urethane | Urethane | Urethane | Urethane |
| First layer curing agent | B.I | B.I | B.I | B.I | B.I |
| First layer solvent | Ethyl acetate IPA | Ethyl acetate IPA | Ethyl acetate IPA | Ethyl acetate IPA | Ethyl acetate IPA |
| First layer film gauge (μm) | 5 | 5 | 5 | 5 | 5 |
| First layer specific resistance (Ω cm) | 1.0 | 1.0 | 1.0 | 1.0 | 1.0 |
| Second layer filler | Carbon | Carbon | Carbon | Carbon | Carbon |
| Second layer resin | Urethane | Urethane | Urethane | Urethane | Urethane |
| Second layer curing agent | B.I | B.I | B.I | B.I | B.I |
| Second layer solvent | Cyclo-hexanone | Cyclo-hexanone | Cyclo-hexanone | Cyclo-hexanone | Cyclo-hexanone |
| Second layer film gauge | 20 | 20 | 20 | 20 | 20 |
| Second layer specific resistance | 0.5 | 0.5 | 0.5 | 0.5 | 0.5 |
| Temperature/time during bonding | 200/45 s | 200/45 s | 200/45 s | 200/45 s | 200/45 s |
| Substrate | SUS | SUS | SUS | SUS | SUS |
| Type of solar battery | Si/SiGe/SiGe | Si single | Si/Si | Single-crystal Si | Poly-crystal-line Si |
| Type of confidence test | HF/HHL | HF/HHL | HF/HHL | HF/HHL | HF/HHL |
| Initial yield | 98 | 92 | 96 | 98 | 96 |
| Efficiency before test (%) | 9.7 ± 0.02 | 5.2 ± 0.05 | 7.5 ± 0.08 | 15.8 ± 0.01 | 13.8 ± 0.05 |
| Efficiency after test (%) | −2% | −2.4% | −1.9% | 1.9% | −2% |
| Rs before test (Ω $cm^2$) | 31.8 | 9.5 | 23.1 | 2.8 | 2.6 |
| Rs after test (kΩ $cm^2$) | No change | No change | No change | No change | No change |
| RshDk before test | 400–500 | 150–320 | 400–500 | 500–760 | 450–650 |
| RshDk after test | No change | No change | No change | No change | No change |

TABLE 16

| | Embodiment 36 | Embodiment 37 | Embodiment 38 | Embodiment 39 | Embodiment 40 |
|---|---|---|---|---|---|
| Wire material | Copper | Copper | Copper | Copper | Copper |
| Wire surface | Silver cladding | Silver cladding | Silver cladding | Silver cladding | Silver cladding |
| First layer filler | Carbon | Carbon | Carbon | Carbon | Carbon |
| First layer resin | Urethane | Urethane | Urethane | Urethane | Urethane |
| First layer curing agent | B.I | B.I | B.I | B.I | B.I |

TABLE 16-continued

| | Embodiment 36 | Embodiment 37 | Embodiment 38 | Embodiment 39 | Embodiment 40 |
|---|---|---|---|---|---|
| First layer solvent | Ethyl acetate IPA | Ethyl acetate IPA | Ethyl acetate IPA | Ethyl acetate IPA | Ethyl acetate IPA |
| First layer film gauge (μm) | 5 | 5 | 5 | 5 | 5 |
| First layer specific resistance (Ω cm) | 1.0 | 1.0 | 1.0 | 1.0 | 1.0 |
| Second layer filler | Carbon | Carbon | Carbon | Carbon | Carbon |
| Second layer resin | Urethane | Urethane | Urethane | Urethane | Urethane |
| Second layer curing agent | B.I | B.I | B.I | B.I | B.I |
| Second layer solvent | Cyclo-hexanone | Cyclo-hexanone | Cyclo-hexanone | Cyclo-hexanone | Cyclo-hexanone |
| Second layer film gauge | 20 | 20 | 20 | 20 | 20 |
| Second layer specific resistance | 0.5 | 0.005–200 | — | — | Amount of curing agent |
| Temperature/time during bonding | 200/45 s | 200/45 s | Temperature range | Time range | 200/45 s |
| Substrate | SUS | SUS | SUS | SUS | SUS |
| Type of solar battery | Thin-film polycrystal | Si/SiGe/SiGe | Si/SiGe/SiGe | Si/SiGe/SiGe | Si/SiGe/SiGe |
| Type of confidence test | HF/HHL | HF/HHL | HF/HHL | HF/HHL | HF/HHL |
| Initial yield | 94 | — | — | — | — |
| Efficiency before test (%) | 12.5 ± 0.01 | — | — | — | — |
| Efficiency after test (%) | −2.1% | — | — | — | — |
| Rs before test (Ω cm$^2$) | 4.5 | — | — | — | — |
| Rs after test (kΩ cm$^2$) | No change | — | — | — | — |
| RshDk before test | 400–510 | — | — | — | — |
| RshDk after test | No change | — | — | — | — |

EMBODIMENT 41

In this embodiment, a photovoltaic element is made having current collector electrodes to which thermosetting conductive bonding material is applied, and its performance is confirmed in the procedure described below.

The following describes a method of preparing paste No. 4 for forming the thermosetting conductive bonding material constituting the coating layer of the current collector electrodes.

(1) a mixed solvent containing 17.4 g of butyl carbitol acetate and 11.6 g of methyl ethyl ketone were placed into a shaker for dispersion.

(2) 8.9 gms of Butyral resin (BL-S manufactured by Sekisui Chemical Co., Ltd.) used as chief binder agent were added to the solvent in the shaker and it was stirred with a ball mill until it was sufficiently dissolved.

(3) As a curing agent, 1.40 g of blocked isocyanate (B-815N manufactured by Takeda Chemical Industries, Ltd.) and 15 g of glass beads for dispersion were added to said solvent.

(4) As conductive particles, 5.3 g of Conductex 975 beads (manufactured by Colombian Carbon, Ltd.) were added to said solvent and it was placed on static stand until the conductive grains settled out sufficiently in said solvent.

(5) The shaker containing the above materials was shaken for 12 hours by using a paint shaker (manufactured by Toyo Seiki Seisakuzyo, Ltd.). The shaking time was determined via an experiment for finding the length of time in which the volume resistivity of the paste No. 4 was decreased to the lowest level.

(6) Afterwards, glass beads for dispersion were removed from the paste No. 4. The paste No. 4 was cured under the standard curing conditions of said curing agent, 160° C. 30 min., and its volume resistivity was measured. As a result of the measurement, 0.8 Ωcm was obtained, by which it was confirmed that the resistivity was sufficiently low.

(7) By using a longitudinal type of a wire coater shown in FIG. 3, silver-clad copper wire having a diameter of 100 μm was coated with the paste No. 4. For die 305, a PVF die manufactured by Osaka Diamond, Ltd., for enamel wire coating was used. As for the drying oven 306, two IR ovens SS-O9 (infrared ovens) manufactured by Sakaguchi Dennetsu, Ltd. were placed in a longitudinal direction opposite to each other. The atmospheric temperature in the drying ovens was set to a desired level by means of a temperature controller 311. A servo motor (not shown) was used for controlling the speed of the Cu wire. Driving. gears 308–309 were placed at the side of the wire rollup reel 310. Additionally, an LS-3100/3034 film-thickness measuring apparatus 307 manufactured by Keyence, Ltd. was placed at the outlet of the drying oven 306 to measure the thickness of the coating of the conductive bonding material.

The following describes conditions for forming said paste No. 4 as a first coating layer 202.

The wire rolling speed is 8.9 mm/s, the curing time is 60 sec., the temperature in the drying oven is 280° C., and the bore diameter of the die used for enamel coating is 180 μm. These conditions were obtained via an experiment for finding conditions under which curing reaction of the paste No. 4 progressed without any shedding of the paste No. 4. The conditions were confirmed by ultrasonic cleaning of the coated wire for 30 sec. with methyl ethyl ketone to check whether any conductive bonding material made of the paste No. 4 would fall off. The conductive bonding material made of the paste No. 4 applied to the silver-cladded copper wire existed in a cured status with crosslinking. The thickness of the first coating layer 202 was 11 μm on average and variation of the thickness of the coating was within a range of ±1 μm as a result of coating a wire of 100 m length.

The following describes forming conditions of a second coating layer 203 to which said thermosetting conductive bonding material (paste No. 4) is applied and a method of fabricating the current collector electrodes used for the photovoltaic element of the present invention.

The wire rolling speed is 8.9 mm/s, the drying time is 60 sec., the temperature in the drying oven is 120° C., and the bore diameter of the die used for enamel coating is 200 μm. These conditions were obtained through an experiment for finding conditions under which the temperature was lower than the dissociation temperature of blocked isocyanate without any tackiness of the conductive bonding material No. 1 applied to said wire but with sufficient adhesion to the wire. The conductive bonding material made of the paste No. 4 applied to said wire existed in a thermoplastic status with the solvent volatilized. The thickness of a coating layer 203 is 8 μm on average and the variation of the thickness of the coating was within a range of ±1.5 μm as a result of coating a wire of 100 m length.

The following describes a process for fabricating ten photovoltaic element modules.

(1) FIG. 10 illustrates a photovoltaic element module having current collector electrodes 1004 formed by said method. A SUS substrate 1001 which was used had formed thereon a pin-type double cell combined with a negative electrode. In addition, a transparent conductive coating made of $In_2O_3$ was formed as a positive electrode on the light incident side.

(2) The substrate 1001 has an effective area of 30×30 cm. Patterns are printed on the substrate by using etching paste containing ferric chloride as chief active ingredient, a commercial printer, and a printing plate for etching, whereby undesired portions of transparent conductive coating were removed.

(3) Next, a positive electrode 1002 of hard copper and a negative electrode 1003 were formed outside the effective area, and said current collector electrodes 1004 were expanded between the both positive electrodes 1002 so that they were within the effective area at 7-mm intervals and they were fixed temporarily with ultraviolet curing adhesive outside the positive electrode, in other words, outside the effective area.

(4) Afterwards, said current collector electrodes 1004 were contact-bonded with heating on a cell surface of the substrate 1001. Bond ing was performed under 1 kg/cm$^2$ pressure and heating conditions were based on a profile such as ramping the temperature up to 200° C. in 60 min. and then cooling down in 20 min. The heating conditions were determined through an experiment measuring adhesion of the current collector electrodes to the cell surface of the photovoltaic elements and observing a sectional configuration of the current collector electrodes which were bonded.

Although the positive electrode is kept in electrical conduction with the current collector electrodes in said thermo-pressure-bonding process, dotting with silver paste or soldering can be performed to enhance the contact. The thermo-pressure-bonding is performed with a vacuum laminator device having a capability of simultaneous heating and pressurizing.

The following describes the result of investigating initial characteristics of the obtained photovoltaic element modules.

(1) Voltage-current characteristics of said samples were measured in a dark state. The shunt resistance was examined on the basis of the inclination around the origin. As a result of the examination, favorable values, 200 kΩcm$^2$ to 500 kΩcm$^2$ were obtained.

(2) By using a simulated sun light source (hereinafter "simulator") having 100 mW/cm$^2$ light intensity in the AM1.5 global sun light spectrum, solar battery characteristics of the said samples were measured. The measured conversion efficiency 7.9+0.02% was favorable and relatively uniform.

Next, encapsulation of said samples was performed in the following procedure. Clear glass and EVA were laminated on the both sides of the substrate 1001, then fluoroplastic film (ETFE) was laminated on the both sides, and it was placed into a vacuum laminator for lamination while keeping its temperature at 150° C. for 60 min.

A confidence test was performed on the samples after the lamination. The test was based on the temperature and relative humidity cycle test A-2 defined in an environmental test method and an endurance test method of crystalline solar battery modules (Japan Industrial Standard C8917).

A cyclic test was repeated 20 times by placing the samples into a constant temperature and humidity bath whose inside temperature and humidity were controllable to change the temperature from −40° C. to +85° C. (relative humidity: 85%). Afterwards, when the characteristics of the solar battery samples were examined after the completion of the test by using the simulator in the same manner as for the initial state, a decrease of 2% on average was obtained in comparison with the initial conversion efficiency without any significant deterioration.

As a result of this embodiment, it is understood that the photovoltaic element of the present invention has favorable characteristics and provides higher reliability.

Comparison 3

This example differs from Embodiment 41 in that thermoplastic conductive bonding material is used instead of the thermosetting conductive bonding material used in Embodiment 41. Current collector electrodes and samples were made by using thermoplastic conductive bonding material 107-25 manufactured by CMI, Ltd. for first coating layer 202 shown in FIG. 2A.

The first coating layer 202 was formed using the conditions described below by using said conductive bonding material 107-25 to make the current collector electrodes.

The wire rolling speed is 8.9 mm/s, the drying time is 60 sec., the temperature in the drying oven is 120° C., and the bore diameter of the die used for enamel wire coating is 180 μm. The thickness of the coating layer 202 is 8 μm on average and the variation of the thickness of the coating was within a range of ±1.5 μm as a result of coating a wire of 100 m length.

The second coating layer 203 was formed using the same conditions by using conductive bonding material made of the paste No. 4 used for Embodiment 1.

Next, in the same manner as for Embodiment 41, current collector electrodes 1004 were contact bonded to the cell surface of the substrate 1001 with heating. Bonding was performed under the conditions of 1 kg/cm$^2$ pressure and heating conditions were based on a profile such as ramping the temperature up to 150° C. in 40 min. in a ramp state and then cooling down in 20 min.

Ten photovoltaic element modules were fabricated in the same manner as for Embodiment 41.

As a result of encapsulation of these samples in the same manner as in Embodiment 41 and measurement and initial characteristics, a conversion efficiency of 7.8% on average and series resistance 27 $\Omega cm^2$ were obtained.

As the same manner as for Embodiment 41, a cyclic test was repeated 20 times by placing the samples into the constant temperature and humidity bath whose inside temperature and humidity were controllable to change the temperature from −40° C. to +85° C. (relative humidity: 85%). Afterwards, the characteristics of the solar battery samples were examined after the completion of the test by using the simulator in the same manner as for the initial state. A decrease of 10% on average was obtained in comparison with the initial conversion efficiency, which was a significant deterioration.

The deterioration is caused by an increase of the series resistance, such as, for example, an increase of an interface resistance between the metal wire and the thermoplastic bonding material due to a change of humidity and an increase of volume resistivity due to deterioration of the conductive bonding material.

EMBODIMENT 42

In this embodiment, effects of coating of the moisture barrier paint of ten samples fabricated in the same manner as for Embodiment 41 before encapsulation were examined.

Other characteristics are the same as for Embodiment 41.

Initial characteristics of the samples were measured in the same manner as for Embodiment 41, and the measured conversion efficiency of 7.9±0.02% and series resistance of 24 $\Omega cm^2$ were favorable and relatively uniform.

The samples were hardened by drying under temperature conditions of ramping up the temperature from 80° C. to 190° C. in a hot-air drying oven after they were spray coated with hard coating material, Fine Hard manufactured by Toa Nenryo Kogyo K.K.

When characteristics of the samples after the hard coating were measured by using said simulator, a conversion efficiency of 7.8% and series resistance of 28 $\Omega cm^2$ were obtained without any significant deterioration.

Comparison 4

In this embodiment, effects of coating of the moisture barrier paint on ten samples fabricated in the same manner as for Comparison 3 in a state before encapsulation were measured.

Other characteristics are the same as for Embodiment 41.

Initial characteristics of the samples were measured in the same manner as for Embodiment 41, and the measured conversion efficiency of 7.9±0.02% and series resistance of 24 $\Omega cm^2$ were favorable and relatively uniform.

In the same manner as for Embodiment 42, said samples were hardened by drying under temperature conditions of ramping up the temperature from 80° C. to 190° C. in a hot-air drying oven after they were spray coated with hard coating material, Fine Hard manufactured by Toa Nenryo Kogyo K. K.

When characteristics of the samples after the hard coating were measured by using said simulator, a conversion efficiency of 5.5% and series resistance of 60 $\Omega cm^2$ were obtained, which was a significant deterioration.

The deterioration may be caused by an increase of the volume resistivity due to peeling of the conductive bonding material on the electrode metal caused by the hard coating solvent soaking inside the electrodes and deterioration of the thermoplastic conductive bonding material caused by heating during the hardening process of the coat material.

EMBODIMENT 43

This embodiment differs from Embodiment 41 in that a mixture of carbon black and urethane resin is used as a binder of the conductive bonding material instead of the Butyral resin of Embodiment 41.

The following describes a method of making paste No. 5 for forming a single-liquid type thermosetting conductive bonding material constituting a coating layer of the current collector electrodes.

(1) A mixed solvent containing 17.0 g of butyl carbitol acetate and 11.6 g of methyl ethyl ketone were placed in a shaker for dispersion.

(2) 8.9 gms of urethane resin (5120 manufactured by Nippon Polyurethane, Ltd.) used as a chief binder agent was added to the solvent in the shaker, then it was stirred with a ball mill until it was sufficiently dissolved.

(3) As a curing agent, 1.4 g of blocked isocyanate (2515 manufactured by Nippon Polyurethane, Ltd.) and 15 g of glass beads for dispersion were added to said solvent.

(4) As conductive grains, 5.3 g of Conductex 975 beads manufactured by Colombian Carbon, Ltd. were added to said solvent and it was left to stand until the conductive grains were sufficiently settled out in said solvent.

(5) Dispersion was made by shaking the shaker containing the above materials for 12 hours by using a paint shaker.

(6) Afterwards, the glass beads for dispersion were removed from the paste No. 5.

(7) The paste No. 5 was cured under the standard curing conditions of said curing agent, 180° C. for 30 min. and its volume resistivity was then measured. As a result of the measurement, 5.1 $\Omega cm$ was obtained, by which it was confirmed that the resistivity was sufficiently low. The following describes conditions of forming said paste No. 5 as the first coating layer 202 by using the wire coater shown in FIG. 3.

The wire rolling speed is 8.9 mm/s, the curing time is 60 sec., the temperature in the drying oven is 280° C., and the bore diameter of the die used for enamel wire coating is 180 $\mu$m. The thickness of the first coating layer 202 was 11 $\mu$m on average and the variation of the thickness of the coating was within a range of ±1 $\mu$m as a result of coating a wire of 100 m length.

In addition, the following describes conditions for forming conductive bonding material made of said paste No. 5 as the second coating layer 203 by using the wire coater of FIG. 3.

The wire rolling speed is 8.9 mm/s, the drying time is 60 sec., the temperature in the drying oven is 120° C., and the bore diameter of the die used for enamel wire coating is 200 $\mu$m. The conditions were obtained through an experiment for finding a temperature which was lower than the dissociation level of blocked isocyanate without any tackiness of the paste No. 5 applied to said wire. The conductive bonding material made of the paste No. 5 applied to said wire existed in a thermoplastic state with the solvent volatilized. The thickness of the coating layer 203 is 8 $\mu$m on average and the variation of the thickness of the coating was within a range of ±5 $\mu$m as a result of coating a wire of 100 m length.

Next, ten photovoltaic element modules were fabricated in the same manner as for Embodiments 41 and 42.

As a result of measuring initial characteristics of the samples obtained in this embodiment in the same manner as for Embodiment 1, conversion efficiency was 7.8% on average and the series resistance was 25 $\Omega cm^2$.

Subsequently, the same temperature and humidity cycle test as for Embodiment 41 was performed, and an average deterioration rate of 1.5% was obtained in comparison with the initial conversion efficiency without any significant deterioration.

As a result of this embodiment, it is understood that the photovoltaic element of the present invention has favorable characteristics and provides higher reliability.

EMBODIMENT 44

This embodiment differs from Embodiment 41 in that titanium oxide is used as a filler of the conductive bonding material used for the first coating layer 202 instead of the Conductex 975 beads of Embodiment 41 to make current collector electrodes and samples. The second coating layer 203 was formed under the same conditions by using conductive bonding material made of the paste No. 4, the same as for Embodiment 41.

The following describes a method of preparing paste No. 6 for forming the conductive bonding material constituting the coating layer of the current collector electrodes.

(1) Mixed solvent containing 17.4 g of butyl carbitol acetate and 11.6 g of methyl ethyl ketone were placed into a shaker for dispersion.
(2) 8.9 gms of butyral resin (BL-S manufactured by Sekisui Chemical Co., Ltd.) used as chief binder agent was added to the solvent in the shaker and it was stirred with a ball mill until it was fully dissolved.
(3) As a curing agent, 1.4 g of blocked isocyanate (B-815N manufactured by Takeda Chemical Industries, Ltd.) and 15 g of glass beads for dispersion were added to said solvent.
(4) As conductive grains, 5.3 g of titanium oxide powder (FT-1000 manufactured by Ishihara Sangyo, Ltd.) was added to said solvent and. it was left to stand until the conductive grains were sufficiently settled out in said solvent.
(5) Dispersion was made by shaking the shaker containing the above materials for 10 hours by using a paint shaker manufactured by Toyo Seiki Seisakujyo, Ltd.
(6) Afterwards, the glass beads for dispersion were removed from the paste No. 6. The paste No. 6 was cured under the standard curing conditions of said curing agent, 160° C. and 30 min. and its volume resistivity was measured. As a result of the measurement, 8 Ωcm was obtained, by which it was confirmed that the resistivity was sufficiently low.
(7) Subsequently, current collector electrodes were made by forming the first coating layer 202 with conductive bonding material made of the paste No. 6 under the same conditions as for Embodiment 41.

Next, ten photovoltaic element modules were fabricated in the same manner as for Embodiment 41.

As a result of measuring initial characteristics of the samples obtained in this embodiment in the same manner as for Embodiment 41, the conversion efficiency was 7.7% and the series resistance was 27 $\Omega cm^2$.

Subsequently, the same temperature and humidity cycle test as for Embodiment 41 was performed, and an averaged deterioration rate 3% was obtained in comparison with the initial conversion efficiency without any significant deterioration.

As a result of this embodiment, it is understood that the photovoltaic element of the present invention has favorable characteristics and provides higher reliability.

EMBODIMENT 45

In this embodiment, the effect of changing the volume resistivity of the conductive bonding material by mixing varying amounts of pigment in a binder of the conductive bonding material, phenoxy resin, were determined. As said pigment amount, six percentages, 20 wt %, 25 wt %, 30 wt %, 35 wt %, 40 wt %, and 45 wt % were used to make paste Nos. 7-1 to 7-6 for forming thermosetting conductive bonding material.

The following describes a method of preparing paste Nos. 7-1 to 7-6.

(1) As a solvent, cyclohexanone was placed into a shaker for dispersion.
(2) Phenoxy resin (PKHH manufactured by Union Carbide, Ltd.) used as a chief binder agent was added to the solvent in the shaker, then it was stirred with a ball mill until it was fully dissolved.
(3) As a dispersion agent, butyral resin (BL-S manufactured by Sekisui Chemical Co. Ltd.) was added, and it was stirred with a ball mill.
(4) As a curing agent, blocked isocyanate (B-815N manufactured by Takeda Chemical Industries, Ltd.) and glass beads for dispersion were added to said solvent.
(5) As conductive particles, Conductex 975 beads manufactured by Colombian Carbon, Ltd. were added to said solvent, and it was left. to stand until the filler was sufficiently settled out in said solvent.
(6) Dispersion was made by Shaking the shaker containing the above materials for 10 hours by using a paint shaker.
(7) Afterwards, glass beads for dispersion were removed from the paste Nos. 7-1 to 7-6. The paste Nos. 7-1 to 7-6 were cured under the standard curing conditions of said curing agent, 160° C. and 30 min. and its volume resistivity was measured. As a result of the measurement, the values in Table 17 were obtained.

TABLE 17

| Pigment ratio (wt %) | Volume Resis-tiviy (Ω cm) | Initial Conver-sion effici-ency (%) | Material (g) | | | | |
|---|---|---|---|---|---|---|---|
| | | | Car-bon | Phenoxy resin | Curing agent | Solvent | Bead |
| 20 | 892.10 | 4.00 | 3.00 | 10.80 | 1.20 | 17.40 | 15.00 |
| 25 | 10.68 | 7.52 | 3.75 | 10.13 | 1.13 | 17.40 | 15.00 |
| 30 | 2.19 | 7.60 | 4.50 | 9.45 | 1.05 | 17.40 | 15.00 |
| 35 | 0.63 | 7.70 | 5.25 | 8.78 | 0.98 | 17.40 | 15.00 |
| 40 | 0.28 | 7.85 | 6.00 | 8.10 | 0.90 | 17.40 | 15.00 |
| 45 | 0.36 | 7.81 | 6.75 | 7.43 | 0.83 | 17.40 | 15.00 |

The following describes conditions for forming conductive bonding material with said paste No. 7-1 to 7-6 as the first coating layer 202 by using the wire coater of FIG. 3.

The wire rolling speed is 8.9 mm/s, the curing time is 60 sec., the temperature in t he drying oven is 280° C., and the bore diameter of the die used for enamel wire coating is 180 μm. The thickness of the first coating layer 302 was 11 μm on average and the variation of the thickness of the coating was within a range of ±1 μm as a result of coating a wire 100 m length.

In addition, current collector electrodes were fabricated with the conductive bonding material made of said paste No. 4 used as the second coating layer 203 by using the wire coater if FIG. 3.

Subsequently, five photovoltaic element modules were fabricated in the same manner as for Embodiment 41.

Figure 12:
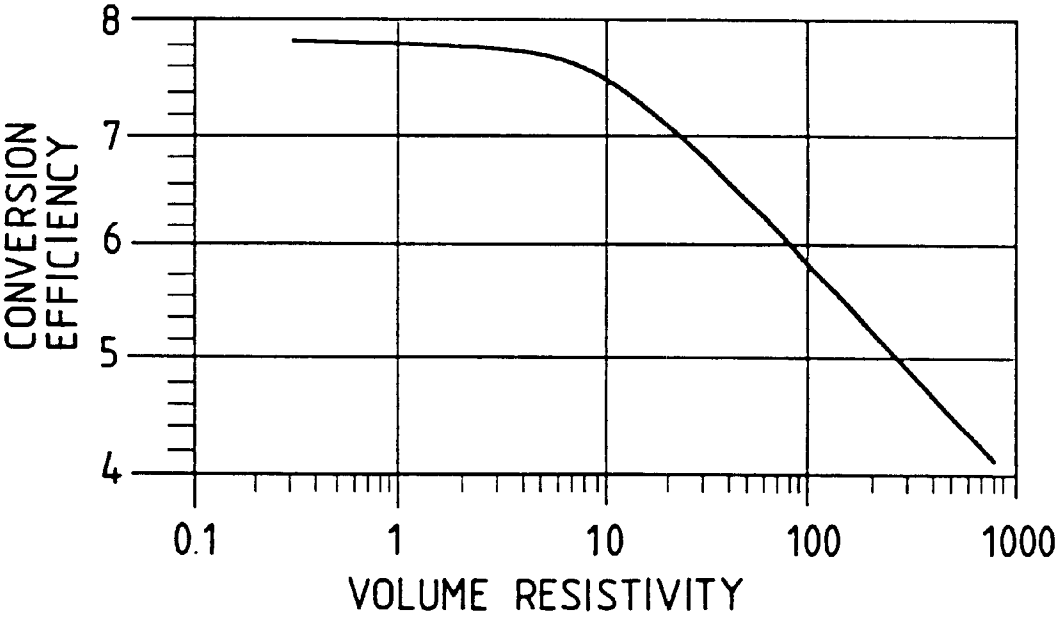
FIG. 12 is a graph showing the relationship between volume resistivity and conversion efficiency in a module of photovoltaic elements according to the present invention.

Conversion efficiency of the samples was measured in the same manner as for Embodiment 41 and averaged, and the values in FIG. 12 were obtained.

As a result of this embodiment, it is understood that the photovoltaic elements of the present invention have favorable initial characteristics when the conductive bonding material has a volume resistivity of 0.1 to 100 Ωcm.

EMBODIMENT 46

In this embodiment, it was examined whether an ion barrier could be obtained by changing the porosity of the conductive bonding material. To confirm the ion barrier effect, triple-layered current collector electrodes and photovoltaic element modules were fabricated in the following procedure by using conductive bonding material LS-708 containing silver filler manufactured by Asahi Kagaku, Ltd. as a first coating layer.

(1) Metal wire used for this embodiment is copper wire having 100 μm diameter. The wire rolling speed is 8.9 mm/s, the drying time is 60 sec., the temperature in the drying oven is 250° C., and the bore diameter of the die used for enamel wire coating is 180 μm. The thickness of the first coating layer 202 is 8 μm on average and the variation of the thickness of the coating was within a range of ±1.5 μm as a result of coating a wire of 100 m length.

(2) The second coating layer 203 was formed under the same conditions by using conductive bonding material made of the paste Nos. 7-1 to 7-6 as in Embodiment 45. As a result of measuring the porosity of the conductive bonding material made of the paste Nos. 7-1 to 7-6 by using an AUTO-PORE 9200 manufactured by Micromeritics, Ltd., the values in Table 18 were obtained.

(3) The third coating layer 204 was formed under the same conditions by using conductive bonding material made of the same paste No. 4 as for Embodiment 14, and triple-layered current collector electrodes 1004 were made.

(4) Subsequently, in the same manner as for Embodiment 41, said current collector electrodes 1004 were contact-bonded with heating on the cell surface of the substrate 1001. Then, encapsulation was performed in the same manner as in Embodiment 41 and initial characteristics were measured and averaged, which caused the result of values in Table 18.

(5) Next, in the same manner as for Embodiment 41, a unique test was performed for 100 hours by placing the samples into a constant temperature and humidity bath at +85° C. and relative humidity at 85% and by applying 1 V of forward bias voltage. As a result of the test, the values in Table 18 were obtained as leakage current and shunt resistance after the lapse of 100 hours.

TABLE 18

| Pigment ratio (wt %) | Volume Resis-tiviy (Ω cm) | Porosity (ml/g) | Leakage current (mA) | | Shunt resistance (kΩ cm$^2$) | |
|---|---|---|---|---|---|---|
| | | | Initially | After test | Initially | After test |
| 20 | 892.10 | 4.00 | 5.0 | 5.0 | 100.0 | 120.0 |
| 25 | 10.68 | 7.52 | 10.0 | 11.0 | 83.0 | 90.0 |
| 30 | 2.19 | 7.60 | 11.0 | 10.0 | 98.0 | 101.0 |
| 35 | 0.63 | 7.70 | 9.0 | 9.0 | 90.0 | 115.0 |
| 40 | 0.28 | 7.85 | 10.0 | 800.0 | 100.0 | 5.0 |
| 45 | 0.36 | 7.81 | 11.0 | 810.0 | 80.0 | 4.0 |

As for samples having 0.03 ml/g or greater porosity, leakage current of 800 mA was obtained after the lapse of 100 hours and its level has gradually increased immediately after starting the test. It is considered that a shunt has occurred because of 5 kΩcm$^2$ or less shunt resistance. A short circuit has occurred due to migration since silver in the conductive bonding material used for the first coat layer was ionized due to the forward bias application under the conditions of high temperature and high humidity. Therefore, it was found that the ion barrier effect of the second coating layer has been decreased.

As a result of this embodiment, it was determined that the photovoltaic element of the present invention provides a favorable ion barrier effect within a range of 0.02 ml/g or less porosity of the conductive bonding material.

EMBODIMENT 47

In this embodiment, current collector electrodes having a coating layer made of conductive bonding material containing a coupling agent were examined.

As shown in FIG. 2A. current collector electrodes 200 of the invention were formed as described below. As for metal wire 201, a copper wire having a 100 μm diameter and cladded with silver on its surface was used. In this embodiment. a double-layered coating as shown in FIG. 2A was applied.

The following describes a method of preparing paste No. 8 for forming conductive bonding material constituting a coating layer 202 for directly coating the metal wire 201.

(1) As a solvent, methyl carbitol was placed in a shaker for dispersion.

(2) Urethane resin (made by Nippon Polyurethane Co, Ltd.) used as a chief binder agent and butyral resin (made by Sekisui Chemical Co, Ltd.) for enhancement of dispersion were added to the solvent, and it was stirred with a ball mill.

(3) Blocked isocyanate (made by Takeda Chemical Industries, Ltd.) used as a curing agent and γ-mercaptopropyltrimethoxysilane (made by Toray Silicon, Ltd.) used as a silane coupling agent were added to said solvent.

(4) Carbon black (made by Colombian Carbon, Ltd.) having 0.05 μm average primary grain diameter was added to said solvent as conductive particles. This composition contained 67 wt % of resin and 33 wt % of conductive particles.

(5) Dispersion was made by shaking the shaker containing the above materials for 10 hours by using a paint shaker made by Toyo Seiki Seisakujyo, Ltd.

(6) Glass beads for dispersion were removed from the paste No. 8. As a result of measuring the average grain diameter of the paste No. 8 by a laser diffraction method, approx. 0.8 μm was obtained, which indicates a favorable dispersion. The same result was obtained when a bead mill was used instead of the paint shaker.

(7) To check the conductivity-of said paste No. 8, it was cured under the standard curing conditions of said curing agent, 160° C. and 30 min. and its volume resistivity was measured. As a result of the measurement, 0.5 Ωcm volume resistivity was obtained and it was confirmed that the resistivity is sufficiently low.

The following describes a method of preparing paste No. 9 for forming conductive bonding material constituting the coating layer 203 in contact with the substrate of the photovoltaic element.

(8) As solvent, cyclohexanone was placed in a shaker.

(9) Urethane resin (made by Nippon Polyurethane, Ltd.) used as a chief binder agent.and phenoxy resin (made by Tomoe Kogyo, Ltd.) for removing the tackiness effect during rolling of the coated wire on a bobbin were added, and the mixture was stirred with a ball mill. Then, blocked isocyanate (made by Takeda Chemical Industries, Ltd.) used as a curing agent and γ-mercaptopropyltrimethoxysilane (made by Toray Silicon, Ltd.) used as a silane coupling agent were added to said solvent.

(10) Carbon black (made by Colombian Carbon, Ltd.) having 0.05 μm average primary grain diameter was added to said solvent as conductive particles. This composition contained 65 wt % of resin and 35 wt % of conductive particles.

(11) The above materials were dispersed in the same manner as for paste No. 8 to make paste No. 9. The paste has approx. 1.0 μm average particle diameter.

(12) To check the conductivity of said paste No. 9, it was cured under the standard curing conditions of said curing agent, 160° C. and 30 min. and its volume resistivity was measured. As a result of the measurement, 0.4 Ωcm volume resistivity was obtained and it was confirmed that the resistivity is sufficiently low.

The following describes a method of forming the coating layer 202 made of the paste No. 8 and the coating layer 203 made of the paste No. 9 by using the wire coater in FIG. 3.

First of all, a bobbin having a metal wire around its delivery reel was installed, and said metal wire was extended in the direction of the windup bobbin. Then, paste No. 8 was injected into the coater.

The coating was repeated five times under the conditions of 40 m/min. of the wire speed, 2 sec. of the drying time, and 350° C. of the temperature in the drying oven. Dies for enamel wire coating each having 110 μm to 200 μm diameter were used sequentially. Under these conditions, the paste No. 8 was sufficiently cured to have favorable adhesion and solvent resistance. The thickness of the coating layer 202 made of the paste No. 8 is 5 μm on average and the variation of the thickness of the coating was within a range of ±0.5 μm as a result of coating a wire of 100 m length.

Subsequently, the paste No. 9 was applied. The coating was repeated five times under the conditions of 40 m/min. of the wire speed, 2 sec. of the drying time, and 120° C. of the temperature in the drying oven. Dies for wire enamel coating each having a 150 μm to 200 μm bore diameter were used. Although the paste No. 9 applied to said wire existed in an uncured state with the solvent volatilized, tackiness was not observed. The thickness of the coating layer 203 made of the paste No. 9 is 20 μm on average and the variation of the thickness of the coating was within a range of ±1.0 μm as a result of coating a wire of 100 m length.

The electrodes made in the above procedures were examined with adhesion tests for two classes of adhesion (1) between the metal wire 201 and the coating layer 202 made of paste No. 8 and (2) between the substrate of the photovoltaic element and the substrate of a metal tab and the coating layer 203 made of paste No. 9.

First of all, to examine the adhesion between the metal wire 201 and the coating layer made of the paste No. 8, the coating layer 202 and the coating layer 203 were formed on the metal wire 201 as electrodes 200 to make sample 1 which was cured in a drying oven (not shown) under the conditions of 160° C. and 30 min. As a result of stretching the electrodes 200 rapidly on the basis of an adhesion test of JIS3003 and checking the adhesion by observing broken sections, favorable adhesion was confirmed without any abnormal cracks nor peeling.

Next, to check the adhesion between the substrate of the photovoltaic element and the substrate of the metal tab and the coating layer 203 made of paste No. 9, sample 2 was made by contact-bonding the electrodes 200 with heating on an amorphous solar battery substrate with an ITO transparent conductive coating and a silver-cladded copper tab substrate. As a result of stretching the electrodes 200 perpendicularly to each substrate direction on the basis of the adhesion test of JIS3003 and checking the adhesion by measuring its tension, favorable adhesion was confirmed with 0.15 kgfN or greater tension.

In addition, to check the reliability of said electrodes 200, samples 1 and 2 were left in an environmental tester whose temperature was 85° C. and relative humidity was 85% for 1,000 hours (high-temperature and high-humidity test). As a result of the same adhesion test after the high-temperature and high-humidity test, changes in their characteristics did not occur.

The above description proves that the electrodes according to this invention have uniform line width and superior adhesive properties. In addition, they endure a hostile environment such as high-temperature and high-humidity for a long time without any cracks or peeling and they also provide higher reliability.

Comparison 5

This example differs from Embodiment 47 in that a coupling agent is not mixed during compounding of the paste. Other details are the same as for Embodiment 47 for forming electrodes.

As a result of checking adhesion of the thus formed electrodes in the same manner as for Embodiment 47, some cracks were observed between the metal wire 201 and the coating layer 202 made of the paste No. 8. Adhesion between the substrate of the photovoltaic element and the coating layer 203 made of the paste No. 9 and between the substrate of the metal tab and the coating layer 203 made of the paste No. 9 was relatively low, 0.09 kgfN and 0.03 kgfN, respectively.

Furthermore, an adhesion test was performed after a high-temperature and high-humidity test in the same manner as in Embodiment 47, and cracks and much peeling were observed between the metal wire 201 and the coating layer 202 made of the paste No. 8. Additionally, the adhesion between the substrate of the photovoltaic element and the coating layer 203 made of the paste No. 9 and between the substrate of the metal tab and the coating layer 203 made of the paste No. 9 was decreased to 0.04 kgfN and almost zero, respectively.

EMBODIMENT 48

This embodiment differs from Embodiment 47 in that a titanate-series coupling agent, isopropyl tri-isostearoyl titanate (made by Ajinomoto Co., Inc.) is used as a coupling agent for compounding of the paste No. 8. Other details are the same as for Embodiment 47 for forming electrodes.

As a result of performing adhesion tests in the same manner as for Embodiment 47, favorable adhesion was obtained without any abnormal cracks or peeling between the metal wire 201 and the coating layer 202 made of the paste No. 8. In addition, as for the adhesion between the substrate of the photovoltaic element and the coating layer 203 made of the paste No. 9 and between the substrate of the metal tab and the coating layer 203 made of the paste No. 9, favorable adhesion was confirmed, 0.15 kgfN and 0.14 kgfN, respectively.

Additionally, adhesion tests were performed after a high-temperature and high-humidity test in the same manner as for Embodiment 47, and changes in their characteristics did not occur.

EMBODIMENT 49

This embodiment differs from Embodiment 47 in that an aluminum-series coupling agent, acetoalkoxy aluminum di-isopropylate (made by Ajinomoto Co., Inc.) is used as a coupling agent for compounding of the paste No. 8.

Other details are the same as for Embodiment 47 for forming electrodes.

As a result of performing adhesion tests in the same manner as for Embodiment 47, favorable adhesion was obtained without any abnormal cracks or peeling between the metal wire 201 and the coating layer 202 made of the paste No. 8. In addition, as for the adhesion between the substrate of the photovoltaic element and the coat layering 203 made of the paste No. 9 and between the substrate of the metal tab and the coating layer 203 made of the paste No. 9, favorable adhesion was confirmed, 0.15 kgfN and 0.14 kgfN, respectively.

Additionally, adhesion tests were performed after a high-temperature and high-humidity test in the same manner as for Embodiment 47, and changes in their characteristics did not occur.

EMBODIMENT 50

This embodiment differs from Embodiment 47 in that epoxy resin (made by Yuka Shell Epoxy, Ltd) is used as a chief polymer resin agent for compounding of the paste No. 8, and a silane agent, γ-glycidoxypropyltrimethoxysilane (made by Toray Silicon, Ltd.) is used as a coupling agent. Other details are the same as for Embodiment 47 in forming electrodes.

As a result of performing adhesion tests in the same manner as for Embodiment 47, favorable adhesion was obtained without any abnormal cracks or peeling between the metal wire 201 and the coating layer 202 made of the paste No. 8. In addition, as for the adhesion between the substrate of the photovoltaic element and the coating layer 203 made of the paste No. 9 and between the substrate of the metal tab and the coating layer 203 made of the paste No. 9, favorable adhesion was confirmed, 0.15 kgfN for both.

Additionally, adhesion tests were performed after a high-temperature and high-humidity test in the same manner as for Embodiment 47, and changes in their characteristics did not occur.

EMBODIMENT 51

This embodiment differs from Embodiment 47 in that phenol resin (made by Dainippon Ink & Chemicals, Inc.) is used as a chief polymer resin agent for compounding of the paste No. 8, and a saline agent, γ-(2-aminoethyl) aminopropyltrimethoxysilane (made by Toray Silicone, Ltd.) is used as a coupling agent. Other details are the same as for Embodiment 47 for forming, electrodes.

As a result of performing adhesion tests in the same manner as for Embodiment 47, favorable adhesion was obtained without any abnormal cracks or peeling between the metal wire 201 and the coating layer 202 made of the paste No. 8. In addition, as for the adhesion between the substrate of the photovoltaic element and the coating layer 203 made of the paste No. 9 and between the substrate of the metal tab and the coating layer 203 made of the paste No. 9, favorable adhesion was confirmed; 0.15 kgfN for both.

Additionally, adhesion tests were performed after a high-temperature and high-humidity test in the same manner as for Embodiment 47, and changes in their characteristics did not occur.

EMBODIMENT 52

This embodiment differs from Embodiment 47 in that polyimide (made by Nippon Polyimide, Ltd.) is used as a chief polymer resin agent for compounding of the paste No. 8, and a silane agent, γ-anilinopropyltrimethoxysilane (made by Toray Silicone, Ltd.) is used as a coupling agent. Other details are the same as for Embodiment 47 for forming electrodes.

As a result of performing adhesion tests in the same manner as for Embodiment 47, favorable adhesion was obtained without any abnormal cracks or peeling between the metal wire 201 and the coating layer 202 made of the paste No. 8. In addition, as for the adhesion between the substrate of the photovoltaic element and the coating layer 203 made of the paste No. 9 and between the substrate of the metal tab and the coat layer 203 made of the paste No. 9, favorable adhesion was confirmed, 0.15 kgfN for both.

Additionally, adhesion tests were performed after a high-temperature and high-humidity test in the same manner as for Embodiment 47, and changes in their characteristics did not occur.

EMBODIMENT 53

In this embodiment, an amorphous solar battery 400 was fabricated in a pin-junction-type single layer structure shown in FIG. 47 with grids whose length was 30 cm.

The following describes the method of fabrication.

(1) After placing a sufficiently degreased and cleaned substrate 401 made of SUS430BA in a DC sputtering device (not shown) and depositing an Ag layer up to 400 nm, a lower electrode 402 was formed by depositing a ZnO layer up to 400 nm.

(2) After removing the substrate, it was placed in an RF plasma CVD film generator (not shown), and an amorphous silicon semiconductor layer was deposited in the order of n layer 403, i-layer 404, and p-layer 405.

(3) The resultant was then placed in a metallizing apparatus of resistance heating type (not shown) and an ITO film was deposited thereon as a transparent conducting film 406 also having an anti-reflection effect (film generation temperature: 450° C., film thickness: 70 nm).

(4) By using the same paste No. 8 and No. 9 as for Embodiment 47, electrodes 200 having a coating layer made of conductive bonding material were prepared.

(5) The electrodes 200 were arranged on the substrate 401 having a silver-clad copper foil tab by using a wiring machine (not shown), while providing an adhesive portion which was 5 mm wide outside an effective area of the solar battery, and then they were temporarily fixed with adhesive at their both ends.

(6) By using a heat contact-bonding machine (not shown), they were fixed on the substrate through the paste No. 9 applied to the wire to form a grid electrode 407.

(7) As shown in FIG. 13, an anode output tab 1302 and a cathode output tab 1303 were connected with soldering to generate a single cell 30 cm square.

(8) Encapsulation of the amorphous solar battery on which the above electrodes were formed was then made as described below. The amorphous solar battery 1300 was cladded with EVA on its both sides, then further with ETFE fluoroplastic film (ethylene tetrafluoroethylene) (Du Pont product name, "Tefzel"), and it was placed into a vacuum laminator for vacuum lamination at an elevated temperature of 150° C. for 45 min .

The initial characteristics of the encapsulated samples were measured as described below. By using a simulated sun light source (hereinafter "simulator") having 100 mW/cm$^2$ light intensity in the AM1.5 global sun light spectrum, characteristics of the solar battery were measured. The measured conversion efficiency of 6.7% shunt resistance (dark state) of 50 kΩ$cm^2$, and series resistance of 9.5 Ω$cm^2$ were each favorable.

Figure 14:
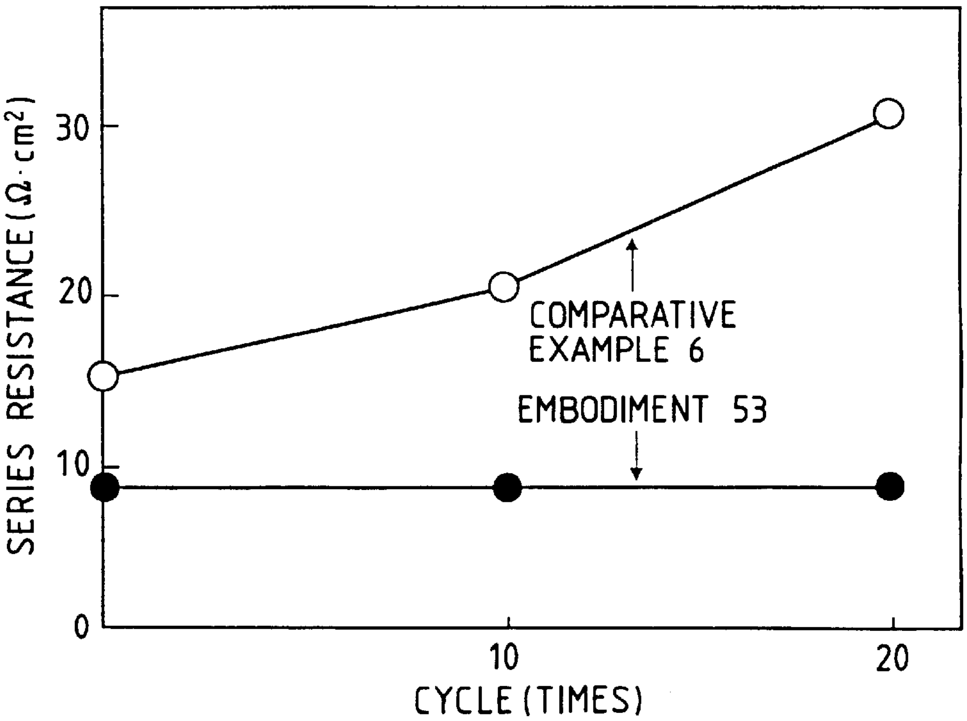
FIG. 14 is a graph showing the relationship between steaming cycles and series resistance for a module of photovoltaic elements according to the present invention.

A confidence test for these samples was performed on the basis of the temperature and relative humidity cycle test A-2 defined in an environmental test method and an endurance test method of crystalline solar battery modules of Japan Industrial Standard C8917. First, a cyclic test was repeated 20 times by placing the samples into a constant temperature and humidity bath whose inside humidity was controllable and changing the temperature from −40° C. to +85° C. (relative humidity: 85%). The characteristics of the solar batteries were examined after each completion of ten repetition cycles of the test by using the simulator in the same manner as for the measurement of the initial characteristics, a decrease of 3.2% was observed in comparison with the initial conversion efficiency and a decrease of 10% for the shunt resistance (darkstate) after the completion of 20 repetition cycles of the test was observed. Therefore, no significant deterioration was found in both. In addition, the series resistance was measured and an increase of only approx. 2.4% was observed in the samples of this embodiment, as shown in FIG. 14. In addition, peeling in the electrode section was not found.

As a result of this embodiment, it is understood that solar batteries according to the invention have favorable characteristics and higher reliability.

Comparison 6

In this example, the electrodes were formed in the same manner as in Embodiment 1 except that a coupling agent was not mixed in during compounding of the paste. Then, by using these electrodes, an amorphous solar battery was made in the same manner as for Embodiment 53. Additionally, samples were made by performing encapsulation in the same manner as for Embodiment 53.

As a result of measuring the initial characteristics of the samples in the same manner as for Embodiment 53, the initial conversion efficiency was 5.8% and the series resistance was 15.5 Ω$cm^2$. Therefore, the series resistance was higher in comparison with Embodiment 53.

Subsequently, a confidence test was performed on these samples in the same manner as for Embodiment 53. As a result of measuring the conversion efficiency of the samples after completion of a temperature and humidity cycle test, a decrease of 17% was observed in comparison with the initial value after 20 repetition cycles of the test, which indicated a significant deterioration.

When the series resistance of these samples was measured, a change was observed as shown in FIG. 14 and it increased up to approx. twice as high as the initial state after 20 repetition cycles of the test. It was found that adhesion between the electrodes was decreased.

EMBODIMENT 54

This embodiment differs from Embodiment 53 in that the solar battery had a triple junction type structure shown in FIG. 4C and that a microwave CVD method is used for generating the semiconductor layer.

The following describes the formation procedure.

(1) A lower electrode 402 comprising Ag and ZnO was formed on a SUS substrate 401.

(2) The coated substrate was then placed into a microwave plasma CVD film generator (not shown), and a bottom junction layer was formed in the order of n layer 403, i-layer 404, and p-layer 405. Then, in the same manner, a middle semiconductor junction layer was formed in the order of n layer 413, i-layer 414, and p-layer 415 and a top junction layer was formed in the order of n layer 423, i-layer 424, and p-layer 425.

(3) An ITO film then was formed as a transparent conducting film 406 also having an anti-reflection effect (film generation temperature: 450° C., film thickness: 70 nm) in the same manner as in Embodiment 53.

(4) By using the same paste No. 8 and No. 9 as in Embodiment 47, electrodes 200 having a coating layer made of conductive bonding materials was generated.

(5) The electrodes 200 were arranged on the substrate 401 having a silver-clad copper foil tab by using a wiring machine (not shown), while providing an adhesive portion which was 5 mm wide outside the effective area of the solar battery, and then they were temporarily fixed with adhesive at their both ends.

(6) By using a heat contact-bonding machine (not shown), they were fixed on the substrate through the paste No. 9 applied to the wire to form a grid electrode 407.

(7) As shown in FIG. 13, an anode output tab 1302 and a cathode output tab 1303 were connected with soldering to generate a single cell 30 cm square.

(8) Encapsulation of the amorphous solar battery on which the above electrodes were formed was then made in the same manner as for Embodiment 53.

The initial characteristics of the thus formed samples were measured in the same manner as in Embodiment 53. The measured initial conversion efficiency of 8.3%, shunt resistance (dark state) of 42 kΩ$cm^2$, and series resistance of 33.0 Ω$cm^2$ were favorable.

In addition, a confidence test for these samples was performed in the same manner as for Embodiment 53. As a result, an increase of 2.7% was observed in the series resistance in comparison with the initial value after 20 repetition cycles of the test and a decrease of only 1.8% of the conversion efficiency in comparison with the initial value was observed. Therefore, no significant deterioration was found in both.

As a result of this embodiment, it is understood that the solar battery according to the invention has favorable characteristics and provides higher reliability.

EMBODIMENT 55

In this embodiment, to check the long-term stability of the electrodes, the electrodes in Embodiment 47 were rolled in a bobbin-like configuration and kept at room temperature for 100 days. Afterwards, adhesion of the electrodes 200 was checked in the same manner as for Embodiment 47, and favorable adhesive characteristics were confirmed as in Embodiment 47.

ADVANTAGE OF THE INVENTION

As described in detail above, according to the invention, reliable current collector electrodes having excellent adhesion and long-term preservation characteristics are obtained.

In addition, by using the current collector electrodes, photovoltaic elements having higher initial characteristics and superior long-term reliability are obtained.

Furthermore, since the production yield is improved, a method of generating photovoltaic elements having favorable reliability characteristics is obtained.

What is claimed is:

1. A collector electrode in a photovoltaic element having a semiconductor photoactive layer, said collector electrode comprising a metal wire which does not directly contact the photovoltaic elements because said metal wire is coated with a conductive resin layer, wherein said conductive resin comprises at least two layers, which prevents metal ions of said metal wire from diffusing into the semiconductor photoactive layer of said photovoltaic element, wherein the pore volume of said conductive resin layer is not more than 0.04 cc/g, and wherein the conductive resin layer comprises conductive particles having an average diameter of 0.02 mm to 15 mm and a polymer resin.

2. The collector electrode according to claim 1, wherein said conductive resin layer prevents the diffusion of said metal ions even when a voltage not less than the electromotive force of said photovoltaic elements is applied to said metal wire.

3. The collector electrode according to claim 1, wherein a polymer resin having an average molecular weight not less than 1,000 and not more than 50,000 is used as a binder of said conductive resin forming said conductive resin layer.

4. The collector electrode according to claim 3, wherein the polymer resin comprises at least one selected from the group consisting of urethane, epoxy and phenol.

5. The collector electrode according to claim 3, wherein a curing agent for said polymer resin is a block isocyanate.

6. The collector electrode according to claim 1, wherein a polymer resin having a gel fraction of not less than 20% and not more than 100% is used as the binder of said conductive resin layer.

7. The collector electrode of claim 1, wherein said conductive particles have a diameter smaller than the thickness of the conductive resin layer.

8. A collector electrode in a photovoltaic element having a semiconductor photoactive layer, said collector electrode comprising a metal wire which does not directly contact the photovoltaic elements because said metal wire is coated with a conductive resin layer which prevents metal ions of said metal wire from diffusing into the semiconductor photoactive layer of said photovoltaic element, wherein said conductive resin layer comprises at least two layers, wherein at least an inner layer or a layer other than an outer most layer of said conductive resin layer comprises conductive particles in a polymer resin having an average molecular weight not less than 1,000 and not more than 50,000 and a gel fraction of 20 to 100%, and wherein a pore volume of said conductive resin layer is not more than 0.04 cc/g of pores having a radius of not less than 1 μm.

9. A collector electrode in a photovoltaic element having a semiconductor photoactive layer, said collector electrode comprising a metal wire which does not directly contact the photovoltaic elements because said metal wire is coated with a conductive resin layer which prevents metal ions of said metal wire from diffusing into the semiconductor photoactive layer of said photovoltaic element, wherein said conductive resin layer comprises at least two layers, wherein at least an inner layer or a layer other than an outer most layer of said conductive resin layer comprises a polymer resin having an average molecular weight not less than 1,000 and not more than 50,000, and wherein at least the conductive resin constituting the outer most layer is an uncured thermosetting polymer resin.

10. A collector electrode in a photovoltaic element having a semiconductor layer, said collector electrode comprising a metal wire wherein said metal wire is coated with a coating layer comprising a conductive adhesive, wherein said coating layer comprises at least two layers wherein metal ions of said metal wire do not diffuse into the semiconductor layer of said photovoltaic element, wherein the collecting electrode is incorporated into the photovoltaic element via the conductive adhesive, wherein the porosity of said conductive adhesive is not more than 0.04 ml/g for the pores having a radius of not less than 1 μm, and wherein the conductive resin layer comprises conductive particles having an average diameter of 0.02 mm to 15 mm and a polymer resin.

11. The collector electrode according to claim 10, wherein said coating layer has the function to prevent the diffusion of said metal ion even when a voltage not less than the electromotive force of said photovoltaic element is applied to said metal wire.

12. The collector electrode according to claim 10, wherein said conductive adhesive comprises conductive particles and a polymer resin.

13. The collector electrode according to claim 10, wherein said conductive adhesive comprises a coupling agent, conductive particles, and a polymer resin.

14. The collector electrode according to claim 13, wherein said coupling agent is at least one kind selected from silane derivative coupling agent, titanate derivative coupling agent, and aluminum derivative coupling agent.

15. The collector electrode according to claim 10, wherein the average particle diameter of the primary particles of said conductive particles is not less than 0.02 μm and not more than 15 μm.

16. The collector electrode according to claim 10, wherein said conductive particles are of at least one kind selected from graphite, carbon black, $In_2O_3$, $TiO_2$, $SnO_2$, ITO, ZnO and are added by a dopant comprising a trivalent metal element.

17. The collector electrode according to claim 10, wherein a polymer resin having an average molecular weight not less than 500 and not more than 50,000 is used as a binder of said conductive adhesive forming said coating layer.

18. The collector electrode according to claim 17, wherein the gel fraction of said polymer resin is not less than 20% and not more than 100%.

19. The collector electrode according to claim 17 wherein said polymer resin is at least one kind selected from polyamide, polyamideimide, urethane, epoxy, butyral, phenol and polyimide.

20. The collector electrode according to claim 17 wherein the curing agent of said polymer resin is a block isocyanate.

21. The collector electrode according to claim 10, wherein the glass transition temperature is not lower than 100° C.

22. The collector electrode according to claim 10, wherein a transparent electrode installed on the semiconductor layer of said photovoltaic element is in contact with said conductive adhesive.

23. The collector electrode of claim 10, wherein said conductive particles have a diameter smaller than the thickness of the conductive adhesive layer.

24. A collector electrode in a photovoltaic element having a semiconductor layer, said collector electrode comprising a metal wire wherein said metal wire is coated with a coating layer comprising a conductive adhesive, wherein metal ions of said metal wire do not diffuse into the semiconductor layer of said photovoltaic element, wherein the collecting electrode is incorporated into the photovoltaic element via the conductive adhesive, said conductive adhesive including conductive particles in a polymer resin binder having an average molecular weight not less than 500 and not more than 50,000, and wherein the coating layer comprises at least two layers, wherein at least an inner layer or layer other than an outer most layer of said coating layer comprises the polymer resin and conductive particles.

25. A collector electrode in a photovoltaic element having a semiconductor layer, said collector electrode comprising a metal wire wherein said metal wire is coated with at least one coating layer comprising a conductive adhesive, wherein metal ions of said metal wire do not diffuse into the semiconductor layer of said photovoltaic element, wherein the collecting electrode is incorporated into the photovoltaic element via the conductive adhesive, said conductive adhesive including conductive particles in a polymer resin binder having an average molecular weight not less than 500 and not more than 50,000, and wherein the coating layer comprises at least two layers, wherein at least an inner layer or layer other than an outer most layer of said coating layer comprises the polymer resin and conductive particles, and wherein said coating layer comprises at least two layers and at least the conductive adhesive constituting the outer layer consists of an uncured thermosetting polymer resin.

26. A collector electrode in a photovoltaic element having a semiconductor layer, said collector electrode comprising a metal wire wherein said metal wire is coated with a coating layer comprising a conductive adhesive, wherein metal ions of said metal wire do not diffuse into the semiconductor layer of said photovoltaic element wherein the collecting electrode is incorporated into the photovoltaic element via the conductive adhesive, wherein said coating layer comprises at least two layers and the conductive adhesive constituting a layer nearer to the metal wire has a softening point higher than a highest temperature encountered during manufacture of said photovoltaic element.

27. The collector electrode according to claim 26, wherein the resistivity of said conductive adhesive is not less than 0.1 Ωcm and not more than 100 Ωcm.

28. A collector electrode comprising a metal wire coated with a coating layer of a conductive adhesive comprising at least two different types of conductive particles in a polymer resin and formed to adhere to a photovoltaic element through the coating layer, wherein the coating layer prevents a metal ion of the metal wire from migrating into a surface of the collector electrode, wherein said coating layer comprises at least two layers and wherein the conductive adhesive has a void ratio of 0.04 ml/g or smaller with regard to pores having a void radius of 1 $\mu$m or smaller.

29. The collector electrode according to claim 28, wherein the coating layer prevents the metal ion from migrating when a voltage higher than a photogenerated voltage of the photovoltaic element is applied to the metal wire.

30. The collector electrode according to claim 28, wherein the conductive adhesive comprises a coupling agent, conductive particles and a polymer resin.

31. The collector electrode according to claim 30, wherein the coupling agent is at least one selected from the group consisting of a silane coupling agent, a titanate coupling agent and an aluminum coupling agent.

32. The collector electrode according to claim 28, wherein a number average molecular weight of the polymer resin is 500 to 50,000.

33. The collector electrode according to claim 28, wherein the polymer resin has a gel fraction of 20 to 100%.

34. The collector electrode according to claim 28, wherein the polymer resin is at least one selected from the group consisting of urethane, phenoxy, epoxy, butyral, phenol, polyimide, polyamide and polyamideimide.

35. The collector electrode according to claim 28, wherein a curing agent contained in the conductive adhesive is a block isocyanide.

36. The collector electrode according to claim 28, wherein the conductive adhesive has a glass transition point of 100° C. or higher.

37. The collector electrode according to claim 28, wherein primary particles of the conductive particles have an average diameter of 0.02 $\mu$m to 15 $\mu$m.

38. The collector electrode according to claim 28, wherein the conductive particles are at least one selected from the group consisting of graphite, carbon black, $In_2O_3$, $TiO_2$, $SnO_2$, ITO, ZnO and those materials doped with a trivalent metal element.

39. The collector electrode according to claim 1, 10 or 28 wherein the collector electrode is provided on a transparent electrode of the photovoltaic element.

40. The collector electrode according to claim 1, 10 or 28 wherein said conductive resin layer or said coating layer comprises at least two layers wherein at least an inner layer, or a layer other than the outer most layer comprises a polymer resin having an average molecular weight not less than 1,000 and not more than 50,000.

41. The collector electrode according to claim 1, 10 or 28 wherein an outer most layer of said conductive resin layer or said coating layer, comprises an uncured thermosetting polymer resin.

42. The collector electrode according to claim 1, 10 or 28 wherein the conductive resin layer or the coating layer comprises at least two layers, wherein at least an inner layer or layer other than an outer most layer comprises a polymer resin having an average molecular weight not less than 500 and not more than 50,000.

43. The collector electrode according to claim 1, 10 or 28 wherein said coating layer or said conductive resin layer comprises at least two layers and an outer layer of said at least two layers consists of an uncured thermosetting polymer resin.

44. The collector electrode according to claim 1, 10 or 28 wherein said coating layer or said conductive resin layer comprises at least two layers and a layer nearer to the metal wire has a softening point higher than a highest temperature encountered during manufacture of said photovoltaic element.

45. The collector electrode according to claim 1, 10 or 28 wherein the said coating layer or said conductive resin layer comprises two layers, and a layer nearest to the electrode comprises a conductive adhesive having a softening point higher than a highest temperature encountered during formation of photovoltaic element.

46. The collector electrode according to claim 1, 10 or 28 wherein the conductive adhesive has a specific resistance of 0.1 to 100 Ωcm.

47. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, wherein the coating layer comprises two or more layers, and at least a layer other than an outermost layer comprises a conductive adhesive made of conductive particles in a polymer resin having a number average molecular weight of 500 to 50,000 or having a gel fraction of 20 to 100%.

48. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, wherein the coating layer comprises two or more layers, and at least an outermost coating layer comprises a conductive adhesive formed from an uncured thermosetting polymer resin.

49. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, wherein the conductive adhesive comprises two layers, and a softening point of the conductive adhesive constituting a layer nearest to an electrode is higher than a highest temperature encountered during photovoltaic element formation.

50. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, wherein the conductive adhesive comprises two layers, and a softening point of the conductive adhesive constituting a layer nearest to the electrode is higher than a highest temperature encountered during the photovoltaic element formation, wherein the conductive adhesive has a specific resistance of 0.1 to 100 Ωcm.

51. A collector electrode in a photovoltaic element having a semiconductor photoactive layer, said collector electrode comprising a metal wire which does not directly contact the photovoltaic element because said metal wire is coated with a conductive resin layer which prevents metal ions of said metal wire from diffusing into the semiconductor photoactive layer of said photovoltaic element, wherein the pore volume of said conductive resin layer is not more than 0.04 cc/g, and wherein the coating layer comprises two or more layers, and at least the coating layers except for an outermost coating layer comprises a conductive adhesive made of the polymer resin having a number average molecular weight of 500 to 50,000 or having a gel fraction of 20 to 100%.

52. A collector electrode in a photovoltaic element having a semiconductor photoactive layer, said collector electrode comprising a metal wire which does not directly contact the photovoltaic element because said metal wire is coated with a conductive resin layer which prevents metal ions of said metal wire from diffusing into the semiconductor photoactive layer of said photovoltaic element, wherein the pore volume of said conductive resin layer is not more than 0.04 cc/g, and wherein the coating layer comprises two or more layers, and at least an outermost coating layer comprises a conductive adhesive formed from an uncured thermosetting polymer resin.

53. A collector electrode in a photovoltaic element having a semiconductor layer, said collector electrode comprising a metal wire wherein said metal wire is coated with a coating layer comprising a conductive adhesive, wherein metal ions of said metal wire do not diffuse into the semiconductor layer of said photovoltaic element, wherein the collecting electrode is incorporated into the photovoltaic element via the conductive adhesive, wherein the porosity of said conductive adhesive is not more than 0.04 ml/g for the pores having a radius of not less than 1 μm, wherein the coating layer comprises two or more layers, and at least the coating layers except for an outermost coating layer comprises a conductive adhesive made of the polymer resin having a number average molecular weight of 500 to 50,000 or having a gel fraction of 20 to 100%.

54. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, and wherein the conductive adhesive has a void ratio of 0.04 ml/g or smaller with regard to pores having a void radius of 1 μm or smaller, wherein the coating layer comprises two or more layers, and at least the coating layers except for an outermost coating layer comprises a conductive adhesive made of the polymer resin having a number average molecular weight of 500 to 50,000 or having a gel fraction of 20 to 100%.

55. A collector electrode in a photovoltaic element having a semiconductor layer, said collector electrode comprising a metal wire wherein said metal wire is coated with a coating layer comprising a conductive adhesive, wherein metal ions of said metal wire do not diffuse into the semiconductor layer of said photovoltaic element, wherein the collecting electrode is incorporated into the photovoltaic element via the conductive adhesive, wherein the porosity of said conductive adhesive is not more than 0.04 ml/g for the pores having a radius of not less than 1 μm, and wherein the coating layer comprises two or more layers, and at least an outermost coating layer comprises a conductive adhesive formed from an uncured thermosetting polymer resin.

56. A collector electrode comprising a metal wire coated with a coating layer of a conductive adhesive and formed to adhere to a photovoltaic element through the coating layer, wherein the coating layer prevents a metal ion of the metal wire from migrating into a surface of the collector electrode, and wherein the conductive adhesive has a void ratio of 0.04 ml/g or smaller with regard to pores having a void radius of 1 μm or smaller, and wherein the coating layer comprises two or more layers, and at least an outermost coating layer comprises a conductive adhesive formed from an uncured thermosetting polymer resin.

* * * * *